(12) United States Patent
Kim et al.

(10) Patent No.: US 12,035,553 B2
(45) Date of Patent: Jul. 9, 2024

(54) LIGHT-EMITTING DEVICE AND ELECTRONIC APPARATUS COMPRISING LIGHT-EMITTING DEVICE

(71) Applicant: Samsung Display Co., Ltd., Yongin-si (KR)

(72) Inventors: Hyeongpil Kim, Yongin-si (KR); Jungmin Kang, Yongin-si (KR); Kyungsik Kim, Yongin-si (KR); Seokgyu Yoon, Yongin-si (KR); Jaeyong Lee, Yongin-si (KR); Kunwook Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 411 days.

(21) Appl. No.: 17/307,451

(22) Filed: May 4, 2021

(65) Prior Publication Data
US 2022/0123250 A1   Apr. 21, 2022

(30) Foreign Application Priority Data

Oct. 19, 2020   (KR) .................. 10-2020-0135522

(51) Int. Cl.
*H10K 50/15*   (2023.01)
*H10K 50/16*   (2023.01)
(Continued)

(52) U.S. Cl.
CPC ............. *H10K 50/15* (2023.02); *H10K 50/16* (2023.02); *H10K 50/171* (2023.02); *H10K 59/12* (2023.02); *H10K 59/38* (2023.02)

(58) Field of Classification Search
CPC ........ H10K 50/10; H10K 50/15; H10K 50/16; H10K 59/38; H10K 50/171; H10K 59/12
See application file for complete search history.

(56) References Cited

U.S. PATENT DOCUMENTS 7,754,185 B2   7/2010   McHugh et al.
7,868,538 B2   1/2011   Lee et al.
(Continued)

FOREIGN PATENT DOCUMENTS

CN   101114702 A   *   1/2008   ......... H01L 51/5092
CN   104466001 A   *   3/2015
(Continued)

OTHER PUBLICATIONS

Jyh-Jier Ho et al. "The Work Function Improvement on Indium-Tin-Oxide Epitaxial Layers by Doping Treatment for Organic Light-Emitting Device Applications", J. Phys. Chem. C, May 18, 2007, pp. 8372-8376, vol. 111, No. 23.
(Continued)

*Primary Examiner* — Fatima N Farokhrooz
(74) *Attorney, Agent, or Firm* — KILE PARK REED & HOUTTEMAN PLLC

(57) ABSTRACT

A light-emitting device includes a first electrode, a second electrode facing the first electrode, and an interlayer between the first electrode and the second electrode, the interlayer including an emission layer. The first electrode may be doped with a metal oxide having a work function of less than about −5.05 electron volts (eV), and a layer including a halide of a lanthanide may be between the first electrode and the emission layer. An electronic apparatus including the light-emitting device is also provided.

23 Claims, 3 Drawing Sheets

(51) Int. Cl.
*H10K 50/17* (2023.01)
*H10K 59/12* (2023.01)
*H10K 59/38* (2023.01)

(56) References Cited

U.S. PATENT DOCUMENTS

| | | |
|---|---|---|
| 10,170,722 B2 * | 1/2019 | Kim .................. H10K 50/171 |
| 10,886,490 B2 | 1/2021 | Kim et al. |
| 2005/0007012 A1 * | 1/2005 | Carter ................ H10K 50/171 |
| | | 428/917 |
| 2005/0084713 A1 * | 4/2005 | Kido .................... H10K 50/14 |
| | | 313/506 |
| 2005/0162074 A1 * | 7/2005 | Madathil ............... H10K 50/17 |
| | | 313/504 |
| 2005/0162075 A1 * | 7/2005 | Madathil ............... H10K 50/17 |
| | | 313/506 |
| 2009/0001878 A1 * | 1/2009 | Qiu ........................ H05B 33/22 |
| | | 313/504 |
| 2017/0025494 A1 * | 1/2017 | Rajeswaran ...... H01L 29/78696 |
| 2017/0047556 A1 | 2/2017 | Lee et al. |
| 2018/0011579 A1 | 1/2018 | Shin et al. |
| 2019/0206330 A1 * | 7/2019 | Kim ..................... G09G 3/3283 |

FOREIGN PATENT DOCUMENTS

| | | | | |
|---|---|---|---|---|
| EP | 1843411 A1 * | 10/2007 | ......... | H01L 51/5092 |
| JP | 2007-500661 | 1/2007 | | |
| KR | 10-0796604 | 1/2008 | | |
| KR | 20140136698 A * | 12/2014 | | |
| KR | 10-2016-0032799 | 3/2016 | | |

OTHER PUBLICATIONS

Ji Cui et al. "Indium Tin Oxide Alternatives—High Work Function Transparent Conducting Oxides as Anodes for Organic Light-Emitting Diodes", Advanced Materials, Oct. 2, 2001, pp. 1476-1480, vol. 13, No. 19.

* cited by examiner

| 150 |
| 130 |
| 110 |

LIGHT-EMITTING DEVICE AND ELECTRONIC APPARATUS COMPRISING LIGHT-EMITTING DEVICE

CROSS-REFERENCE TO RELATED APPLICATION(S)

This application claims priority to and benefits of Korean Patent Application No. 10-2020-0135522 under 35 U.S.C. § 119, filed on Oct. 19, 2020 in the Korean Intellectual Property Office, the entire contents of which are incorporated herein by reference.

BACKGROUND

1. Technical Field

Embodiments relate to a light-emitting device and an electronic apparatus including the light-emitting device.

2. Description of the Related Art

Light-emitting devices are self-emission devices that, in comparison to conventional devices, have wide viewing angles, high contrast ratios, short response times, and excellent characteristics in terms of brightness, driving voltage, and response speed.

Light-emitting devices may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to generate light.

SUMMARY

Embodiments include a device having a reduced driving voltage and improved efficiency and lifespan, as compared with devices in the related art.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer between the first electrode and the second electrode, the interlayer including an emission layer. The first electrode may be doped with a metal oxide having a work function of less than about −5.05 electron volts (eV), and a layer including a halide of a lanthanide may be between the first electrode and the emission layer.

In an embodiment, the first electrode may be an anode, the second electrode may be a cathode, the interlayer may include a hole transport region including a hole injection layer, a hole transport layer, an electron blocking layer, or any combination thereof, and the hole transport region may be disposed between the first electrode and the emission layer.

In an embodiment, the first electrode may be an anode, the second electrode may be a cathode, the interlayer may include an electron transport region including a hole blocking layer, an electron transport layer, an electron injection layer, or any combination thereof, and the electron transport region may be disposed between the second electrode and the emission layer.

In an embodiment, a metal of the metal oxide may be tungsten (W), copper (Cu), lanthanum (La), titanium (Ti), nickel (Ni), chromium (Cr), tantalum (Ta), cobalt (Co), indium (In), germanium (Ge), tin (Sn), or any combination thereof.

In an embodiment, the lanthanide may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or any combination thereof.

In an embodiment, a halogen in the halide of the lanthanide may be fluorine (F), chlorine (Cl), bromine (Br), iodine (I), astatine (At), tennessine (Ts), or any combination thereof.

In an embodiment, the first electrode may include an oxide of indium tin, an oxide of indium zinc, an oxide of tin, an oxide of zinc, or any combination thereof; and/or magnesium (Mg), silver (Ag), aluminum (Al), aluminum-lithium (Al—Li), calcium (Ca), magnesium-indium (Mg—In), magnesium-silver (Mg—Ag), or any combination thereof.

In an embodiment, the first electrode may include a layer including an oxide of indium tin, an oxide of indium zinc, an oxide of tin, an oxide of zinc, or any combination thereof; a layer including magnesium (Mg), silver (Ag), aluminum (Al), aluminum-lithium (Al—Li), calcium (Ca), magnesium-indium (Mg—In), magnesium-silver (Mg—Ag), or any combination thereof; and a layer including an oxide of indium tin, an oxide of indium zinc, an oxide of tin, an oxide of zinc, or a combination thereof, doped with the metal oxide.

In an embodiment, between the first electrode and the emission layer, the interlayer may include a layer in which a hole transporting compound is doped with the halide of the lanthanide.

In an embodiment, between the first electrode and the emission layer, the interlayer may include a layer consisting of the halide of the lanthanide.

In an embodiment, between the first electrode and the emission layer, the interlayer may include a layer in which a hole transporting compound is doped with the halide of the lanthanide, and a layer consisting of the halide of the lanthanide.

In an embodiment, between the first electrode and the emission layer, the interlayer may include a hole transport layer, a layer in which a hole transporting compound is doped with the halide of the lanthanide, and a layer consisting of the halide of the lanthanide. The hole transport layer may contact the layer in which a hole transporting compound is doped with the halide of the lanthanide.

In an embodiment, between the first electrode and the emission layer, the interlayer may include a hole transport layer, a layer in which a hole transporting compound is doped with the halide of the lanthanide, and a layer consisting of the halide of the lanthanide. The hole transport layer may contact the layer consisting of the halide of the lanthanide.

In an embodiment, the layer consisting of the halide of the lanthanide may exhibit a tunneling effect.

In an embodiment, a thickness of the layer consisting of the halide of the lanthanide may be in a range of about 3 Angstroms (Å) to about 70 Å.

In an embodiment, a doping concentration of the metal oxide in the layer doped with the metal oxide may be in a range of about 0% to about 80%.

In an embodiment, a doping concentration of the halide of the lanthanide in the layer in which a hole transporting compound is doped with the halide of the lanthanide may be in a range of about 0% to about 50%.

According to embodiments, an electronic apparatus may include the light-emitting device.

In an embodiment, the electronic apparatus may further include a thin-film transistor. The thin-film transistor may include a source electrode and a drain electrode, and the first electrode of the light-emitting device may be electrically connected to at least one of the source electrode and the drain electrode of the thin-film transistor.

In an embodiment, the electronic apparatus may further include a color filter, a color-conversion layer, a touchscreen layer, a polarization layer, or any combination thereof.

BRIEF DESCRIPTION OF THE DRAWINGS

The above and other aspects, features, and advantages of the disclosure will be more apparent from the following description taken in conjunction with the accompanying drawings, in which:

FIG. 1 is a schematic cross-sectional view of a light-emitting device according to an embodiment;

DETAILED DESCRIPTION OF THE EMBODIMENTS

Figure 2:
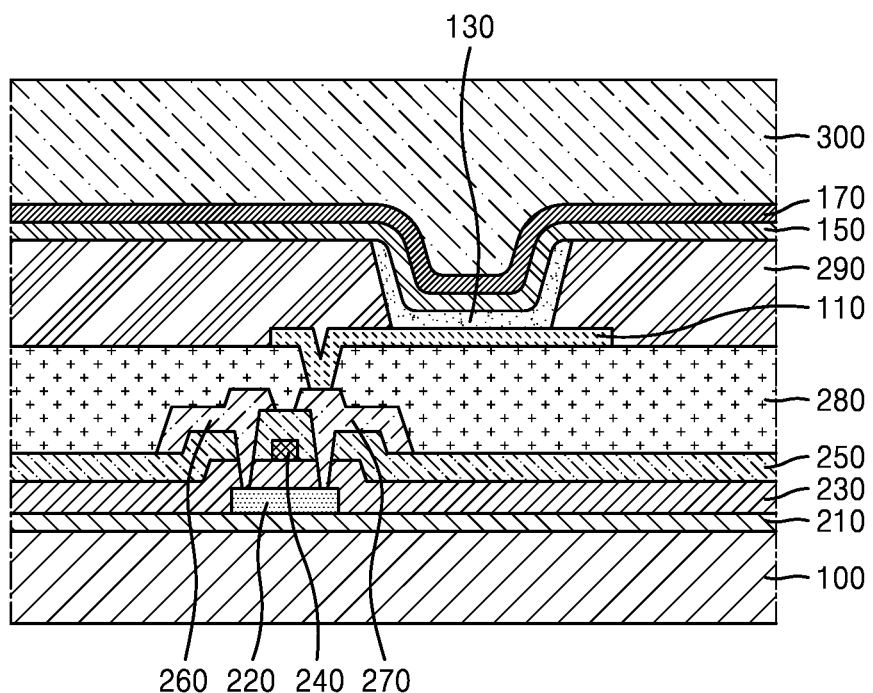
FIG. 2 is a schematic cross-sectional view of a light-emitting apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that, although the terms "first," "second," etc. may be used herein to describe various elements, these elements should not be limited by these terms. These terms are only used to distinguish one element from another element. Thus, a first element could be termed a second element without departing from the teachings of the invention. Similarly, a second element could be termed a first element, without departing from the scope of the embodiments of the inventive concept.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In a case of indium tin oxide (ITO) electrodes in the related art, in case that a work function is not low, a hole injection gap between ITO, a hole injection layer (HIL), and a hole transport layer (HTL) may be great. Thus, the driving voltage may increase by 0.3 electron volts (eV) or more without using a p-dopant (e.g., NDP-9).

According to an embodiment, a light-emitting device may include a first electrode, a second electrode facing the first electrode, and an interlayer between the first electrode and the second electrode, the interlayer including an emission layer. The first electrode may be doped with a metal oxide having a work function of less than about −5.05 electron volts (eV), and a layer including a halide of a lanthanide may be between the first electrode and the emission layer.

By doping the first electrode with a metal oxide having a low work function, hole injection may be facilitated. When the work function is less than about −5.05 eV, hole injection may be facilitated.

Hole injection may be increased by including a layer including a halide of a lanthanide between the first electrode and the emission layer. The layer including a halide of a lanthanide may increase hole injection by a tunneling effect or increase the number of carrier holes to facilitate charge migration and increase hole injection.

In embodiments, the first electrode may be an anode, the second electrode may be a cathode, the interlayer may include a hole transport region including a hole injection layer, a hole transport layer, an electron blocking layer, or any combination thereof, and the hole transport region may be disposed between the first electrode and the emission layer.

In embodiments, the first electrode may be an anode, the second electrode may be a cathode, the interlayer may include an electron transport region including a hole blocking layer, an electron transport layer, an electron injection layer, or any combination thereof, and the electron transport region may be disposed between the second electrode and the emission layer.

In embodiments, a metal of the metal oxide may be tungsten (W), copper (Cu), lanthanum (La), titanium (Ti), nickel (Ni), chromium (Cr), tantalum (Ta), cobalt (Co), indium (In), germanium (Ge), tin (Sn), or any combination thereof.

In embodiments, the metal oxide may be $WO_3$, $CuO$, $La_2O_3$, $TiO_2$, $NiO_x$ (where X=1), $CrO_{3-x}$ (where X=0), $Ta_2O_5$, $Co_3O_4$, $In_2O_3+GeO_2+SnO_2$, $In_2O_3+5$ wt % $SnO_2$, or any combination thereof.

In embodiments, the lanthanide may be lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or any combination thereof.

In embodiments, a halogen in the halide of the lanthanide may be fluorine (F), chlorine (Cl), bromine (Br), iodine (I), astatine (At), tennessine (Ts), or any combination thereof.

In embodiments, the halide of the lanthanide may be any combination of the lanthanide and the halogen. For example, the halide of the lanthanide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

In embodiments, the first electrode may include an oxide of indium tin, an oxide of indium zinc, an oxide of tin, an oxide of zinc, or any combination thereof; and/or magnesium (Mg), silver (Ag), aluminum (Al), aluminum-lithium (Al—Li), calcium (Ca), magnesium-indium (Mg—In), magnesium-silver (Mg—Ag), or any combination thereof.

In embodiments, the first electrode may include a layer including an oxide of indium tin, an oxide of indium zinc, an oxide of tin, an oxide of zinc, or any combination thereof; a layer including magnesium (Mg), silver (Ag), aluminum (Al), aluminum-lithium (Al—Li), calcium (Ca), magnesium-indium (Mg—In), magnesium-silver (Mg—Ag), or any combination thereof; and a layer including an oxide of indium tin, an oxide of indium zinc, an oxide of tin, an oxide of zinc, or any combination thereof, doped with the metal oxide.

In embodiments, the first electrode may have a structure of (ITO)/(Ag)/(ITO doped with the metal oxide). For example, the first electrode may have a structure of (ITO)/(Ag)/(ITO doped with $WO_3$, CuO, $La_2O_3$, $TiO_2$, $NiO_x$ (where X=1), $CrO_{3-x}$ (where X=0), $Ta_2O_5$, $Co_3O_4$, $In_2O_3+GeO_2+SnO_2$, $In_2O_3+5$ wt % $SnO_2$, or any combination thereof).

In embodiments, a doping concentration of the metal oxide in the layer doped with the metal oxide may be in a range of about 0 percent (%) to about 80%. For example, the doping concentration of the metal oxide may be in a range of about 5% to about 30%. For example, the doping concentration of the metal oxide may be in a range of about 10% to about 50%. For example, the doping concentration of the metal oxide may be in a range of about 20% to about 60%. For example, the doping concentration of the metal oxide may be in a range of about 40% to about 80%. When the doping concentration of the metal oxide is within any of these ranges, the work function of the first electrode may be low such that hole injection may be facilitated.

In embodiments, the layer including a halide of a lanthanide may be a layer in which a hole transporting compound may be doped with the halide of the lanthanide, or the layer including a halide of a lanthanide may be a layer consisting of the halide of a lanthanide.

In embodiments, a layer in which a hole transporting compound may be doped with the halide of the lanthanide may be present between the first electrode and the emission layer. The hole transporting compound may be understood by referring to the description of the hole transporting compound provided herein.

In embodiments, between the first electrode and the emission layer, there may be a layer consisting of the halide of the lanthanide.

In embodiments, between the first electrode and the emission layer, there may be a layer in which a hole transporting compound may be doped with the halide of the lanthanide; and a layer consisting of the halide of the lanthanide.

In embodiments, between the first electrode and the emission layer, there may be a hole transport layer; a layer in which a hole transporting compound may be doped with the halide of the lanthanide; and a layer consisting of the halide of the lanthanide. The hole transport layer may contact the layer in which a hole transporting compound may be doped with the halide of the lanthanide.

In embodiments, between the first electrode and the emission layer, there may be a hole transport layer; a layer in which a hole transporting compound may be doped with the halide of the lanthanide; and a layer consisting of the halide of the lanthanide. The hole transport layer may contact the layer consisting of the halide of the lanthanide.

In embodiments, the layer consisting of the halide of the lanthanide may exhibit a tunneling effect. In embodiments, a thickness of the layer consisting of the halide of the lanthanide may be in a range of about 3 Angstroms (Å) to about 70 Å. In embodiments, a thickness of the layer consisting of the halide of the lanthanide may be in a range of about 5 Å to about 25 Å. The layer consisting of the halide of the lanthanide may increase hole injection by a tunneling effect.

In embodiments, the doping concentration of the halide of the lanthanide in the layer in which a hole transporting compound may be doped with a halide of a lanthanide may be in a range of about 0% to about 50%, based on the total weight. For example, the doping concentration of the halide of the lanthanide may be in a range of about 5% to about 30%. For example, the doping concentration of the halide of the lanthanide may be in a range of about 10% to about 45%. When the doping concentration of the halide of the lanthanide in the hole transporting compound is within any of these ranges, the number of carrier holes may increase. Thus, charge migration may be facilitated, thereby increasing hole injection.

According to another aspect, an electronic apparatus may include the light-emitting device.

In embodiments, the electronic apparatus may further include a thin-film transistor. The thin-film transistor may include a source electrode and a drain electrode, and the first electrode of the light-emitting device may be electrically connected to at least one of the source electrode and the drain electrode of the thin-film transistor.

In embodiments, the electronic apparatus may further include a color filter, a color-conversion layer, a touchscreen layer, a polarization layer, or any combination thereof.

The term "interlayer" as used herein refers to a single layer, multiple layers, and/or all layers located between a first electrode and a second electrode in a light-emitting device.

[Description of FIG. 1]

Figure 1:
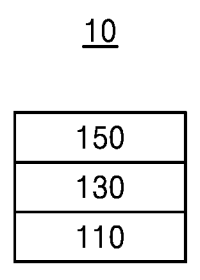

FIG. 1 is a schematic cross-sectional view of a light-emitting device 10 according to an embodiment. The light-emitting device 10 may include a first electrode 110, an interlayer 130, and a second electrode 150.

Hereinafter, the structure of the light-emitting device 10 according to an embodiment and a method of manufacturing the light-emitting device 10 according to an embodiment will be described in connection with FIG. 1.

[First Electrode 110]

In FIG. 1, a substrate may be additionally located under the first electrode 110 or above the second electrode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The first electrode 110 may be formed by depositing or sputtering, on the substrate, a material for forming the first electrode 110. wherein the first electrode 110 is an anode, as a material for a first electrode, the first electrode 110 may be doped with a metal oxide having a work function of less than about −5.05 eV.

The first electrode 110 may be a reflective electrode, a semi-transmissive electrode, or a transmissive electrode. When the first electrode 110 is a transmissive electrode, a material for forming the first electrode 110 may be indium tin oxide (ITO), indium zinc oxide (IZO), tin oxide ($SnO_2$), zinc oxide (ZnO), or any combinations thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode 110.

The first electrode 110 may have a single-layered structure consisting of a single layer or a multi-layered structure including two or more layers. In embodiments, the first electrode 110 may have a triple-layered structure of ITO/Ag/ITO.

The metal oxide may be understood by referring to the description of the metal oxide provided herein. The first electrode may be understood by referring to the description of the first electrode provided herein.

[Interlayer 130]

The interlayer 130 may be on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

The interlayer 130 may include: i) at least two emitting layers sequentially stacked between the first electrode 110 and the second electrode 150; and ii) a charge-generation layer located between the at least two emitting layers. When the interlayer 130 includes the at least two emitting layers and the charge generation layer, the light-emitting device 10 may be a tandem light-emitting device.

[Hole Transport Region in Interlayer 130]

The hole transport region may have i) a single-layered structure consisting of a single layer consisting of a single material, ii) a single-layered structure consisting of a single layer including different materials, or iii) a multi-layered structure having multiple layers including different materials.

The hole transport region may include a hole transport layer (HTL) and a layer including a halide of a lanthanide. The hole transport region may further include a hole injection layer (HIL), an emission auxiliary layer, an electron blocking layer (EBL), or a combination thereof.

The layer including a halide of a lanthanide and the layer consisting of a halide of a lanthanide may respectively be understood by referring to the descriptions of the layer including a halide of a lanthanide and the layer consisting of a halide of a lanthanide provided herein.

The hole injection layer may be a layer in which a hole transporting compound may be doped with a halide of a lanthanide.

For example, the hole transport region may have a multi-layered structure, e.g., a layer consisting of a halide of a lanthanide/layer in which a hole transporting compound may be doped with a halide of a lanthanide/layer consisting of a halide of a lanthanide/hole transport layer/electron blocking layer structure, a layer in which a hole transporting compound may be doped with a halide of a lanthanide/layer consisting of a halide of a lanthanide/hole transport layer/electron blocking layer structure, a layer consisting of a halide of a lanthanide/layer in which a hole transporting compound may be doped with a halide of a lanthanide/hole transport layer/electron blocking layer structure, a layer in which a hole transporting compound may be doped with a halide of a lanthanide/hole transport layer/electron blocking layer structure, wherein layers of each structure are sequentially stacked on the first electrode 110 in each stated order.

The hole transport region may include, as a hole transporting compound, the compound represented by Formula 201, the compound represented by Formula 202, or any combination thereof:

[Formula 201]

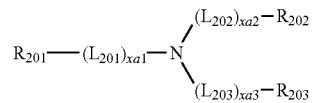

[Formula 202]

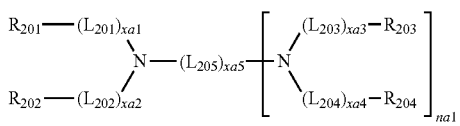

wherein in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*, *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In embodiments, Formulae 201 and 202 may each include at least one of groups represented by Formulae CY201 to CY217:

CY201
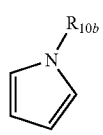

CY202
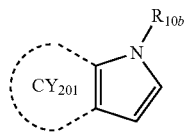

CY203
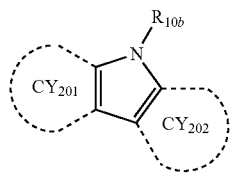

CY204
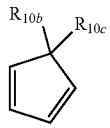

CY205
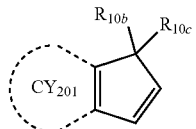

CY206
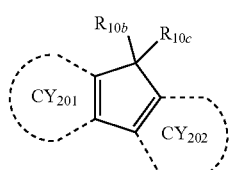

CY207
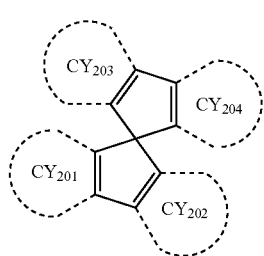

CY208
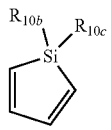

CY209
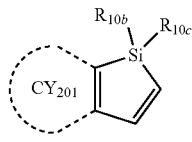

CY210
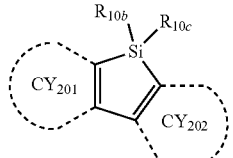

CY211
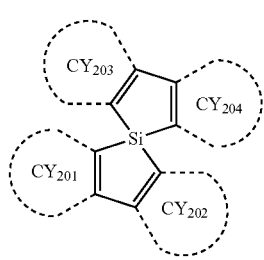

CY212

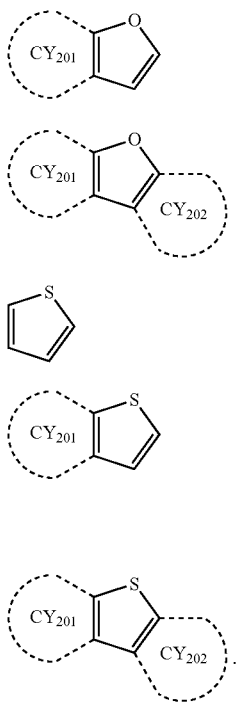

CY213

CY214

CY215

CY216

CY217 wherein in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In embodiments, in Formulae CY201 to CY217, ring $CY_{201}$ to ring $CY_{204}$ may each independently be a benzene group, a naphthalene group, a phenanthrene group, or an anthracene group.

In embodiments, Formulae 201 and 202 may each include at least one of groups represented by Formula CY201 to CY203.

In embodiments, Formula 201 may include at least one of groups represented by Formulae CY201 to CY203 and at least one of groups represented by Formulae CY204 to CY217.

In embodiments, in Formula 201, xa1 may be 1, $R_{201}$ may be a group represented by any one of Formulae CY201 to CY203, xa2 may be 0, and $R_{202}$ may be a group represented by Formulae CY204 to CY207.

In embodiments, Formula 201 and 202 may each not include groups represented by Formulae CY201 to CY203.

In embodiments, Formula 201 and 202 may each not include groups represented by Formulae CY201 to CY203, and include at least one of groups represented by Formulae CY204 to CY217.

In embodiments, Formula 201 and 202 may each not include groups represented by Formulae CY201 to CY217.

In embodiments, the hole transport region may include one of Compounds HT1 to HT44 and m-MTDATA, TDATA, 2-TNATA, NPB (NPD), β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate) (PANI/PSS), or any combination thereof:

HT1

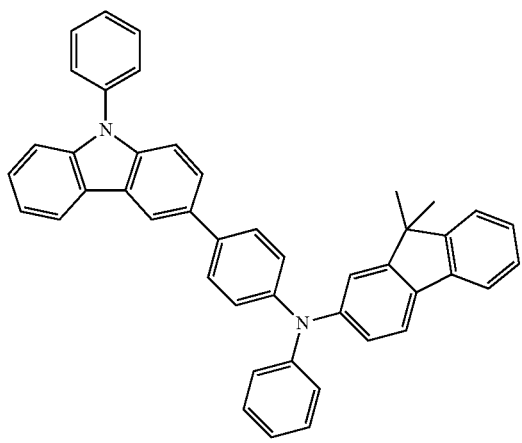

HT2

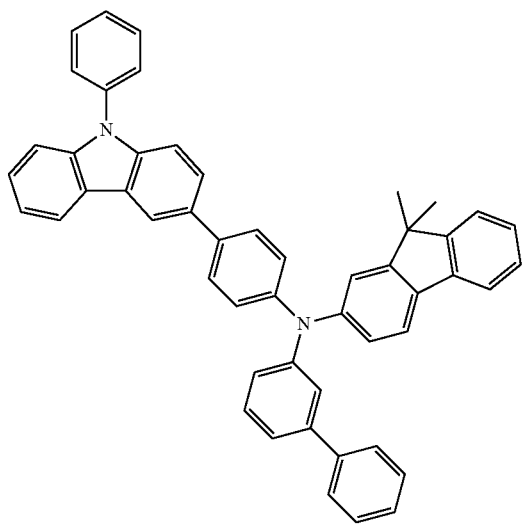

-continued
HT3
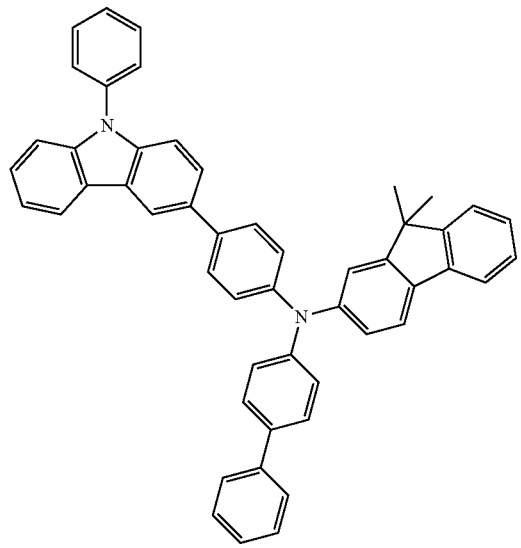
HT4
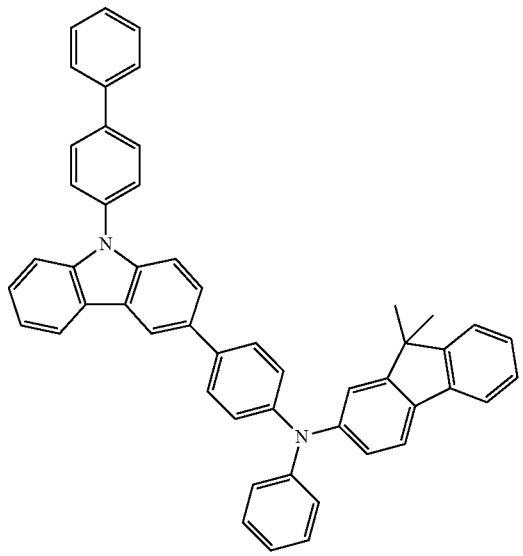
HT5
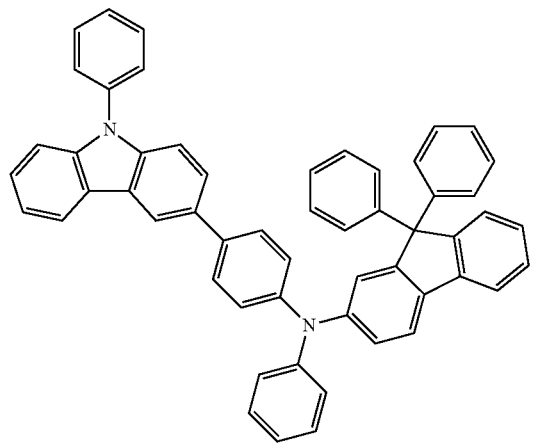
HT6
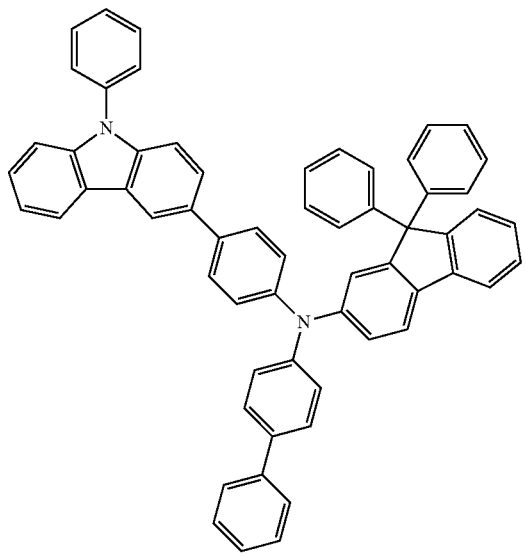

-continued
HT7
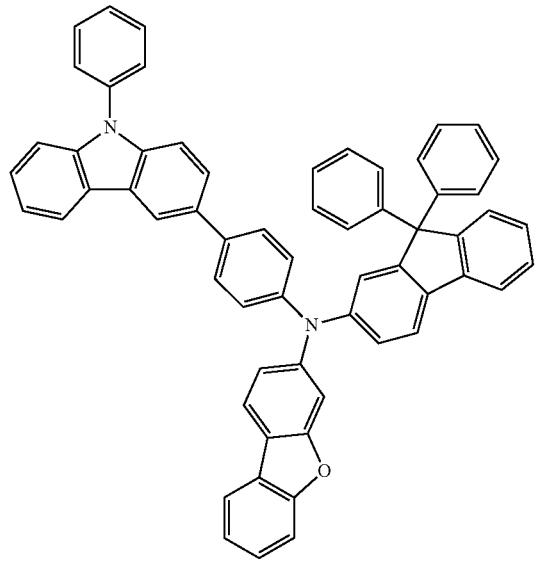
HT8
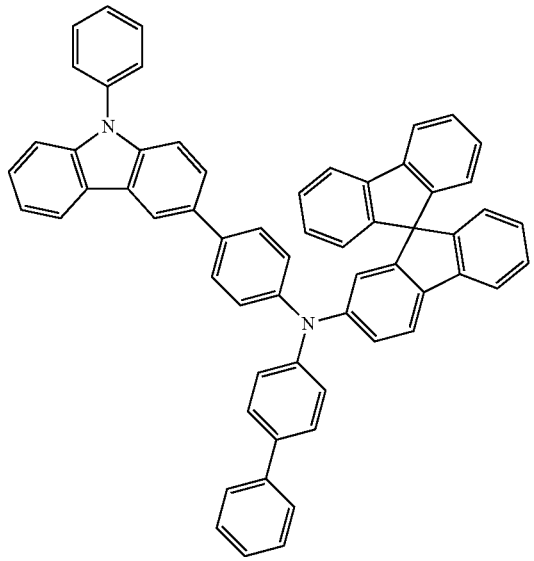
HT9
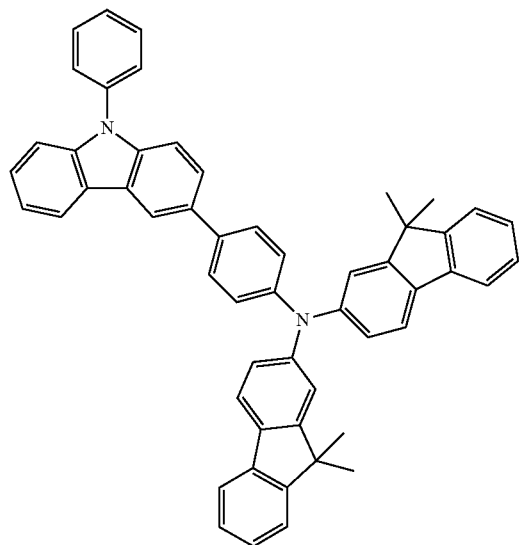
HT10
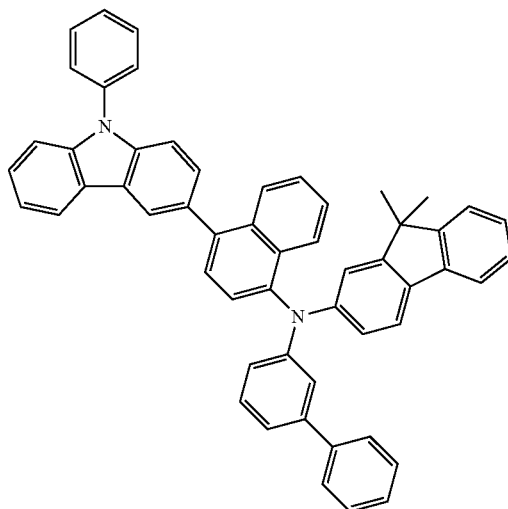
HT11
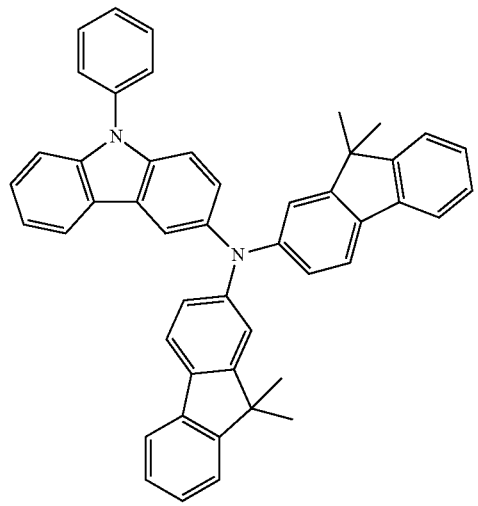
HT12
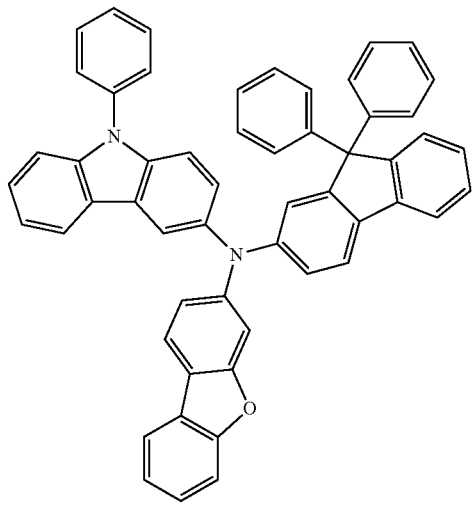

-continued
HT13
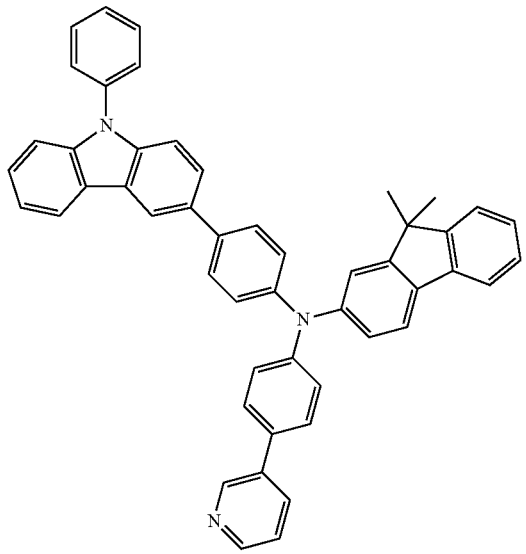
HT14
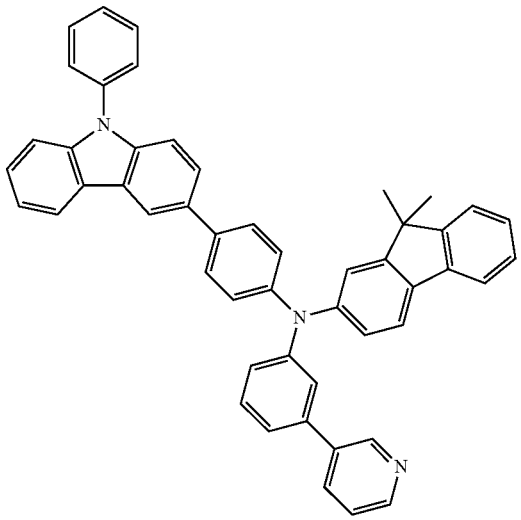
HT15
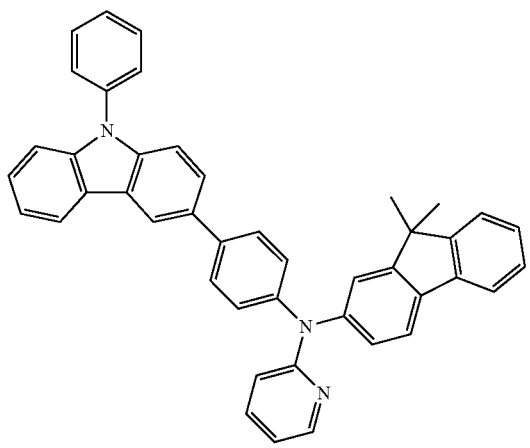
HT16
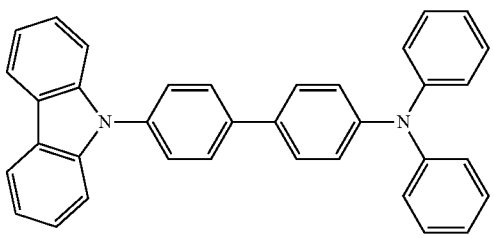
HT17
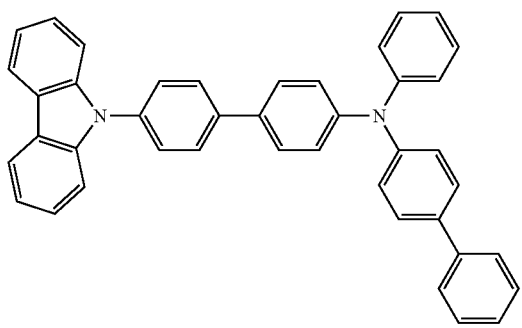
HT18
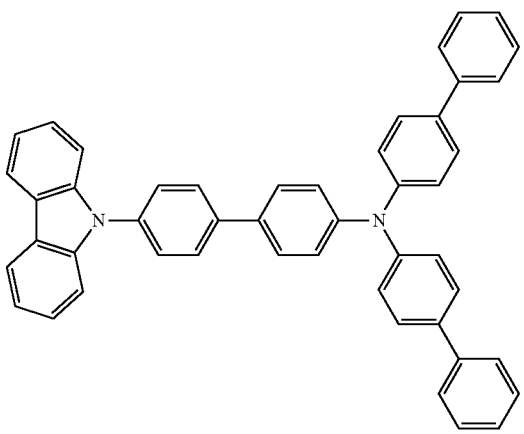

-continued
HT19
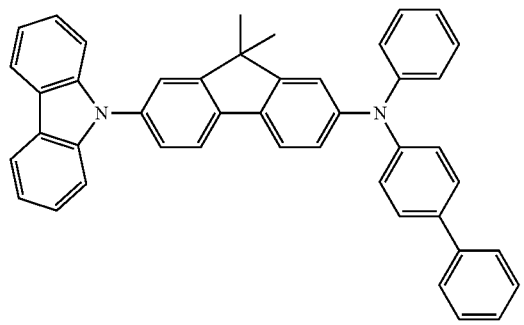
HT20
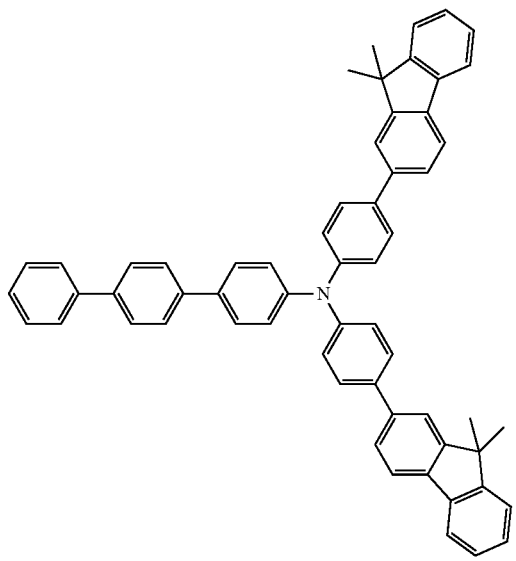
HT21
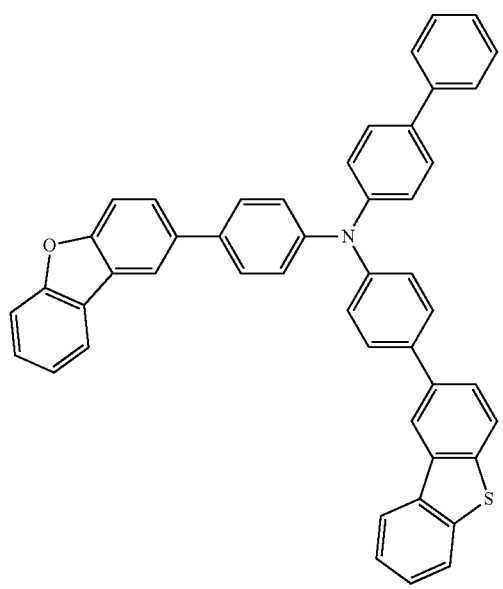
HT22
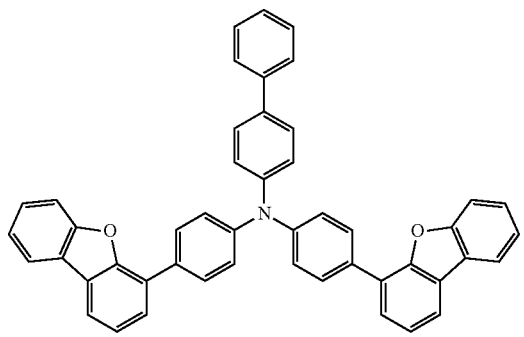
HT23
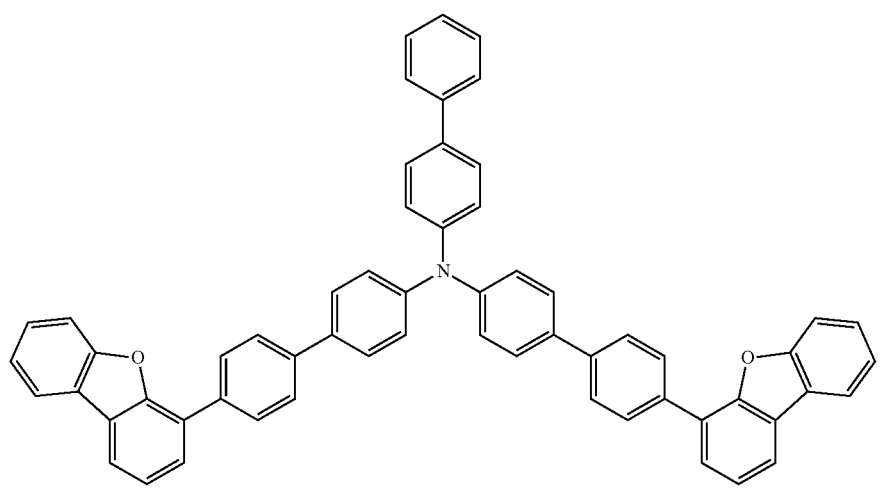

-continued
HT24
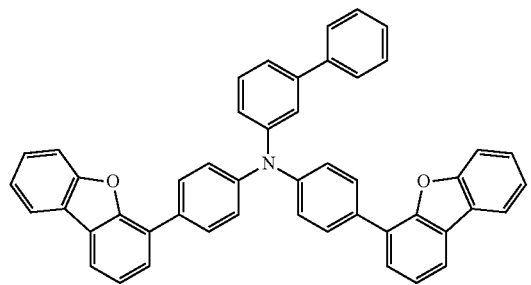
HT25
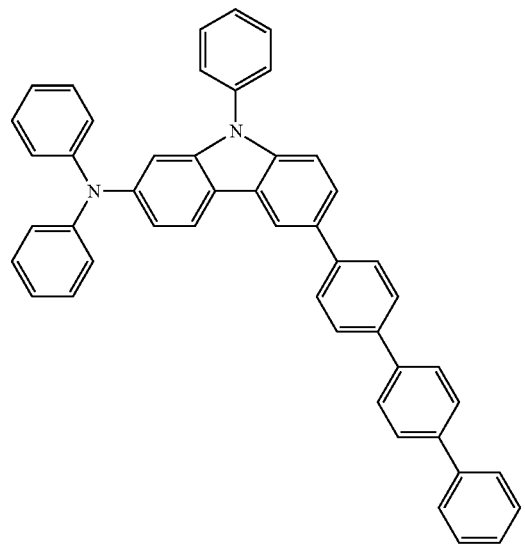
HT26
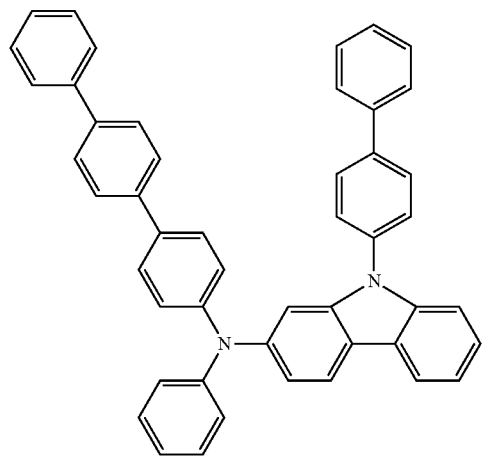
HT27
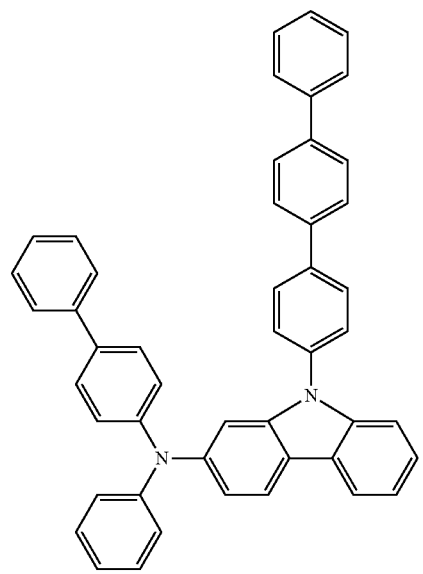
HT28
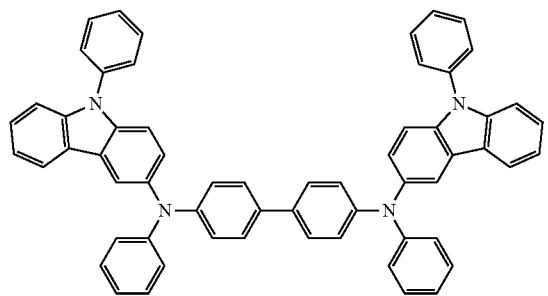
HT29
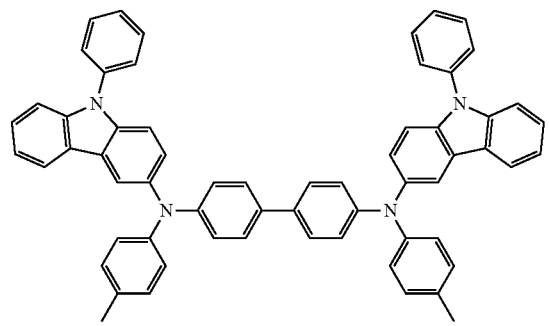

-continued
HT30
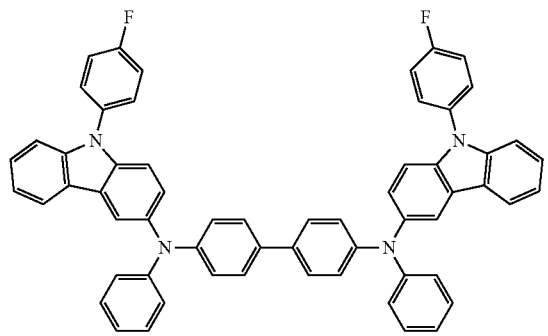
HT31
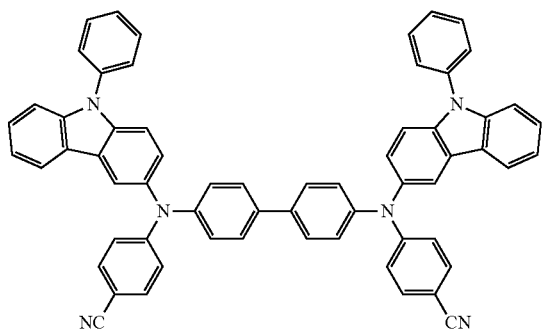
HT32
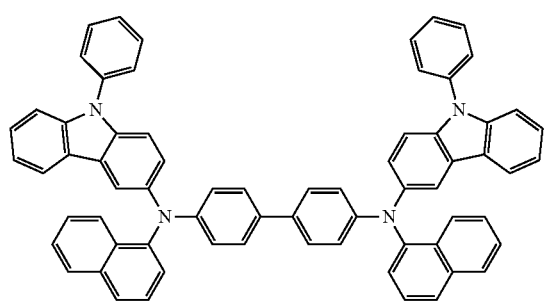
HT33
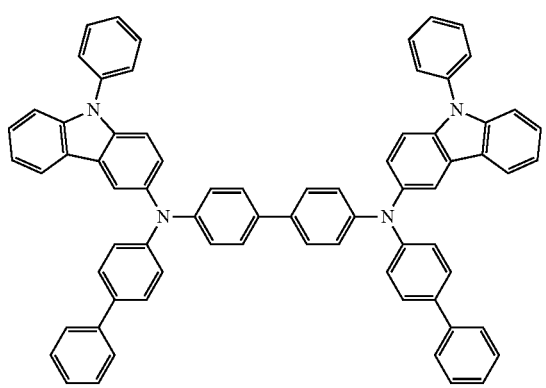
HT34
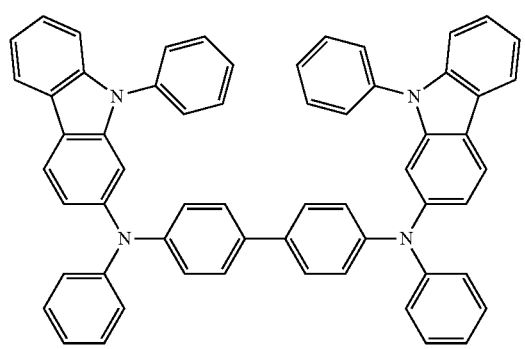
HT35
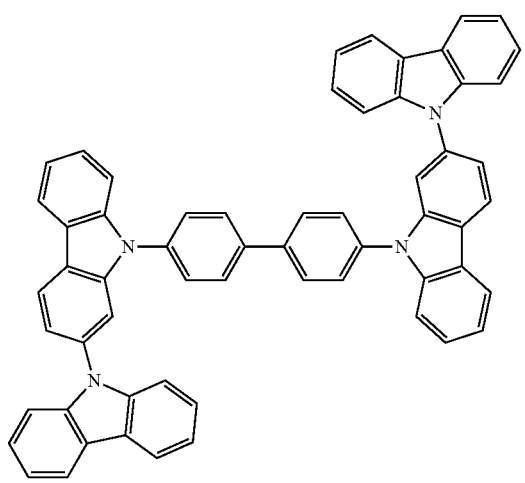

-continued
HT36
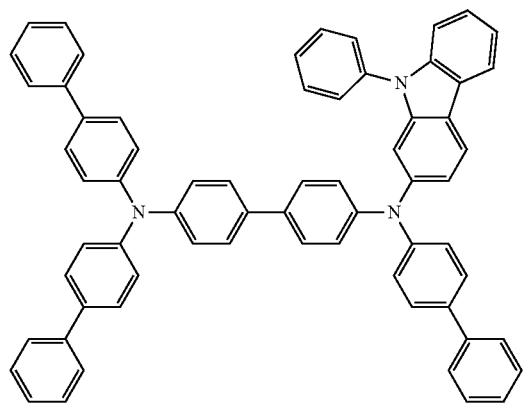
HT37
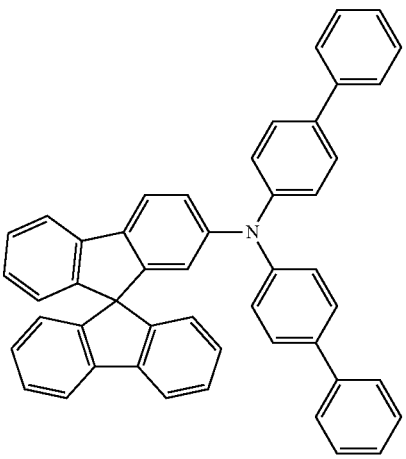
HT38
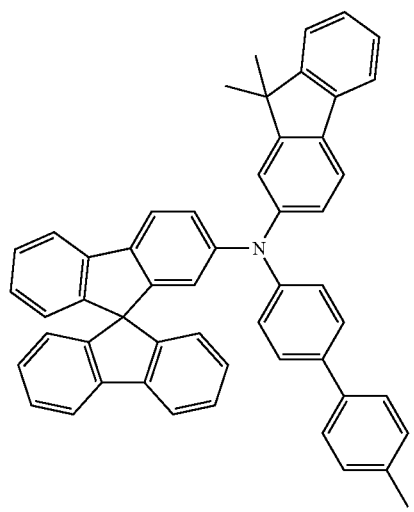
HT39
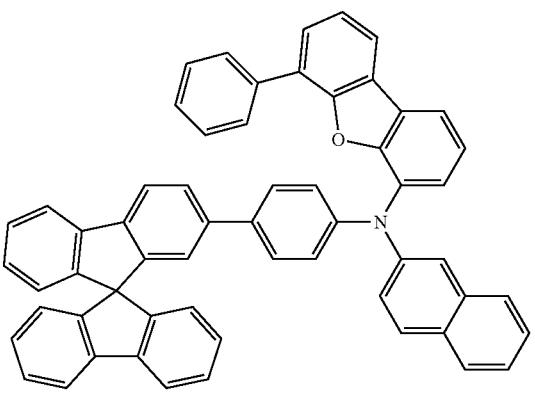
HT40
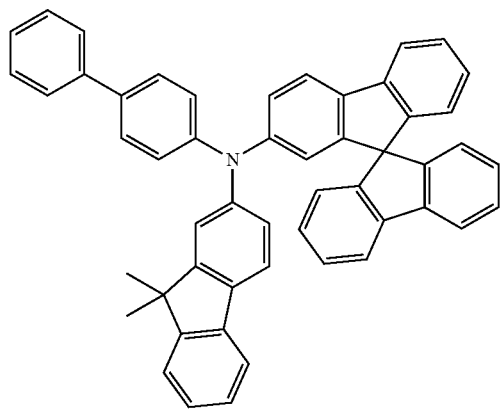
HT41
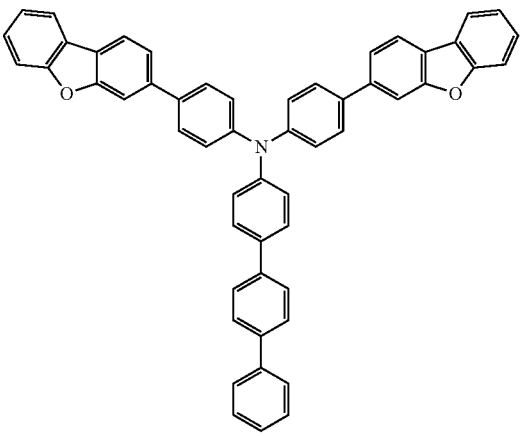

HT42
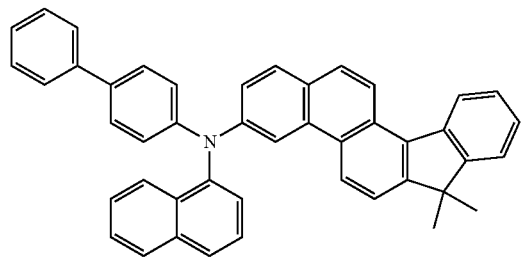
HT43
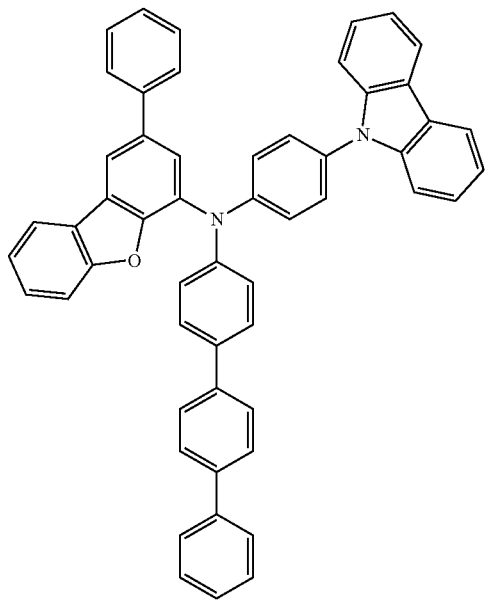
HT44
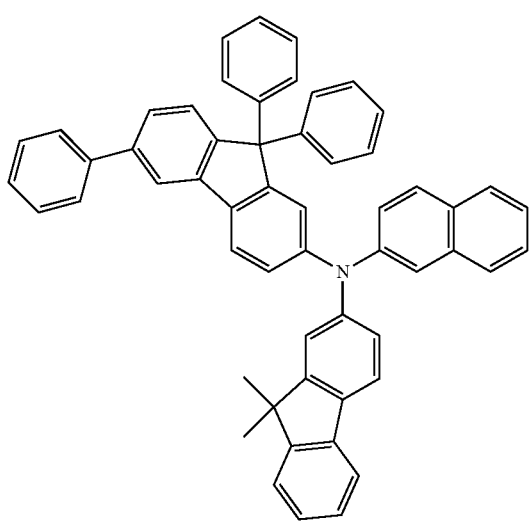

-continued
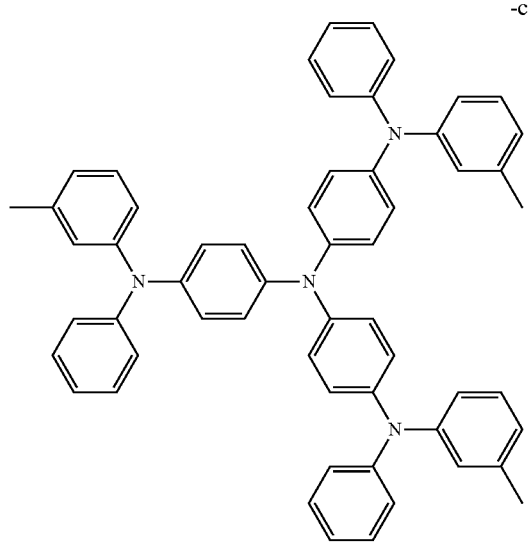
m-MTDATA
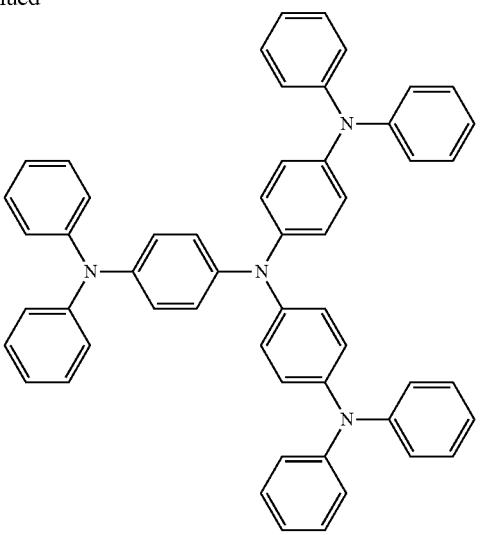
TDATA
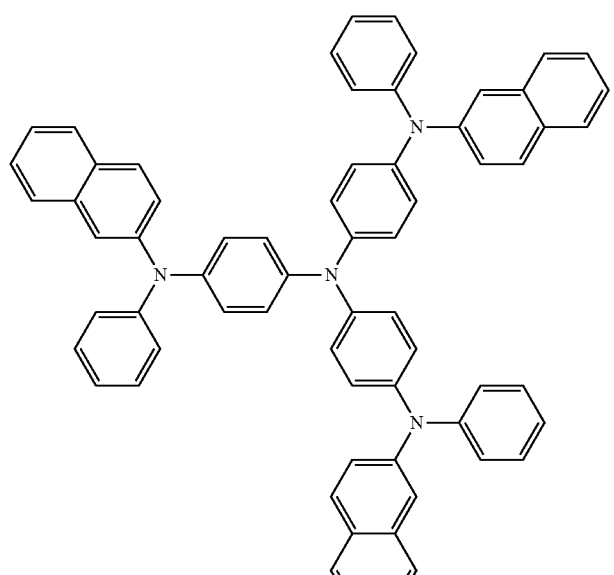
2-TNATA
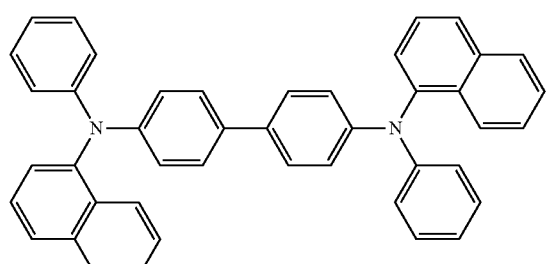
NPB -continued
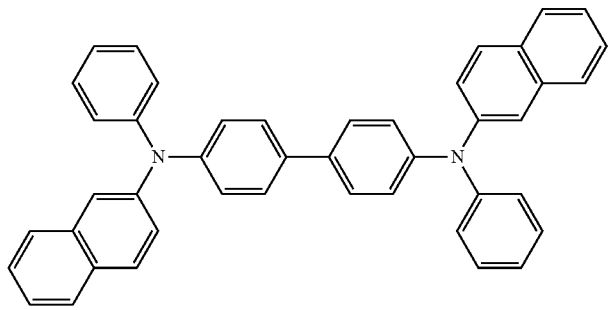
β-NPB
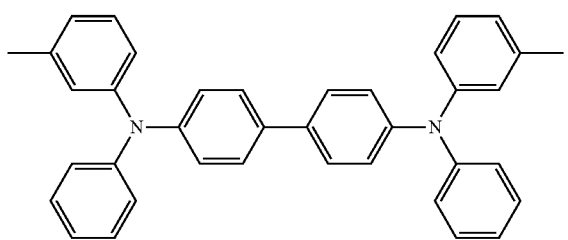
TPD
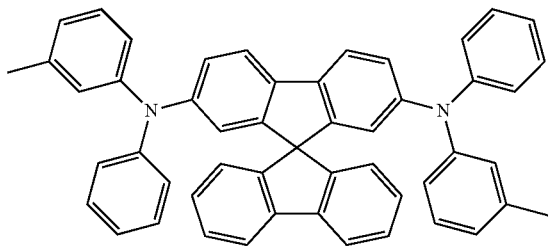
Spiro-TPD
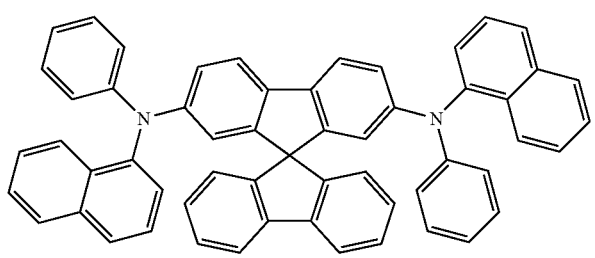
Spiro-NPB
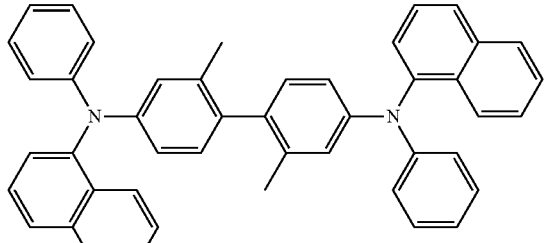
methylated-NPB
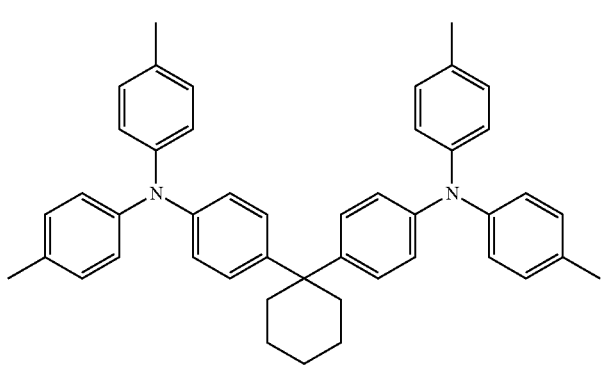
TAPC
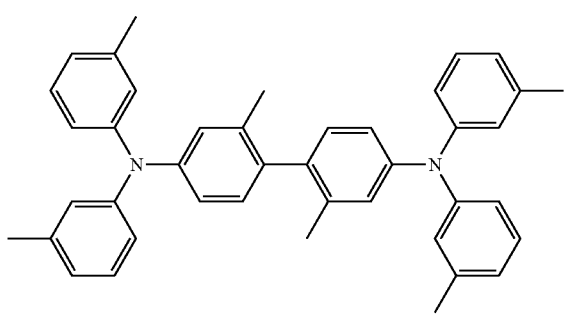
HMTPD A thickness of the hole transport region may be in a range of about 50 (Angstroms) Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer, and the hole transport layer are within any of these ranges, excellent hole transport characteristics may be obtained without a substantial increase in driving voltage.

The emission auxiliary layer may increase light emission efficiency by compensating for an optical resonance distance according to the wavelength of light emitted by an emission layer. The electron blocking layer may reduce or eliminate the flow of electrons from an electron transport region. The emission auxiliary layer and the electron blocking layer may include the aforementioned materials.

[Emission Layer in Interlayer 130]

When the light-emitting device 10 is a full color light-emitting device, the emission layer may be patterned into a red emission layer, a green emission layer, and/or a blue emission layer, according to a sub-pixel. In embodiments, the emission layer may have a stacked structure. The stacked structure may include two or more layers selected from a red emission layer, a green emission layer, and a blue emission layer. The two or more layers may be in direct contact with each other. In embodiments, the two or more layers may be separated from each other. In embodiments, the emission layer may include two or more materials. The two or more materials may include a red light-emitting material, a green light-emitting material, or a blue light-emitting material. The two or more materials may be mixed with each other in a single layer. The two or more materials mixed with each other in the single layer may emit white light.

The emission layer may include a host and a dopant. The dopant may be a phosphorescent dopant, a fluorescent dopant, or any combination thereof.

The amount of the dopant in the emission layer may be in a range of about 0.01 parts to about 15 parts by weight, based on 100 parts by weight of the host.

In embodiments, the emission layer may include a quantum dot.

The emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within any of these ranges, improved luminescence characteristics may be obtained without a substantial increase in driving voltage.

[Host]

The host may include a compound represented by Formula 301:

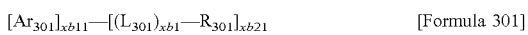
[Ar$_{301}$]$_{xb11}$—[(L$_{301}$)$_{xb1}$—R$_{301}$]$_{xb21}$     [Formula 301]

wherein in Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, a hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ may each be understood by referring to the description of Q$_1$ provided herein.

In embodiments, when xb11 in Formula 301 is 2 or greater, at least two Ar$_{301}$(s) may be bound via a single bond.

In embodiments, the host may include a compound represented by Formula 301-1, a compound represented by Formula 301-2, or any combination thereof:

[Formula 301-1]

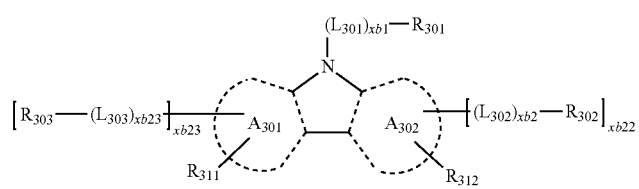

[Formula 301-2]

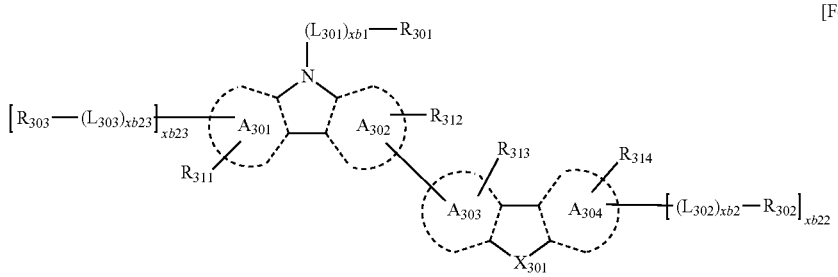

wherein in Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N—[$(L_{304})_{xb4}$—$R_{304}$], $C(R_{304})(R_{305})$, or $Si(R_{304})(R_{305})$, xb22 and xb23 may each independently be 0, 1, or 2, $L_{301}$, xb1, and $R_{301}$ may respectively be understood by referring to the descriptions of $L_{301}$, xb1, and $R_{301}$ provided herein, $L_{302}$ to $L_{304}$ may each be understood by referring to the description of $L_{301}$ provided herein, xb2 to xb4 may each be understood by referring to the descriptions of xb1 provided herein, and $R_{302}$ to $R_{305}$ and $R_{311}$ to $R_{314}$ may each be understood by referring to the descriptions of $R_{301}$ provided herein.

In embodiments, the host may include an alkaline earth metal complex. For example, the host may include a Be complex (e.g., Compound H55), a Mg complex, a Zn complex, or any combination thereof.

In embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

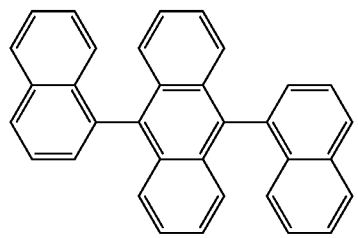

H2

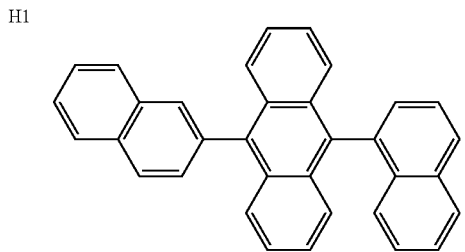

H3

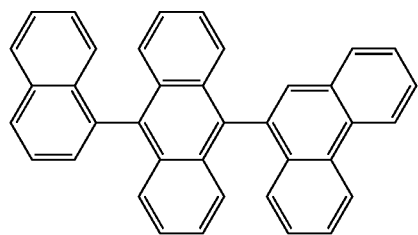

H4

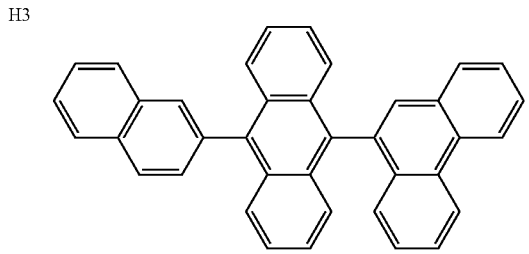

H5

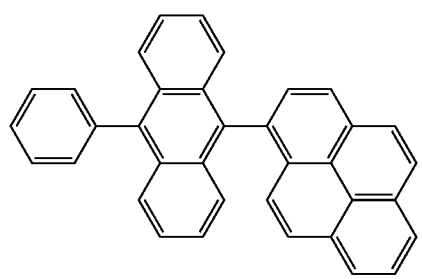

H6

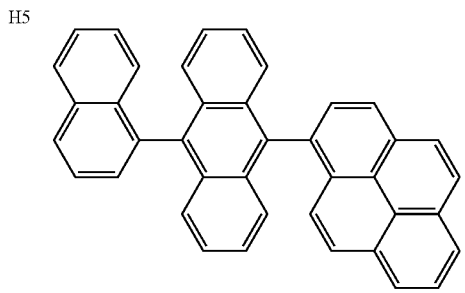

-continued
H7
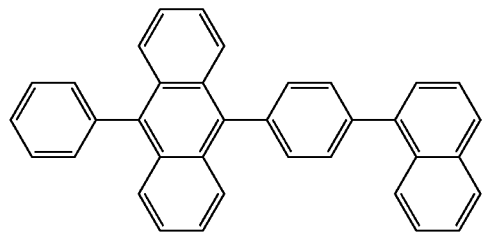
H8
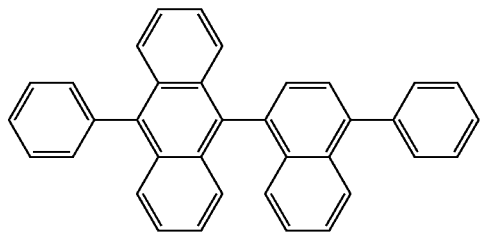
H9
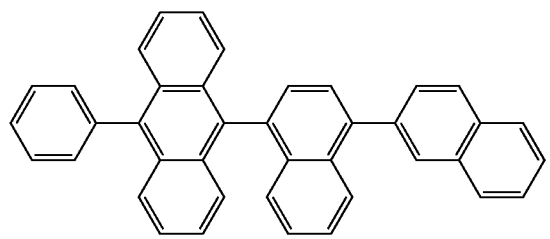
H10
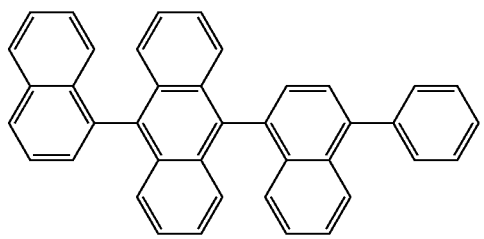
H11
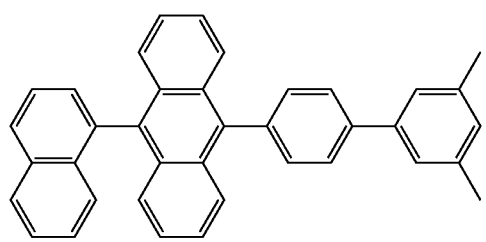
H12
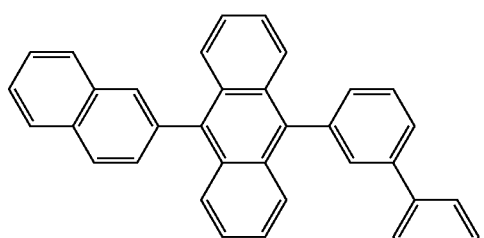
H13
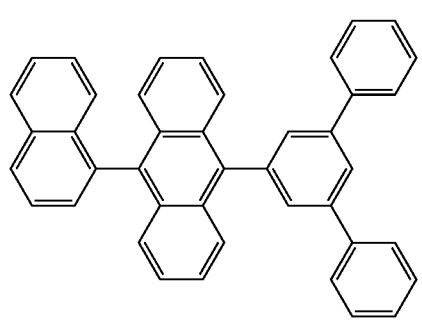
H14
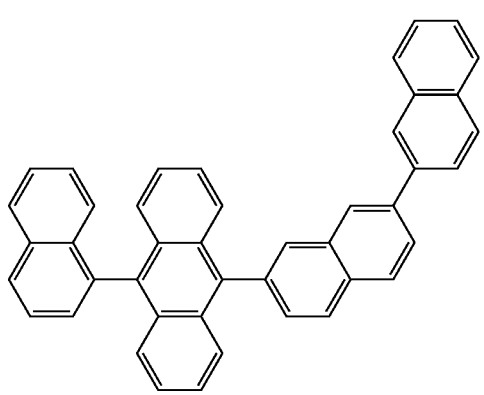
H15
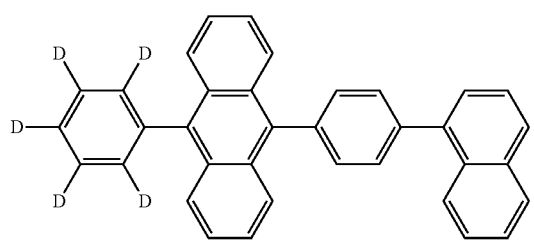
H16
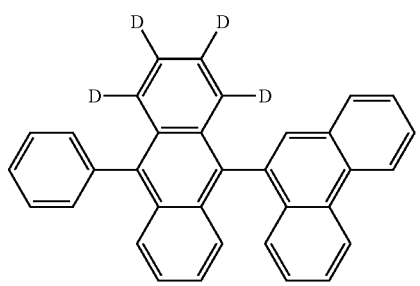

-continued
H17
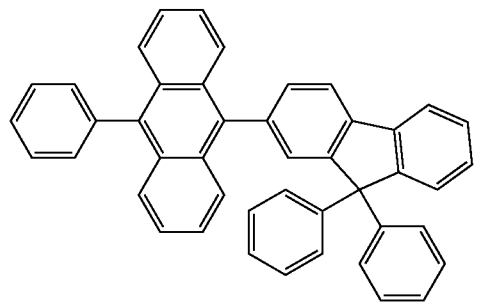
H18
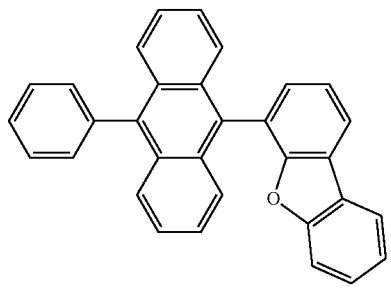
H19
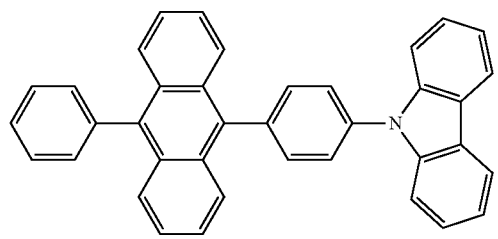
H20
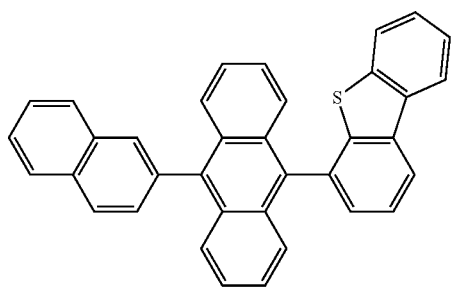
H21
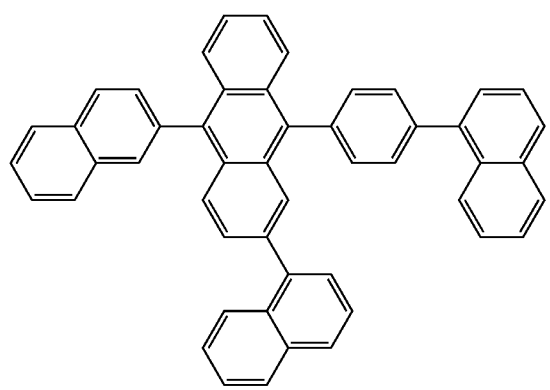
H22
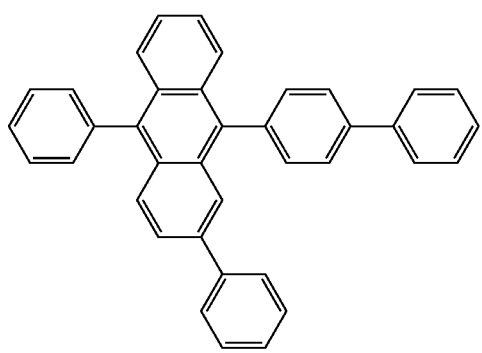
H23
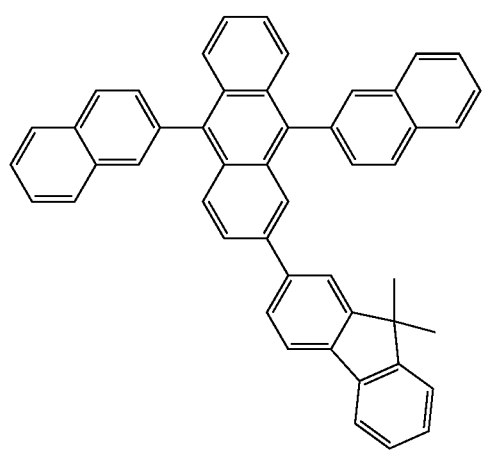
H24
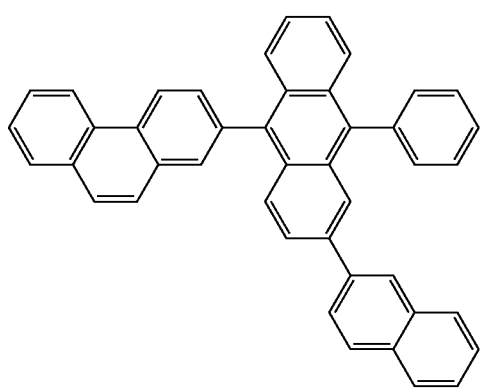

-continued
H25
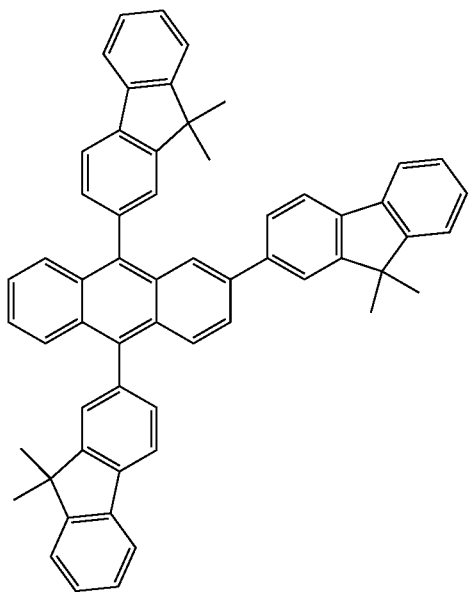
H26
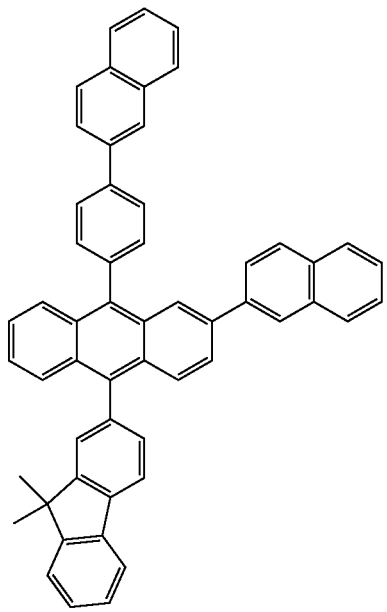
H27
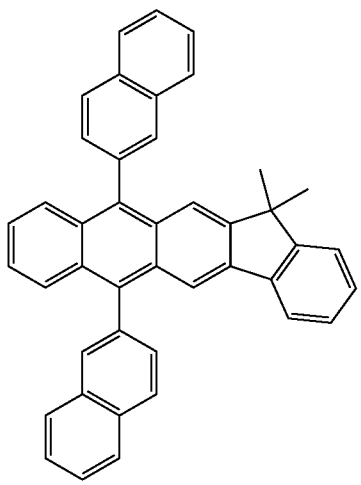
H28
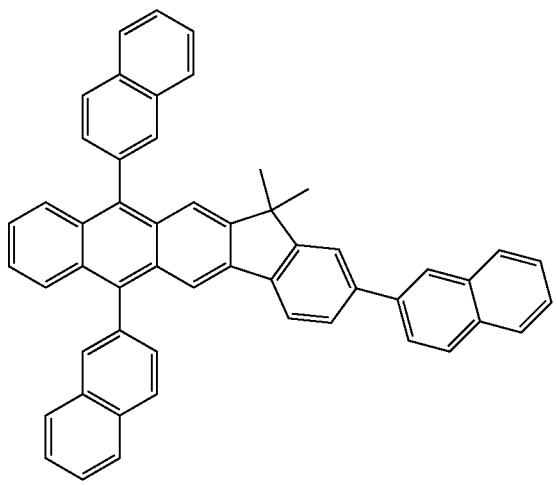
H29
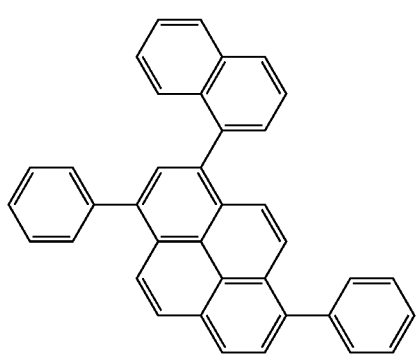
H30
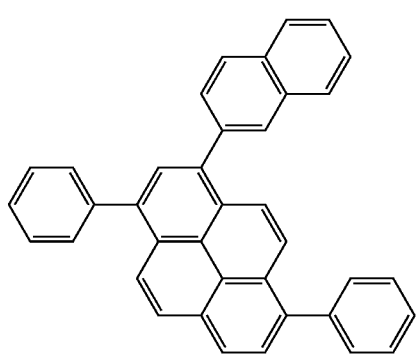

-continued
H31
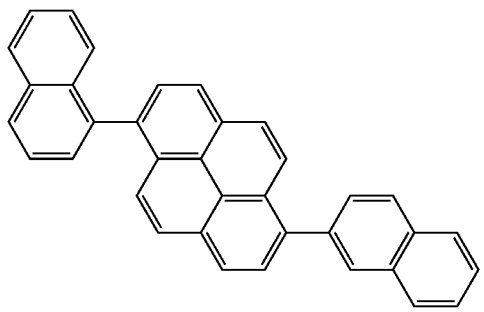
H32
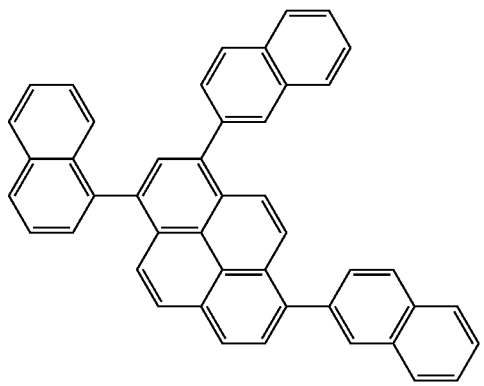
H33
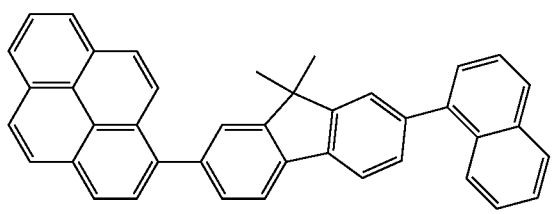
H34
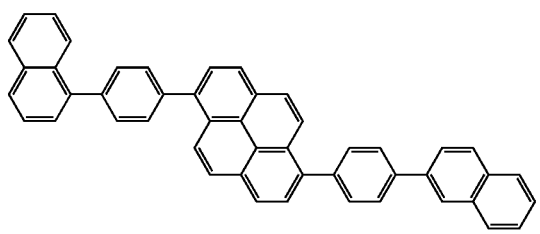
H35
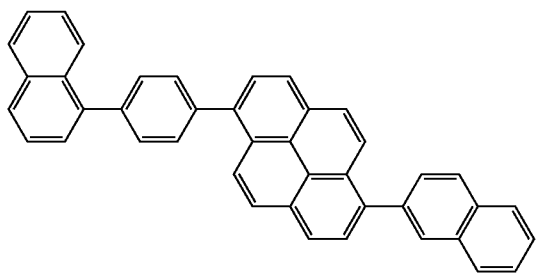
H36
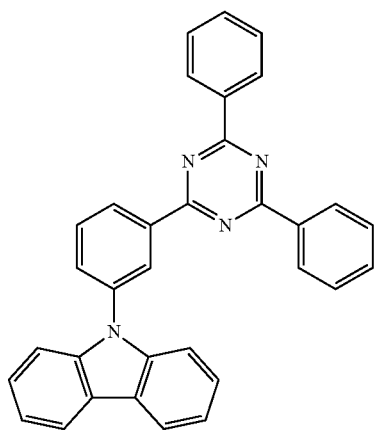
H37
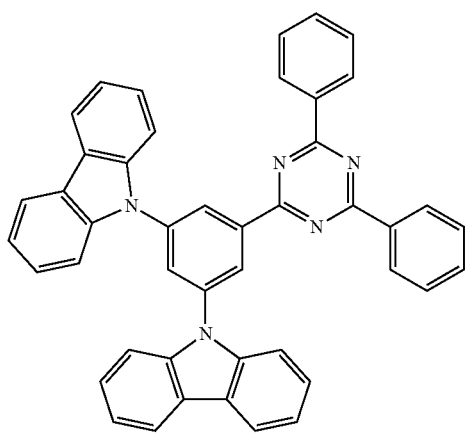
H38
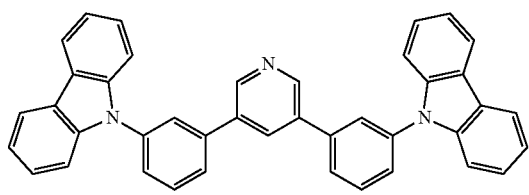

-continued
H39
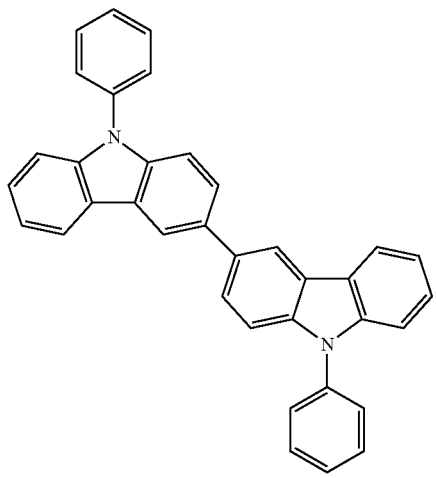
H40
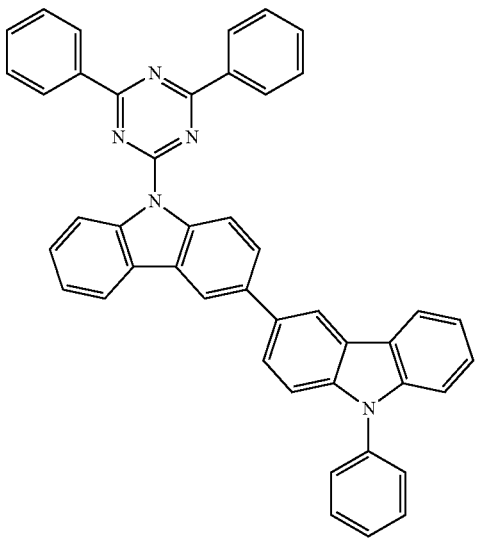
H41
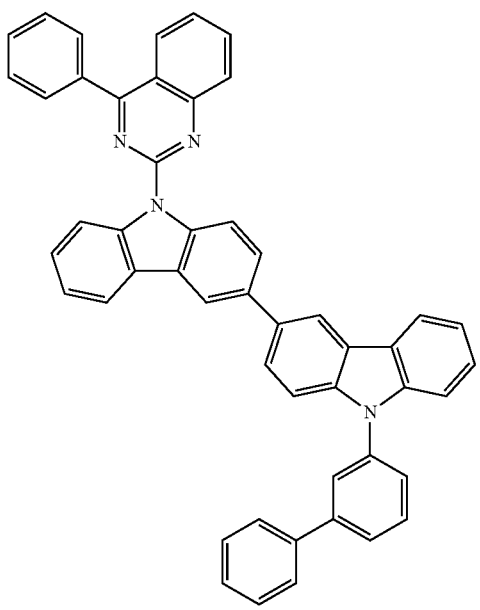
H42
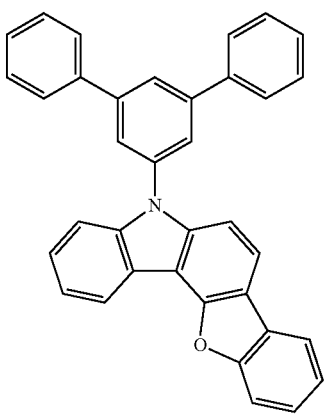
H43
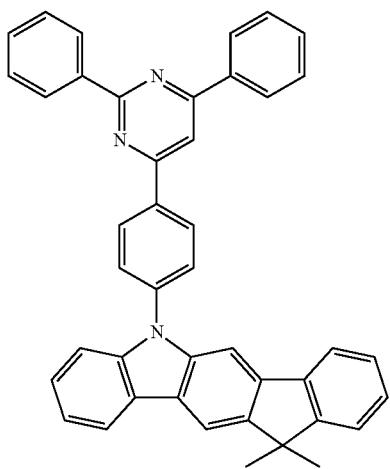
H44
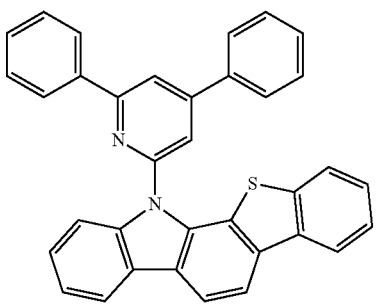

-continued
H45
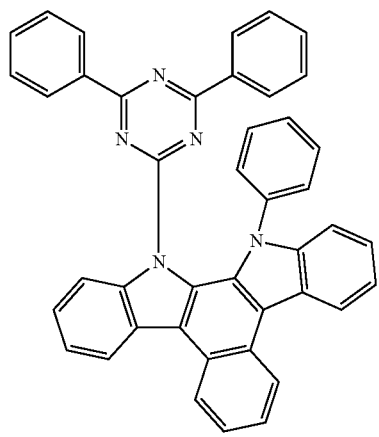
H46
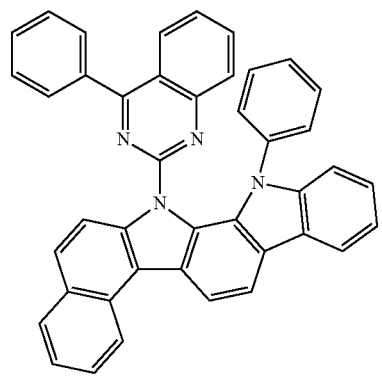
H47
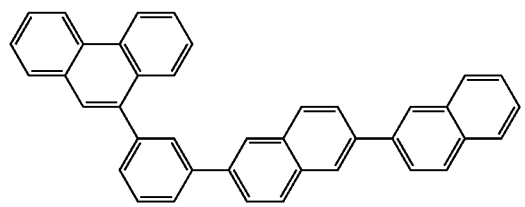
H48
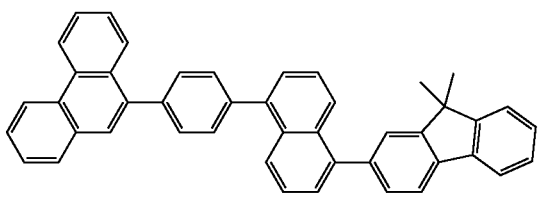
H49
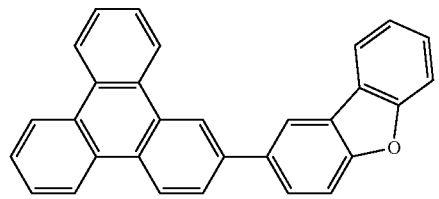
H50
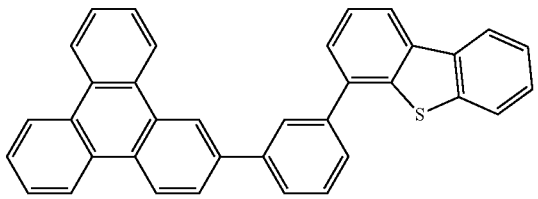
H51
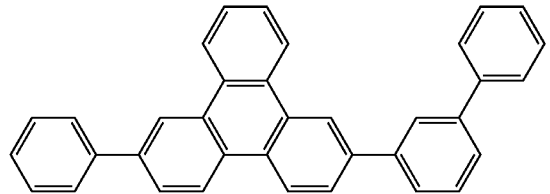
H52
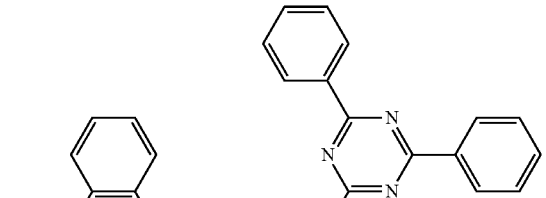
H53
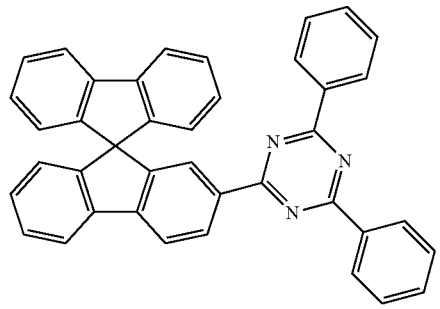
H54
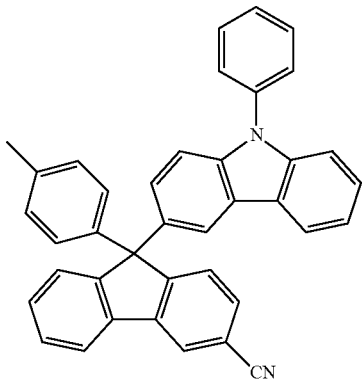

|  |  |
|---|---|
| H55 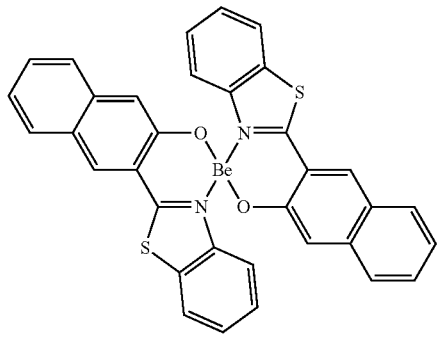 | H56 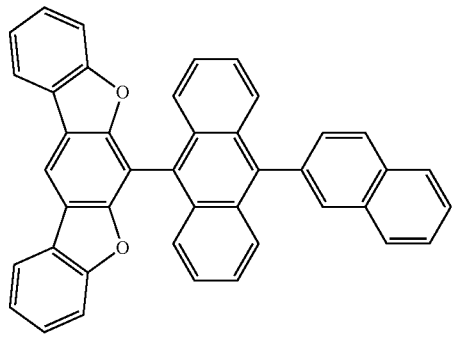 |
| H57 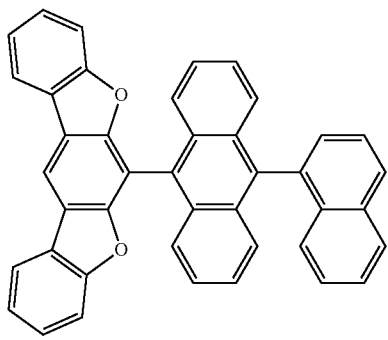 | H58 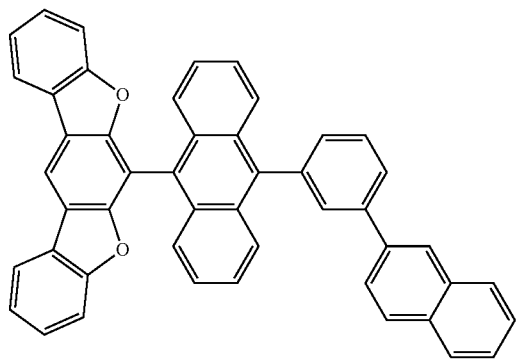 |
| H59 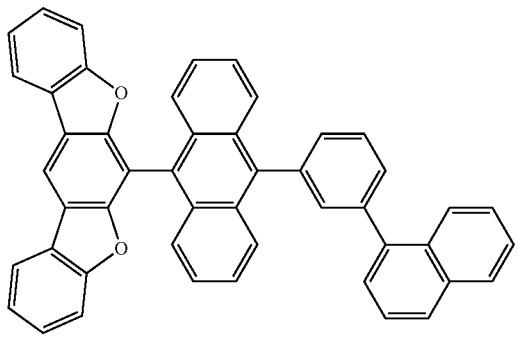 | H60 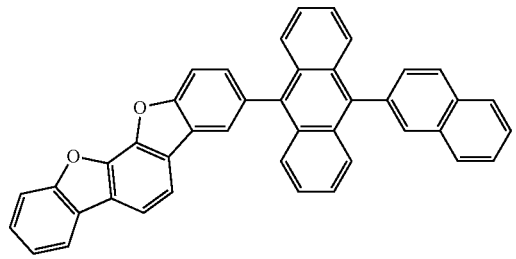 |
| H61 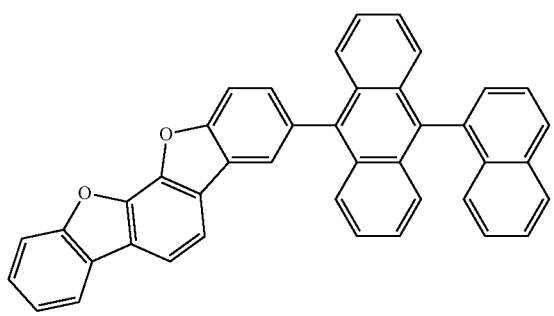 | H62 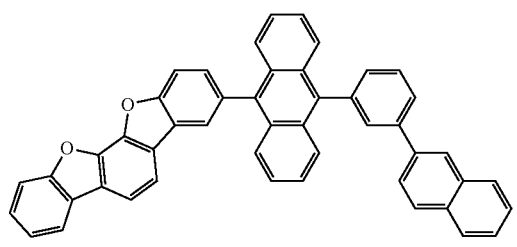 |

-continued
H63
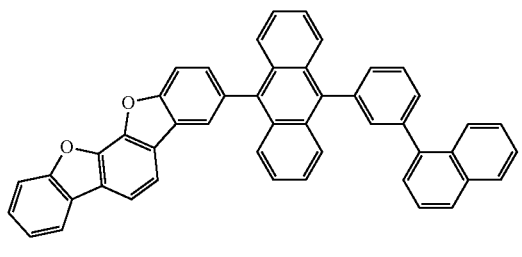
H64
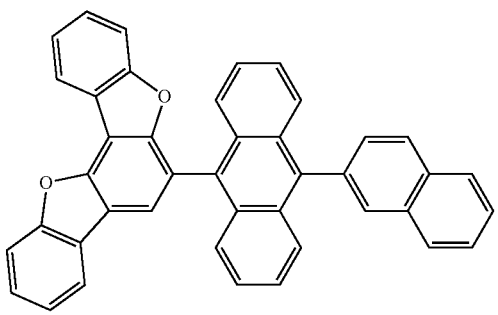
H65
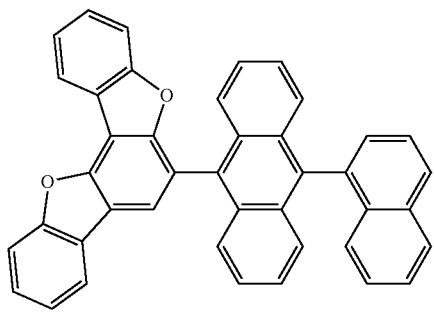
H66
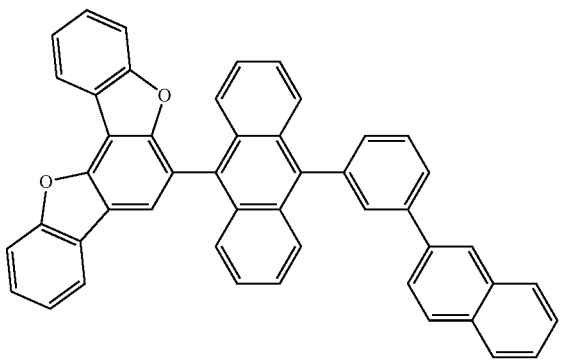
H67
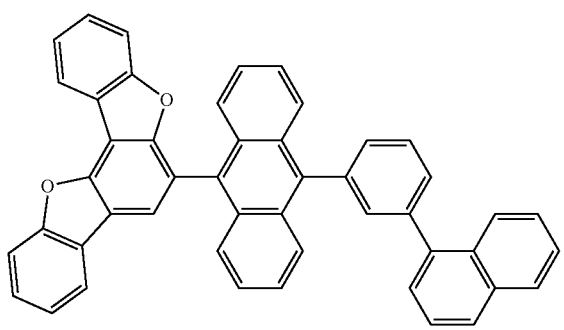
H68
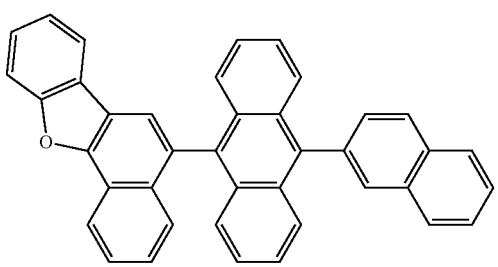
H69
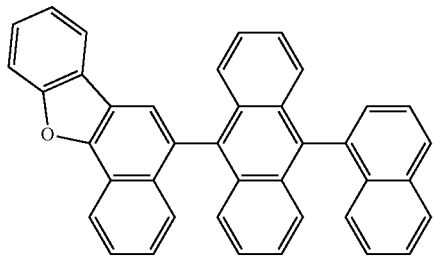
H70
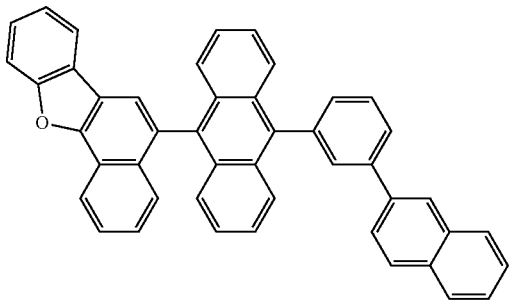

-continued
H71
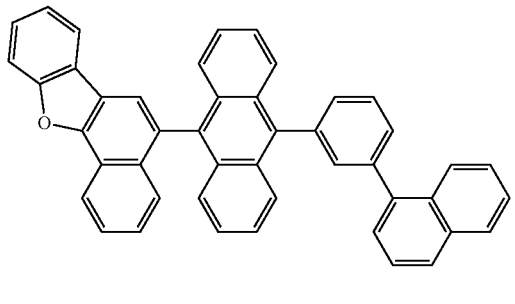
H72
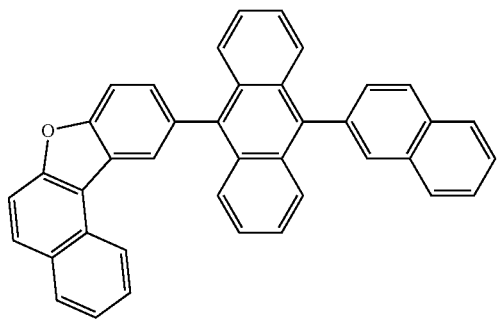
H73
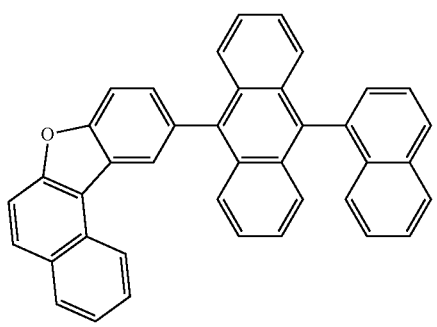
H74
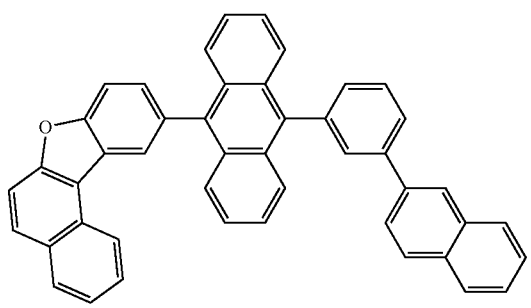
H75
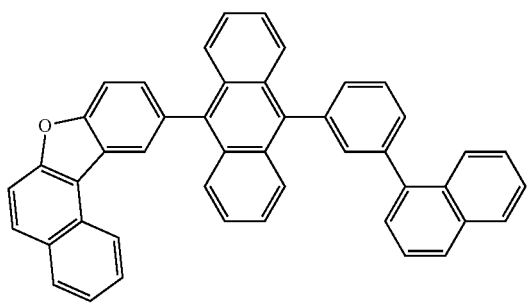
H76
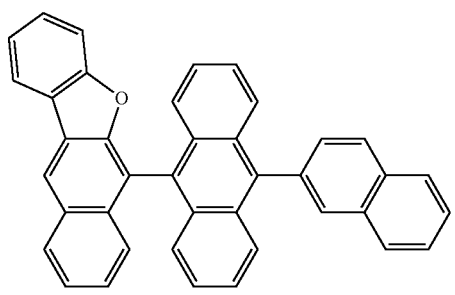
H77
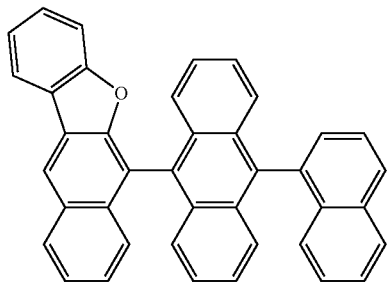
H78
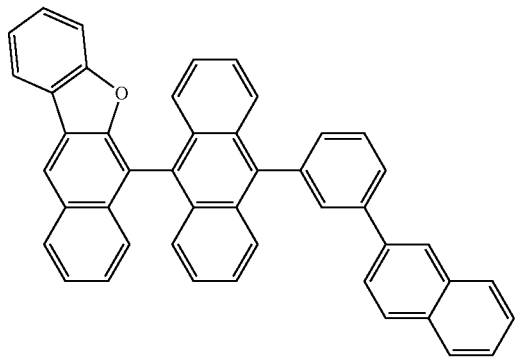

-continued
H79
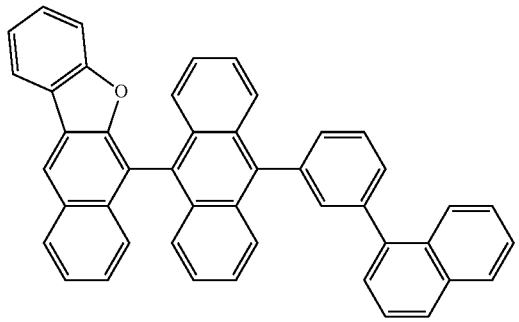
H80
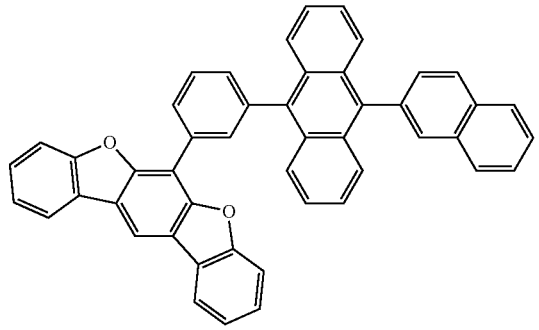
H81
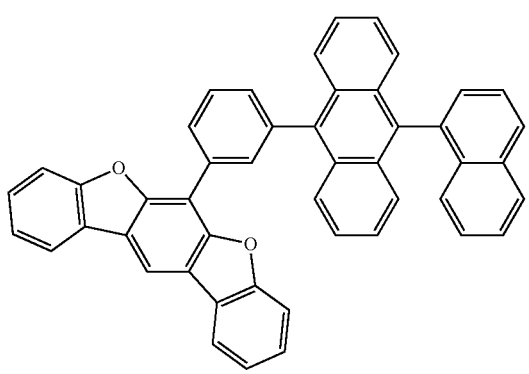
H82
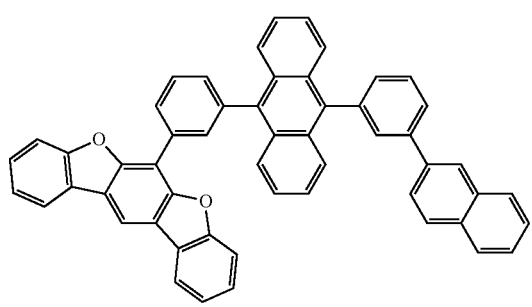
H83
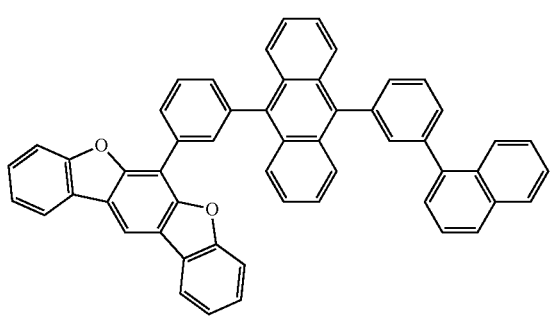
H84
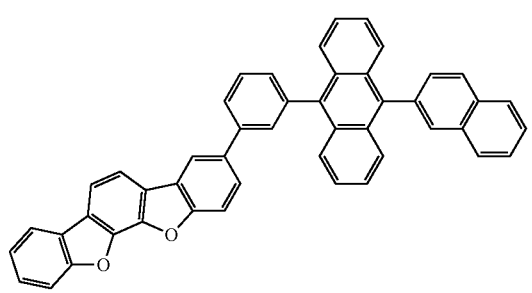
H85
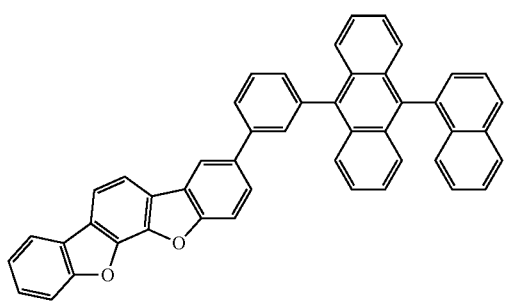
H86
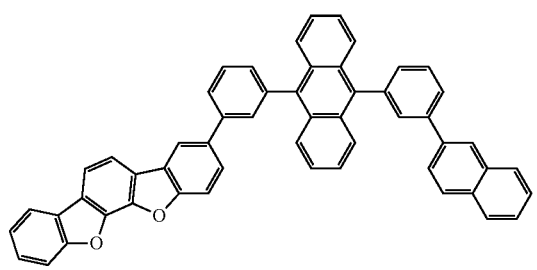

-continued
H87
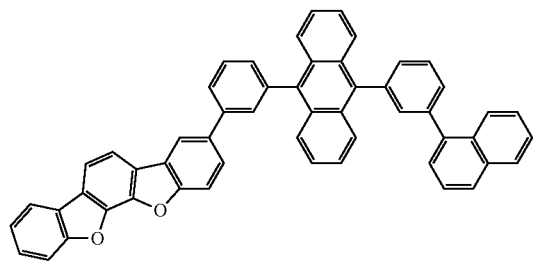
H88
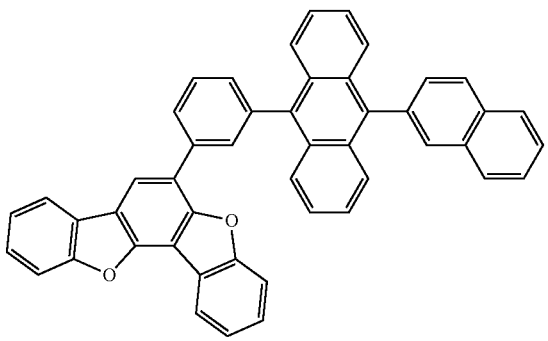
H89
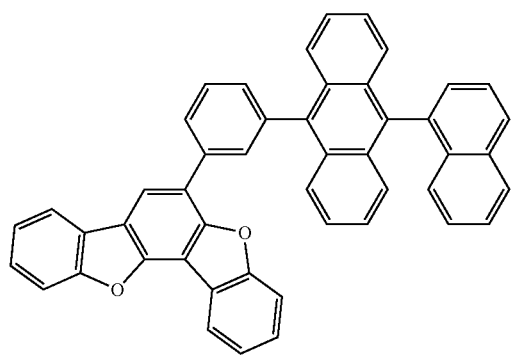
H90
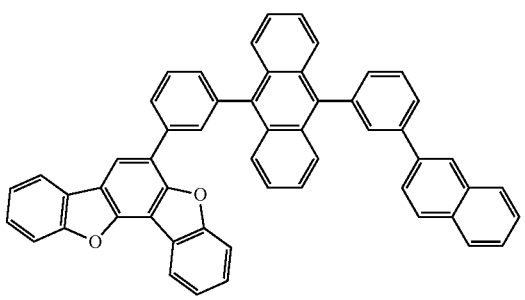
H91
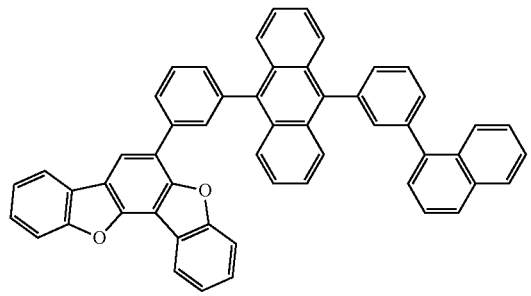
H92
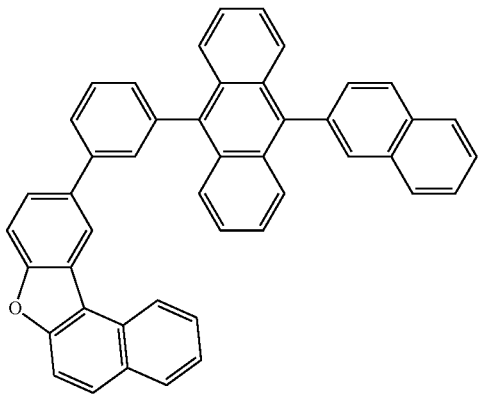
H93
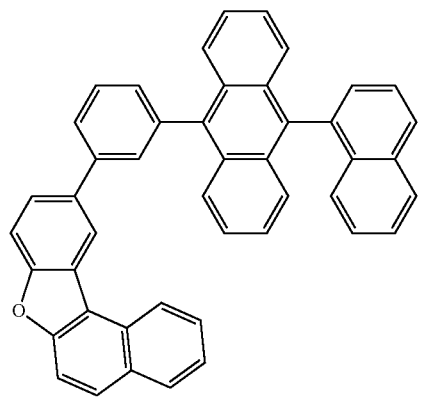
H94
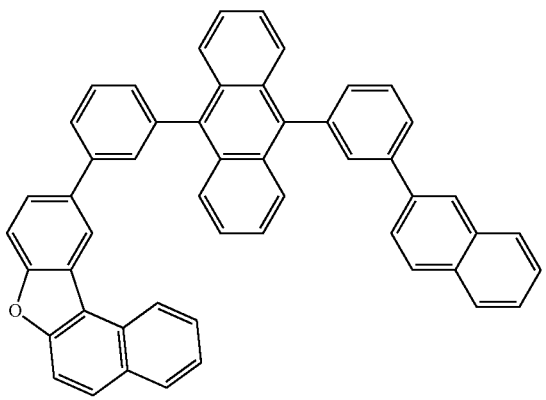

-continued
H95
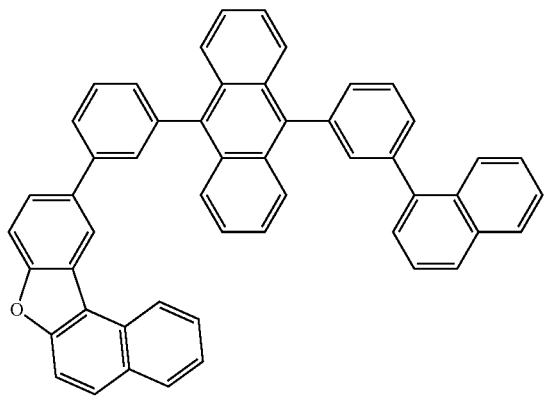
H96
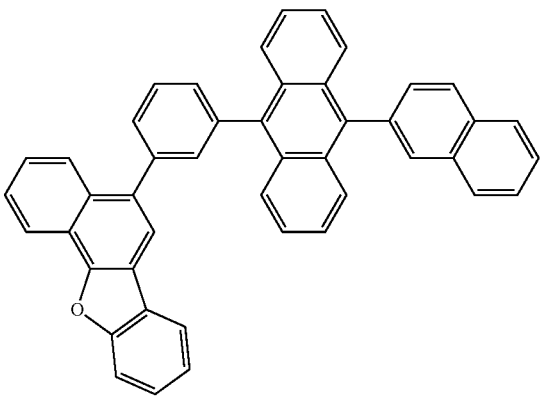
H97
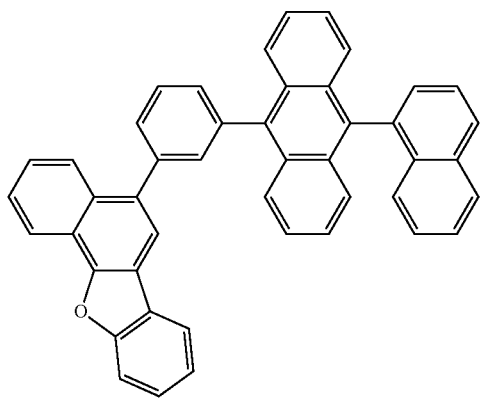
H98
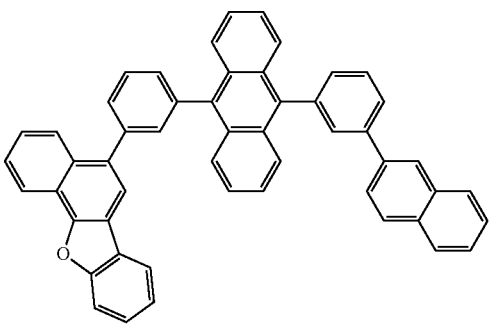
H99
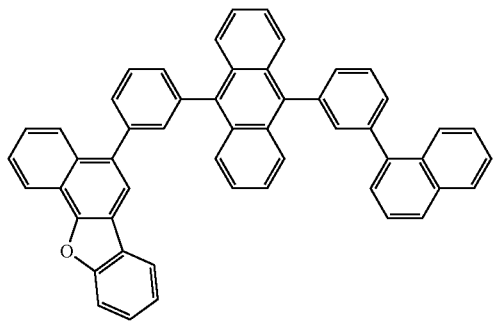
H100
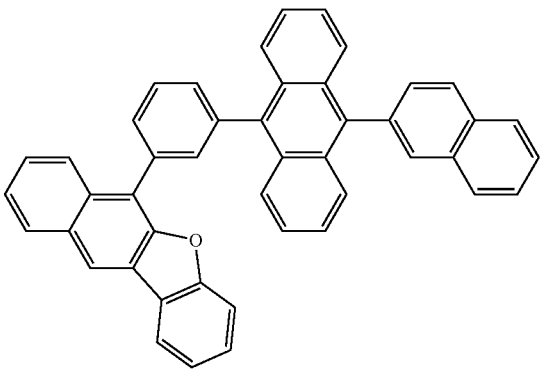
H101
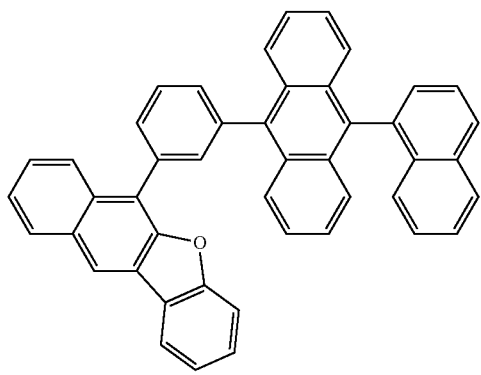
H102
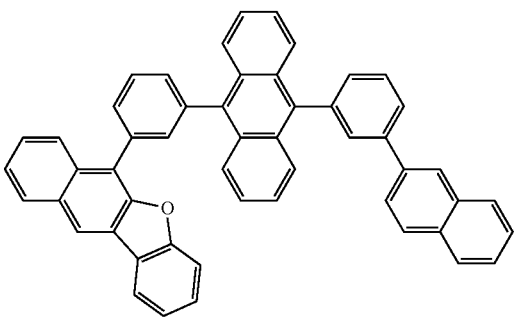

-continued
H103
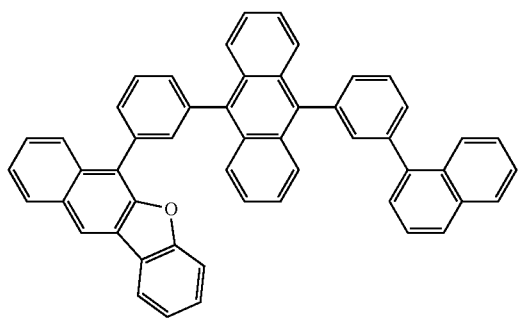
H104
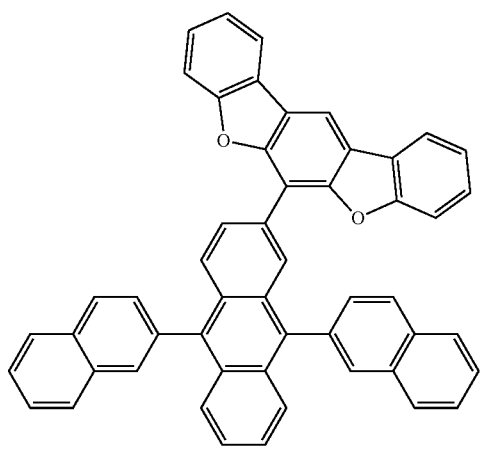
H105
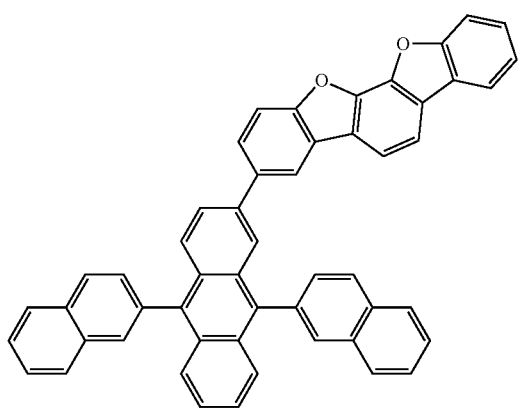
H106
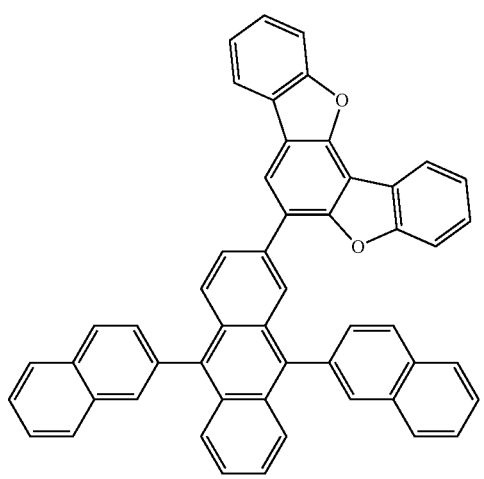
H107
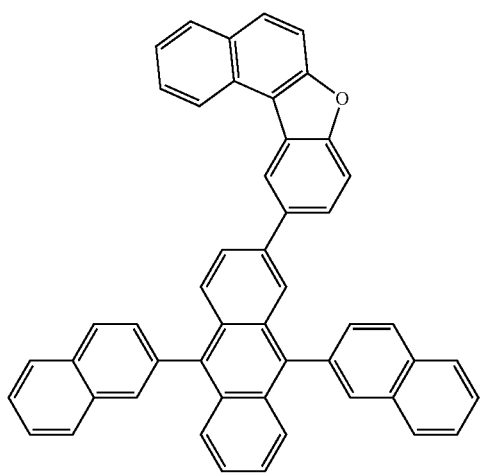
H108
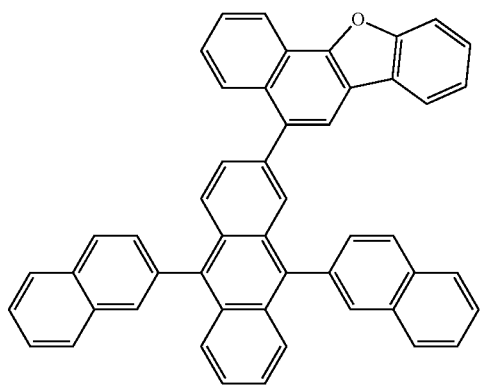

-continued
H109
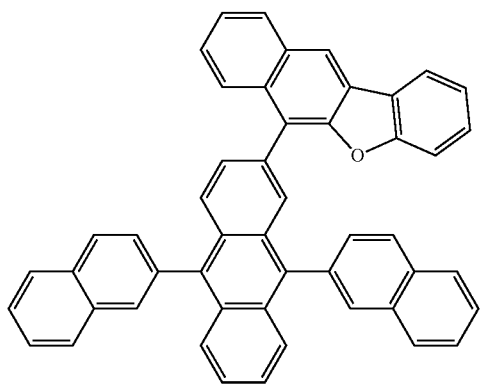
H110
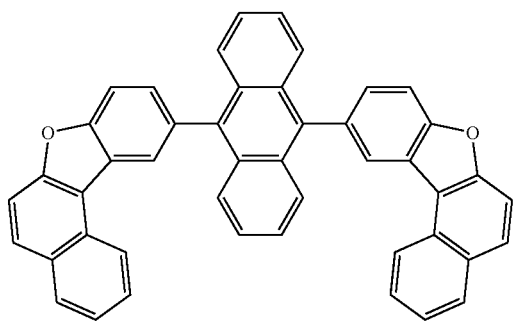
H111
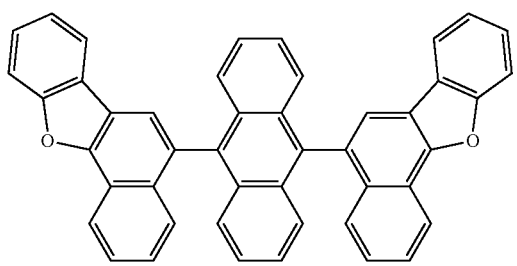
H112
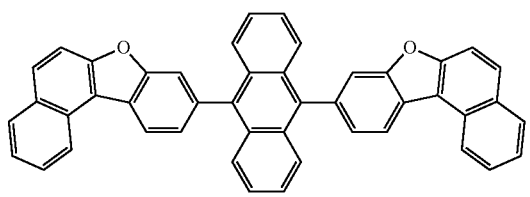
H113
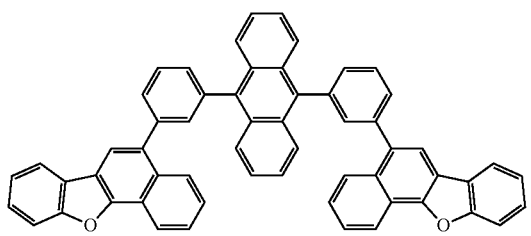
H114
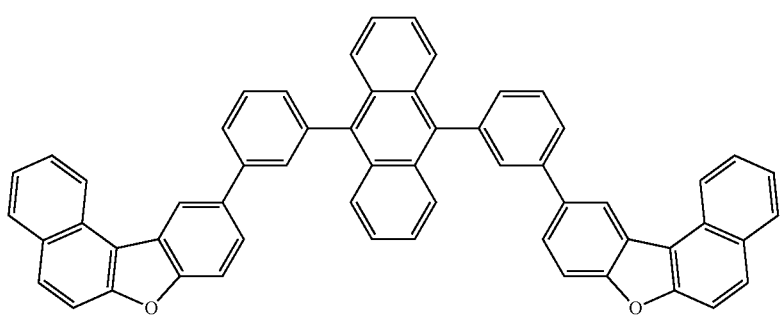

-continued
H115
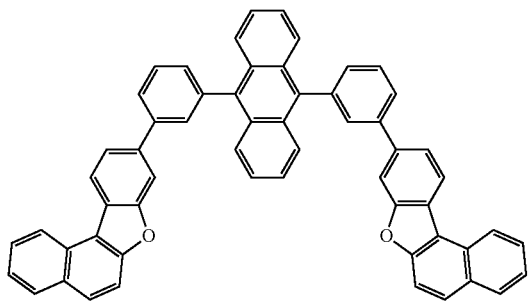
H116
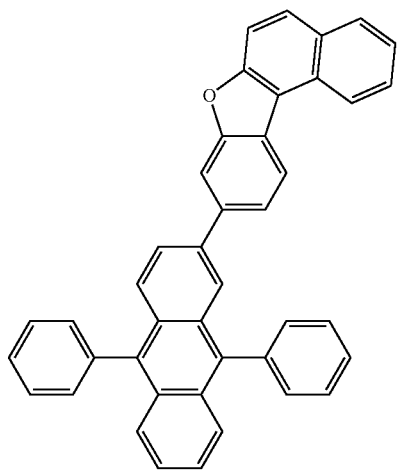
H117
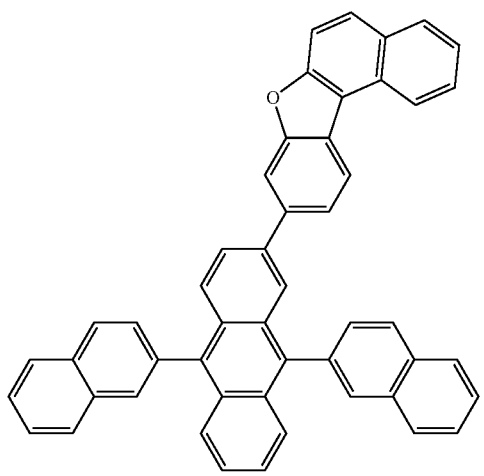
H118
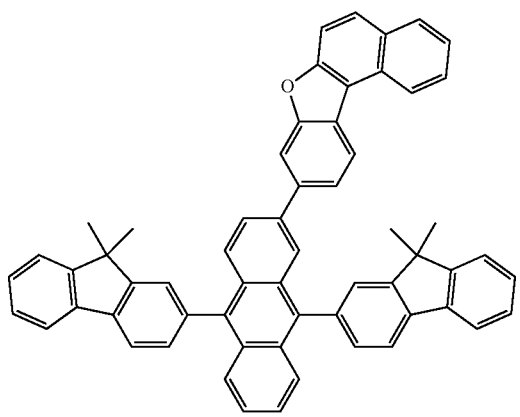
H119
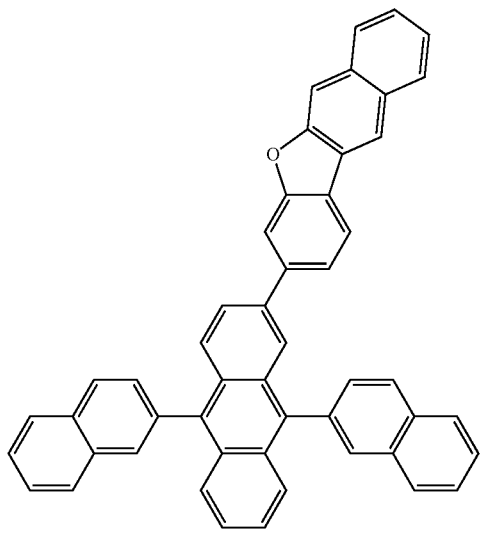
H120
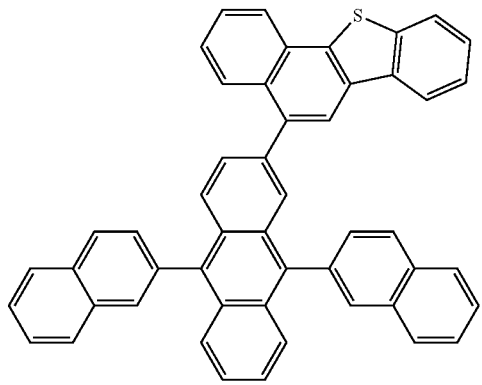

-continued

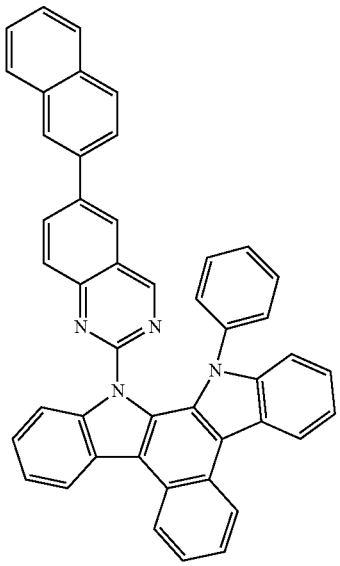
H121

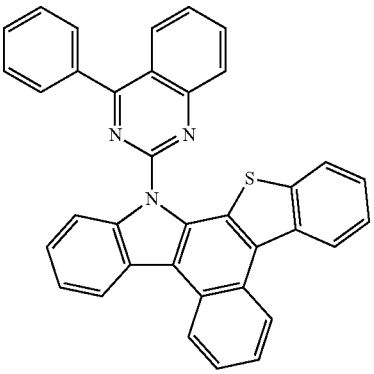
H122

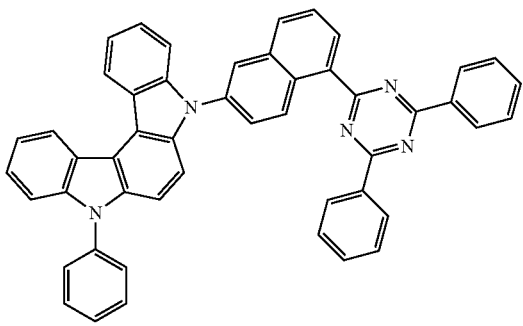
H123

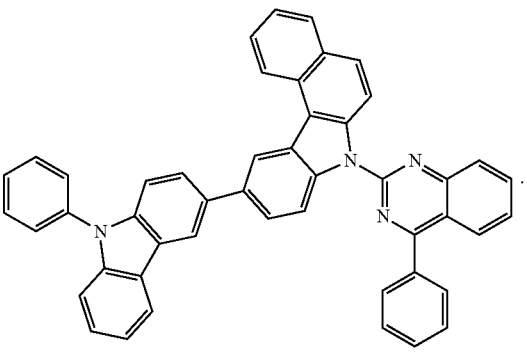
H124

[Phosphorescent Dopant]

The phosphorescent dopant may include at least one transition metal as a center metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic complex represented by Formula 401:

$$M(L_{401})_{xc1}(L_{402})_{xc2}$$ [Formula 401]

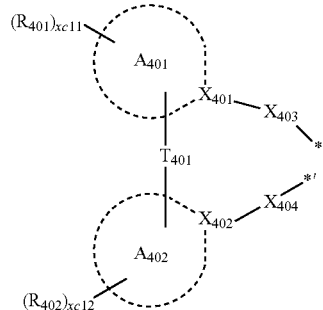
[Formula 402]

wherein in Formulae 401 and 402,

M may be transition metal (e.g., iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, and when xc1 is 2 or greater, at least two $L_{401}$(s) may be identical to or different from each other, $L_{402}$ may be an organic ligand, and xc2 may be an integer from 0 to 4, and when xc2 is 2 or greater, at least two $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)—, —C($Q_{411}$)($Q_{412}$)—, —C($Q_{411}$)=C($Q_{412}$)—, —C($Q_{411}$)=, or =C($Q_{411}$)=, $X_{403}$ and $X_{404}$ may each independently be a chemical bond (e.g., a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each be understood by referring to the description of $Q_1$ provided herein, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each be understood by referring to the description of $Q_1$ provided herein, xc11 and xc12 may each independently be an integer from 0 to 10, and

* and *' in Formula 402 each indicate a binding site to M in Formula 401.

In embodiments, in Formula 402, i) $X_{401}$ may be nitrogen, and $X_{402}$ may be carbon, or ii) $X_{401}$ and $X_{402}$ may both be nitrogen.

In embodiments, when xc1 in Formula 402 is 2 or greater, two ring $A_{401}$(s) of at least two $L_{401}$(s) may optionally be bound via $T_{402}$ as a linking group, or two ring $A_{402}$(s) may optionally be bound via $T_{403}$ as a linking group (see Compounds PD1 to PD4 and PD7). $T_{402}$ and $T_{403}$ may each be understood by referring to the description of $T_{401}$ provided herein.

$L_{402}$ in Formula 401 may be any suitable organic ligand. For example, $L_{402}$ may be a halogen group, a diketone group (e.g., an acetylacetonate group), a carboxylic acid group (e.g., a picolinate group), —C(=O), an isonitrile group, —CN, or a phosphorus group (e.g., a phosphine group or a phosphite group).

The phosphorescent dopant may be, for example, one of Compounds PD1 to PD25 or any combination thereof:

PD1

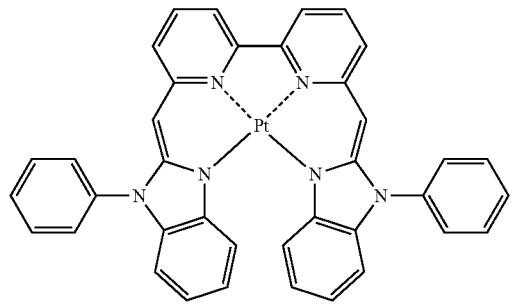

PD2

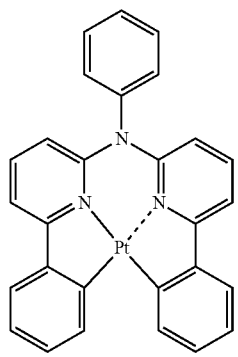

PD3

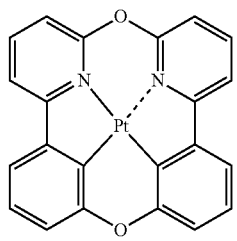

PD4

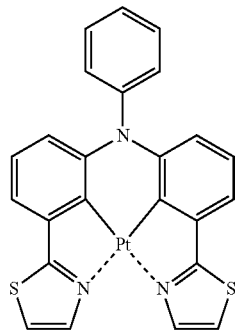

PD5

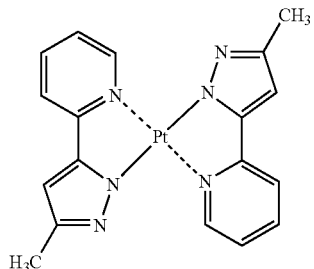

PD6

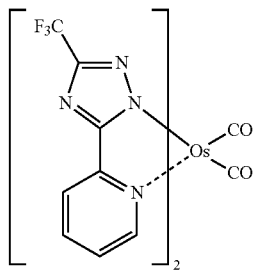

PD7

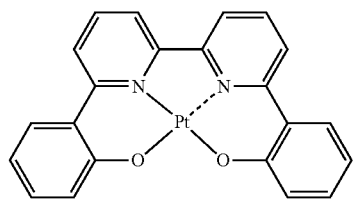

PD8

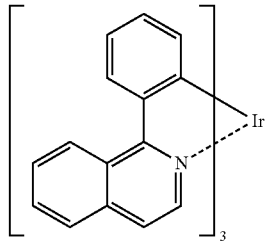

PD9
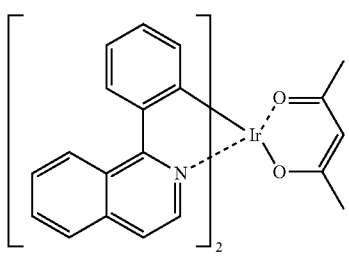
PD10
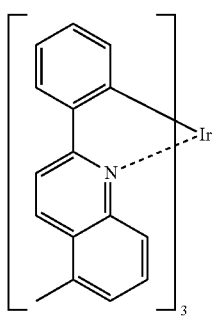
PD11
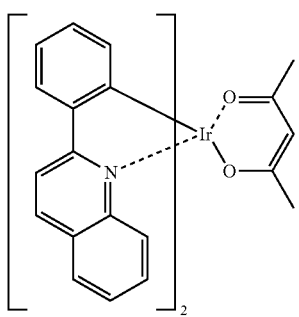
PD12
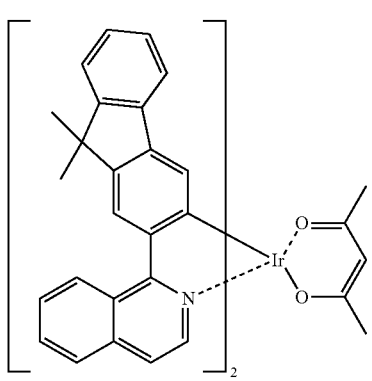
PD13
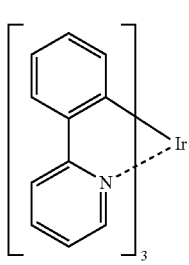
PD14
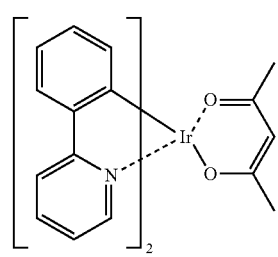
PD15
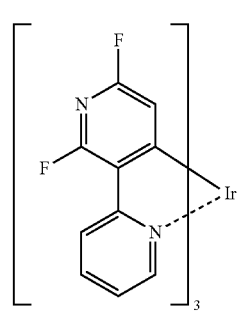
PD16
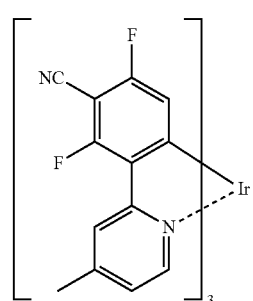
PD17
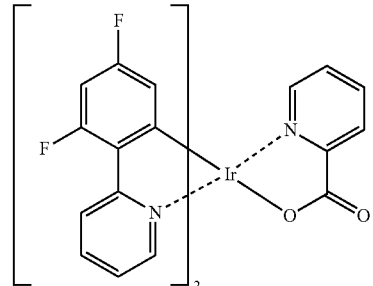
PD18
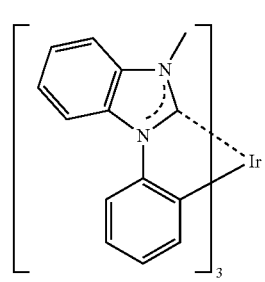

PD19 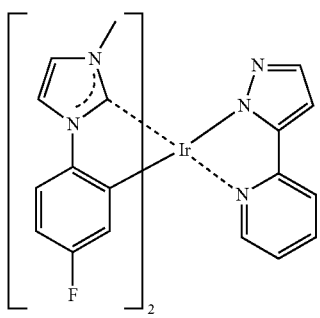

PD20 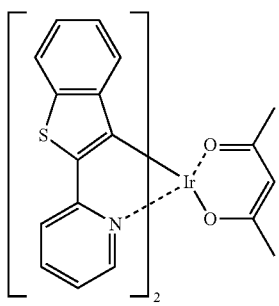

PD21 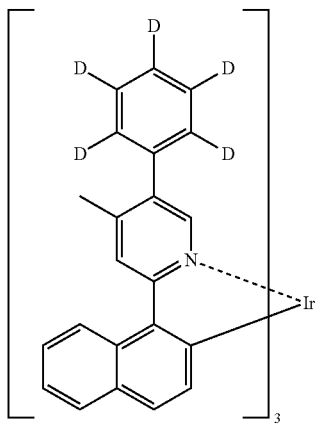

PD22 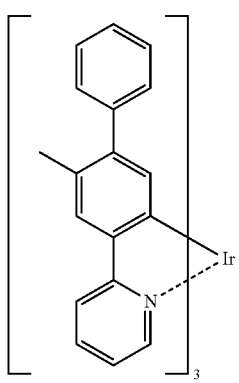

PD23 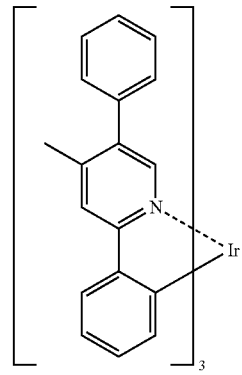

PD24 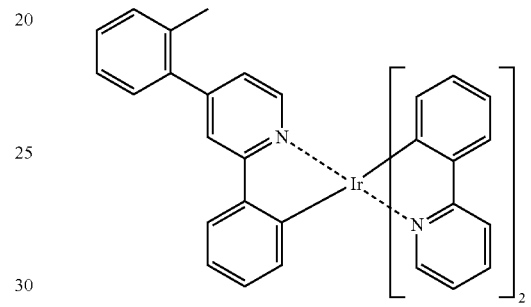

PD25 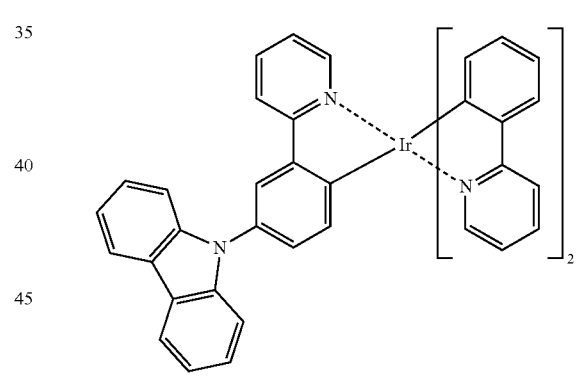

[Fluorescent Dopant]

The fluorescent dopant may include an amine group-containing compound, a styryl group-containing compound, or any combination thereof.

In embodiments, the fluorescent dopant may include a compound represented by Formula 501:

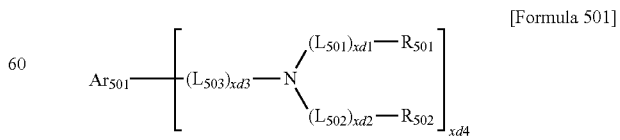

[Formula 501]

wherein in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In embodiments, in Formula 501, $Ar_{501}$ may include a condensed ring group (e.g., an anthracene group, a chrysene group, or a pyrene group) in which at least three monocyclic groups are condensed.

In embodiments, xd4 in Formula 501 may be 2.

In embodiments, the fluorescent dopant may include one of Compounds FD1 to FD36, DPVBi, DPAVBi, or any combination thereof:

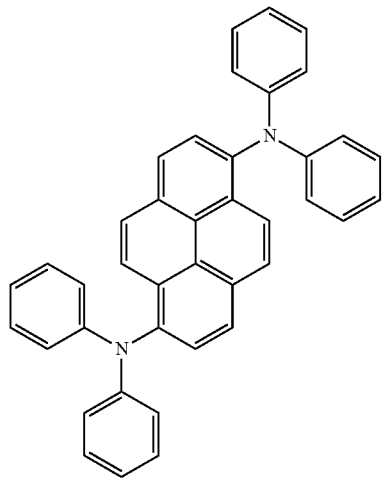

FD1

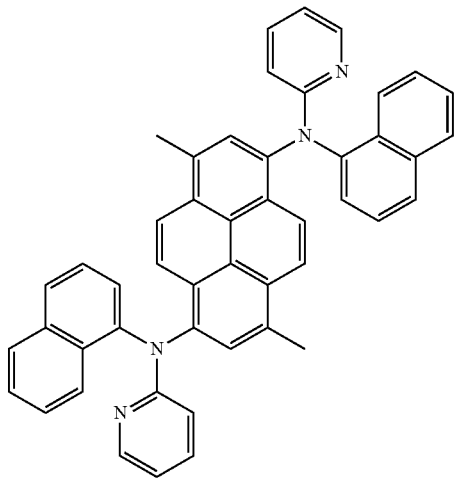

FD2

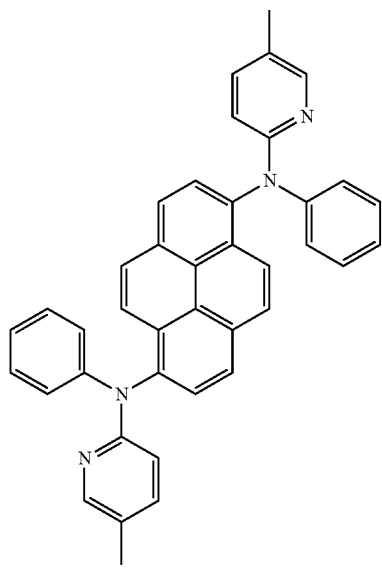

FD3

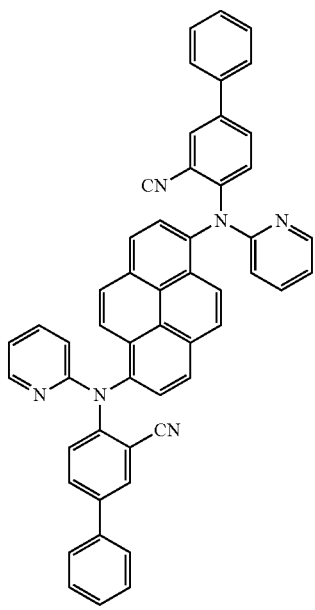

FD4

-continued
FD5
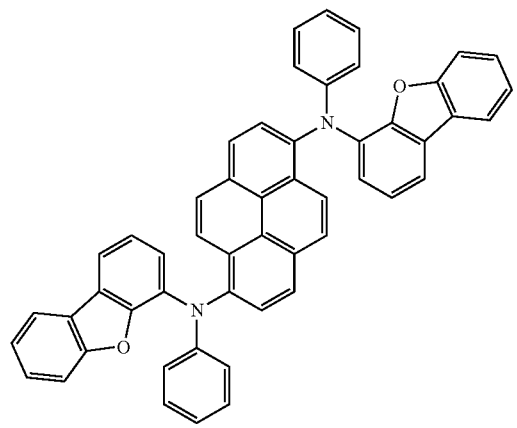
FD6
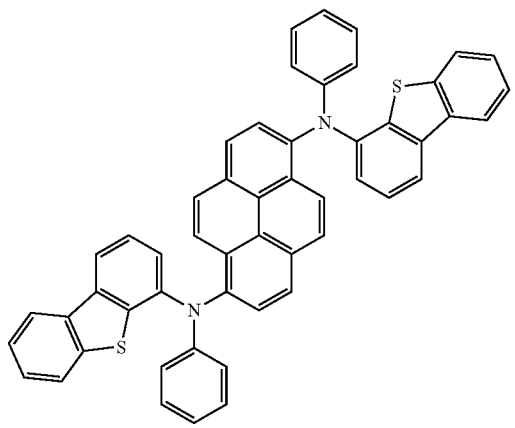
FD7
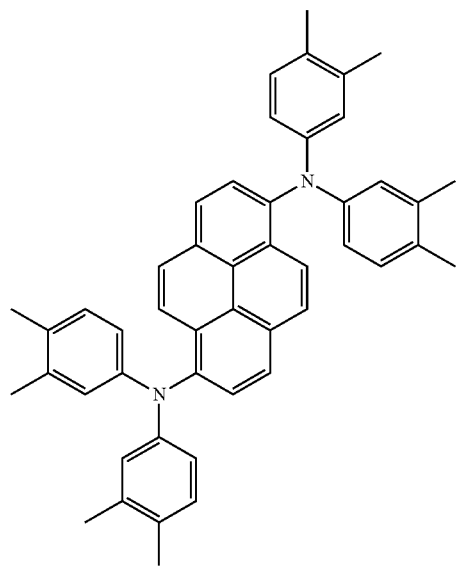
FD8
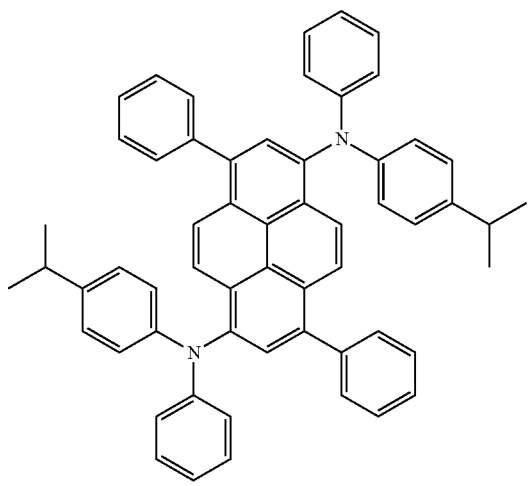
FD9
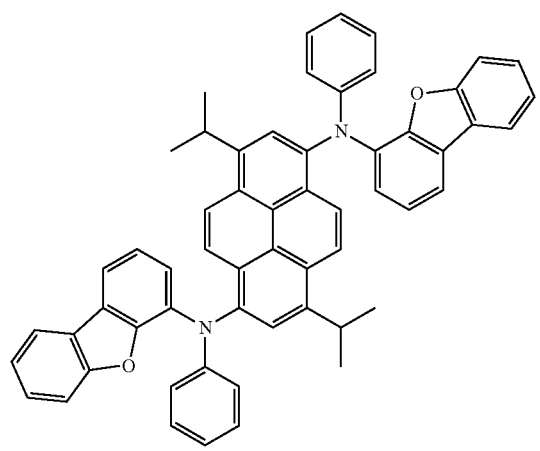
FD10
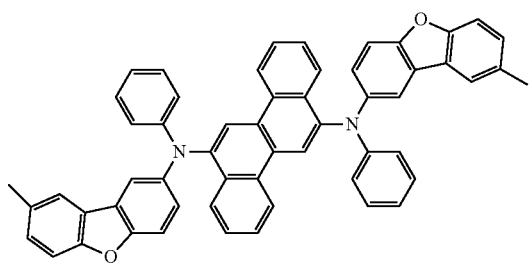

-continued
FD11 FD12
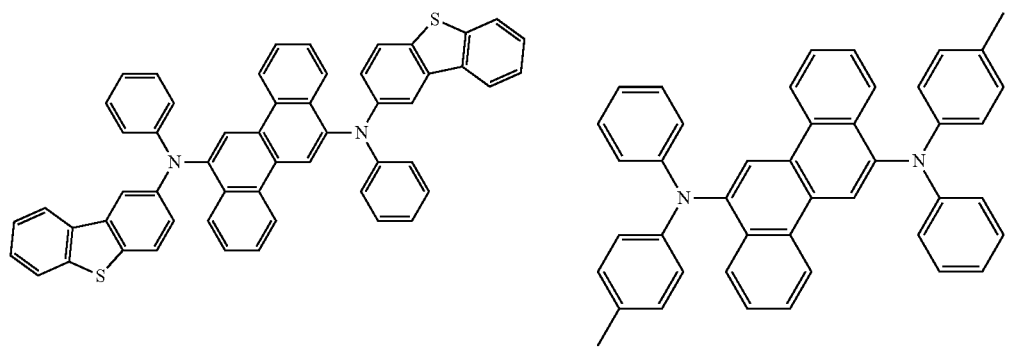
FD13 FD14
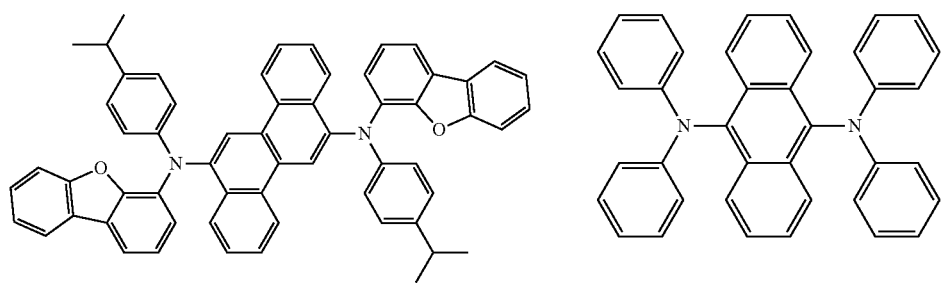
FD15 FD16
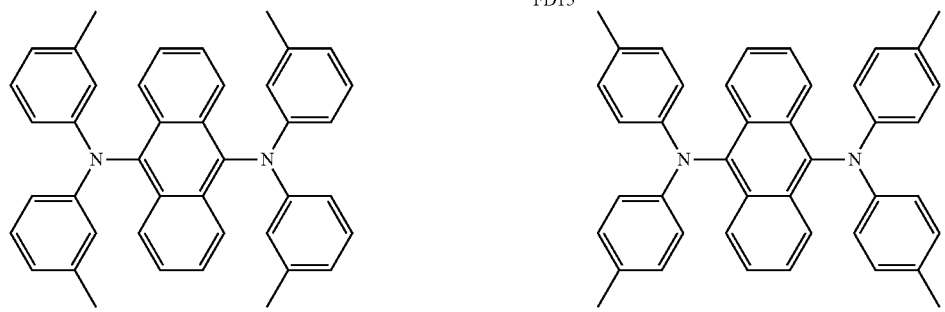
FD17 FD18
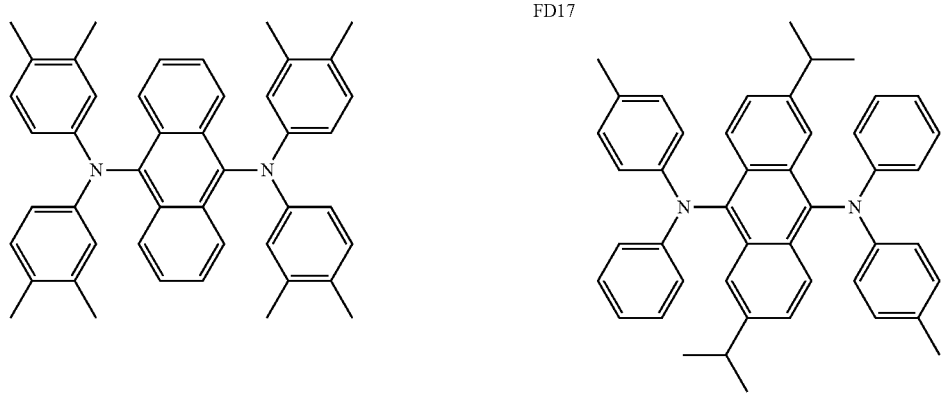

-continued
FD19
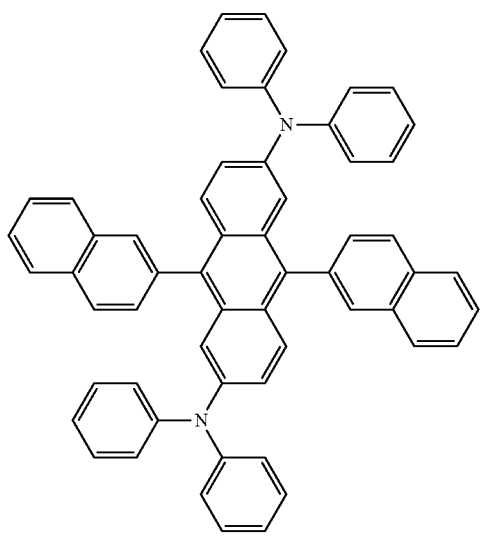
FD20
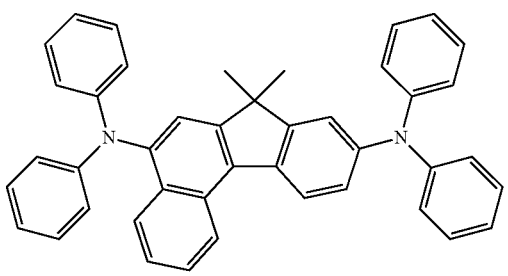
FD21
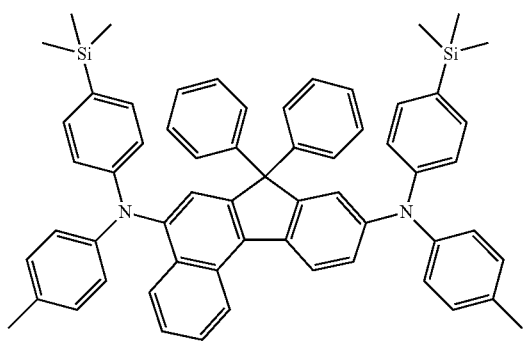
FD22
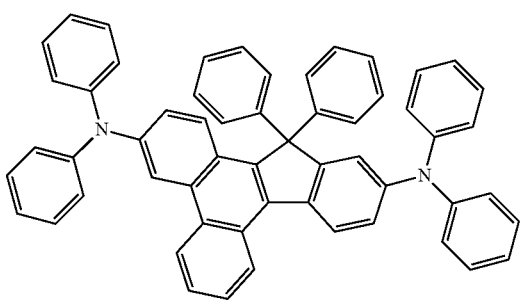
FD23
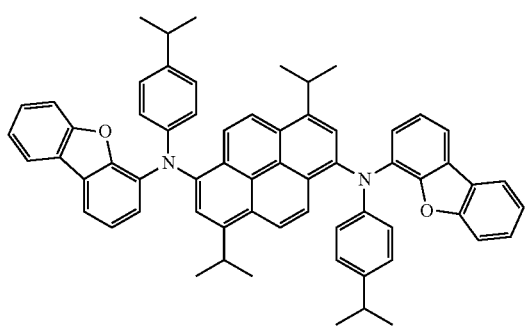
FD24
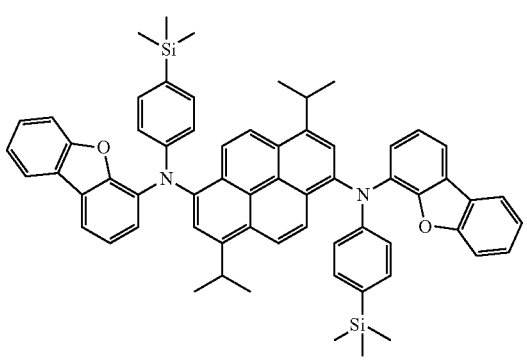
FD25
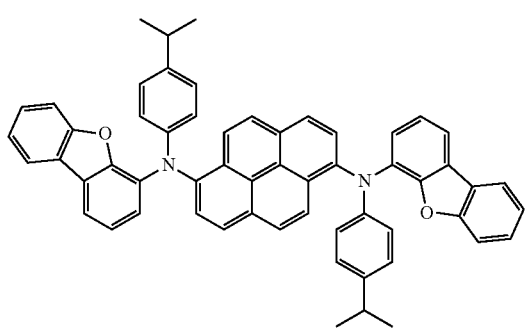
FD26
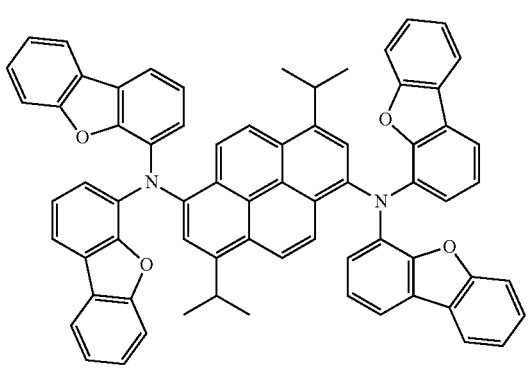

-continued
FD27
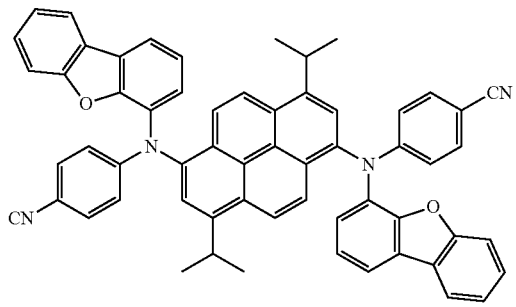
FD28
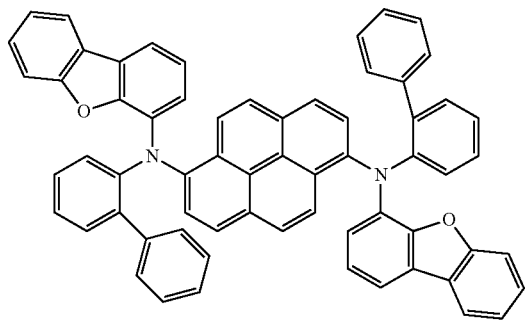
FD29
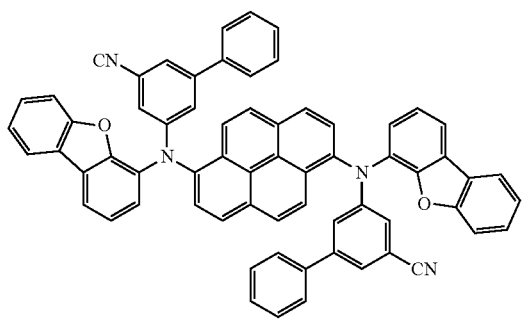
FD30
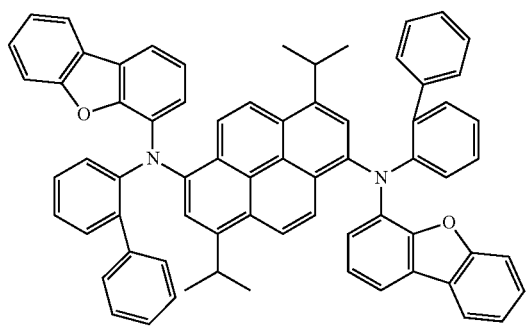
FD31
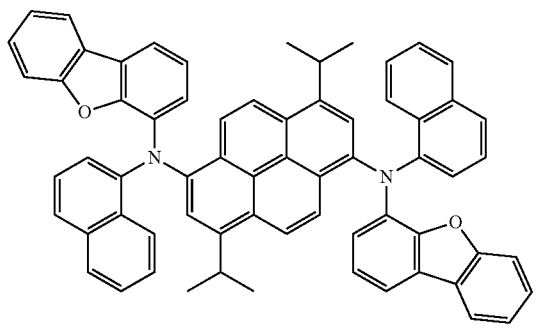
FD32
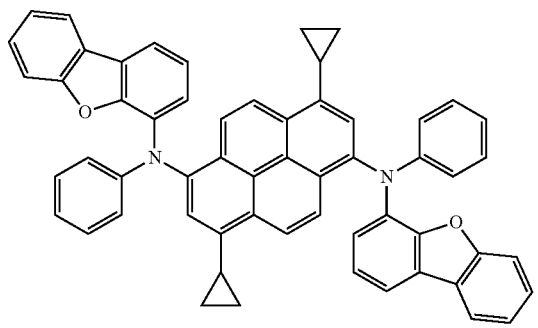
FD33
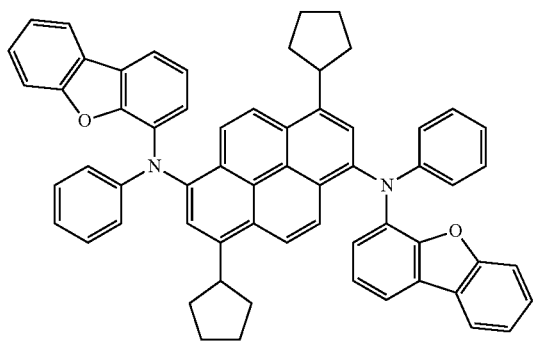
FD34
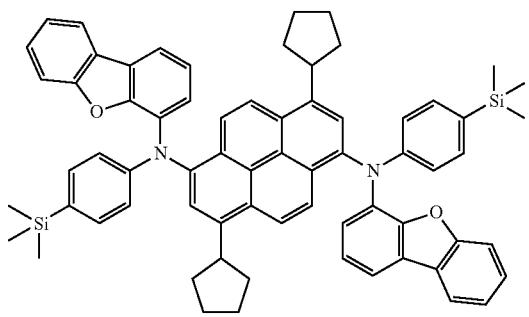

FD35

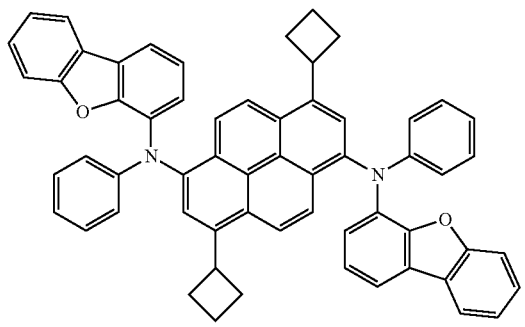

FD36

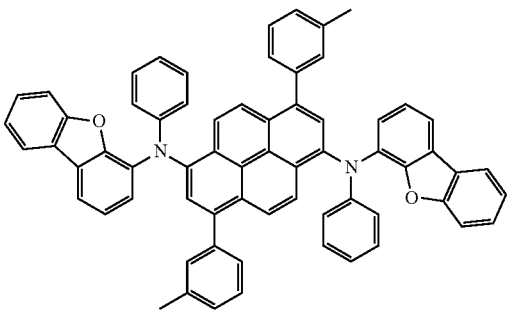

DPVBi

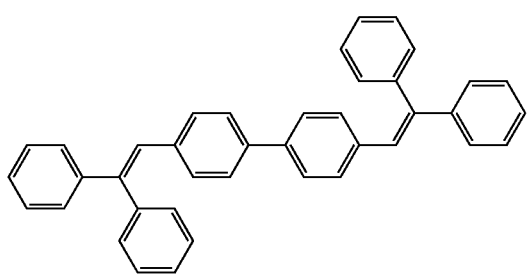

DPAVBi

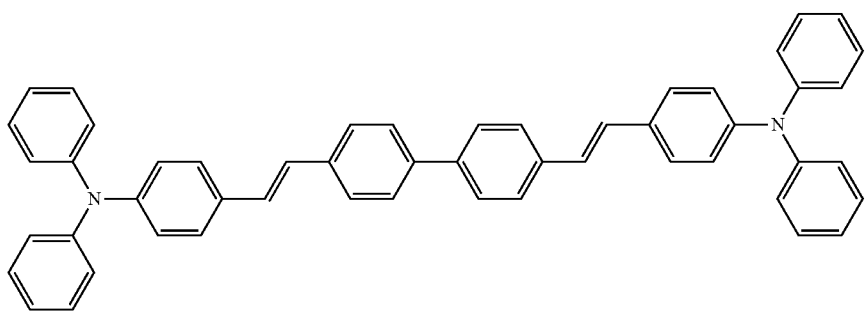

[Delayed Fluorescence Material]

The emission layer may include a delayed fluorescence material.

The delayed fluorescence material described herein may be any suitable compound that may emit delayed fluorescence according to a delayed fluorescence emission mechanism.

The delayed fluorescence material included in the emission layer may serve as a host or a dopant, depending on types of other materials included in the emission layer.

In embodiments, a difference between a triplet energy level (eV) of the delayed fluorescence material and a singlet energy level (eV) of the delayed fluorescence material may be in a range of about 0 eV to about 0.5 eV. When the difference between a triplet energy level (eV) of the delayed fluorescence material and a singlet energy level (eV) of the delayed fluorescence material is within this range, up-conversion from a triplet state to a singlet state in the delayed fluorescence material may be effectively achieved, thus improving luminescence efficiency and the like of the light-emitting device 10.

In embodiments, the delayed fluorescence material may include: i) a material including at least one electron donor (e.g., a π electron-rich $C_3$-$C_{60}$ cyclic group such as a carbazole group and the like) and at least one electron acceptor (e.g., a sulfoxide group, a cyano group, a π electron-deficient nitrogen-containing $C_1$-$C_{60}$ cyclic group, and the like), ii) a material including a $C_8$-$C_{60}$ polycyclic group including at least two cyclic groups condensed to each other and sharing boron (B), and the like.

Examples of the delayed fluorescence material may include at least one of Compounds DF1 to DF9:

DF1

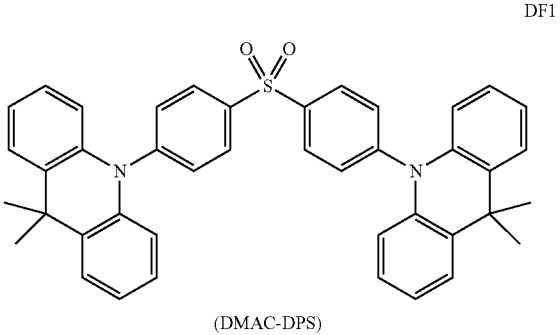

(DMAC-DPS)

-continued
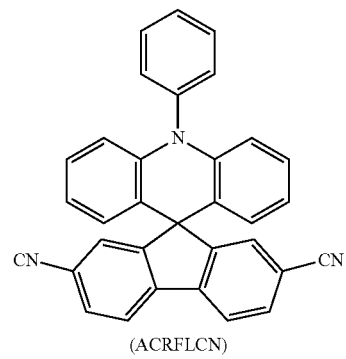
(ACRFLCN)
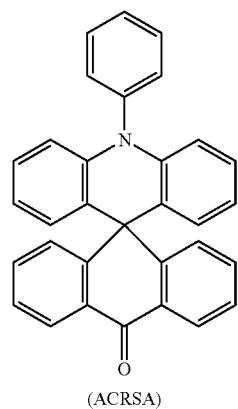
(ACRSA)
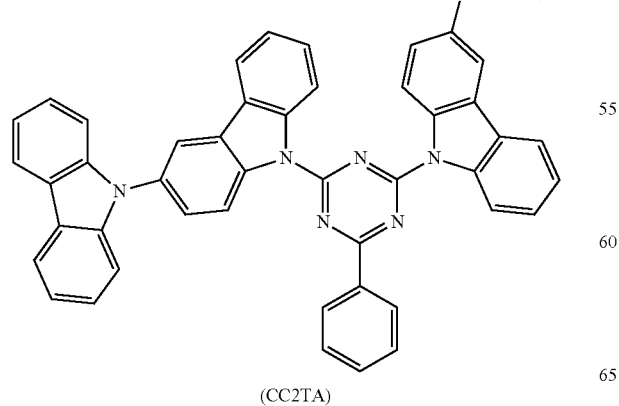
(CC2TA)
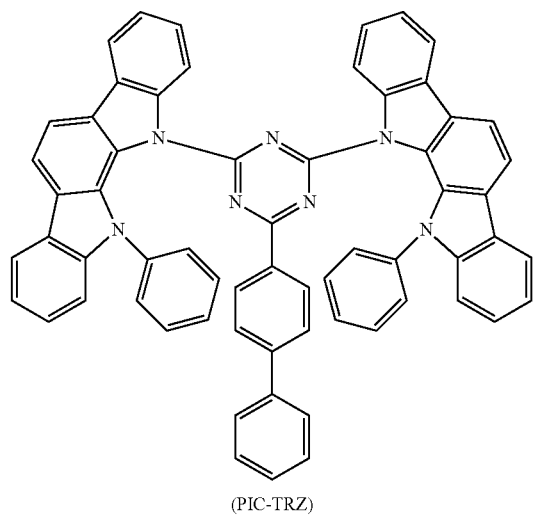
(PIC-TRZ)
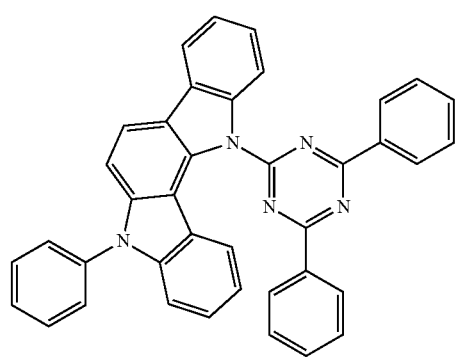
(PIC-TRZ2)
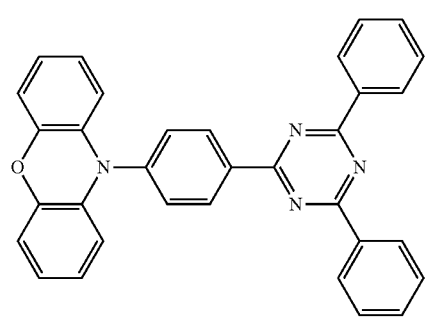
(PXZ-TRZ)
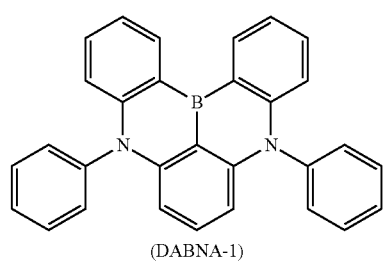
(DABNA-1)

-continued

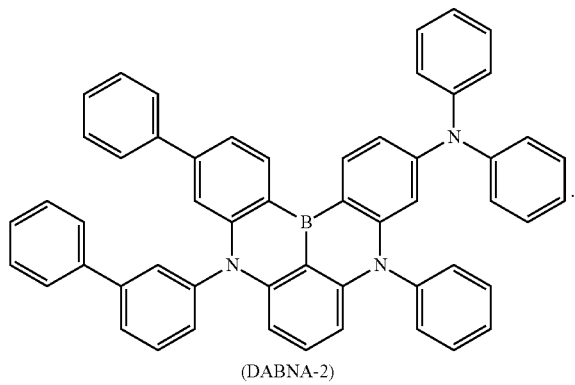

(DABNA-2)

[Quantum Dot]

The emission layer may include quantum dots.

The term "quantum dot" as used herein refers to a crystal of a semiconductor compound and may include any suitable material capable of emitting emission wavelengths of various lengths according to the size of the crystal.

A diameter of the quantum dot may be, for example, in a range of about 1 nm to about 10 nm.

Quantum dots may be synthesized by a wet chemical process, an organic metal chemical vapor deposition process, a molecular beam epitaxy process, or any similar process.

The wet chemical process is a method of growing a quantum dot particle crystal by mixing a precursor material with an organic solvent. When the crystal grows, the organic solvent may naturally serve as a dispersant coordinated on the surface of the quantum dot crystal and control the growth of the crystal. Thus, the wet chemical method may be easier than the vapor deposition process such as the metal organic chemical vapor deposition (MOCVD) or the molecular beam epitaxy (MBE) process. Further, the growth of quantum dot particles may be controlled with a lower manufacturing cost.

The quantum dot may include a group III-VI semiconductor compound; a group II-VI semiconductor compound; a group III-V semiconductor compound; a group III-VI semiconductor compound; a group semiconductor compound; a group IV-VI semiconductor compound; a group IV element or compound; or any combination thereof.

Examples of the group III-VI semiconductor compound may include a binary compound such as $In_2S_3$; a ternary compound such as AgInS, $AgInS_2$, CuInS, or $CuInS_2$; or any combination thereof.

Examples of the group II-VI semiconductor compound may include a binary compound such as CdS, CdSe, CdTe, ZnS, ZnSe, ZnTe, ZnO, HgS, HgSe, HgTe, MgSe, or MgS; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the group III-V semiconductor compound may include a binary compound such as GaN, GaP, GaAs, GaSb, AlN, AlP, AlAs, AlSb, InN, InP, InAs, or InSb; a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP; a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In embodiments, the group III-V semiconductor compound may further include a group II element. Examples of the group III-V semiconductor compound further including the group II element may include InZnP, InGaZnP, InAlZnP, and the like.

Examples of the group III-VI semiconductor compound may include a binary compound such as GaS, GaSe, $Ga_2Se_3$, GaTe, InS, InSe, $In_2Se_3$, InTe, and the like; a ternary compound such as $InGaS_3$, $InGaSe_3$, and the like; or any combination thereof.

Examples of the group I-III-VI semiconductor compound may include a ternary compound such as AgInS, $AgInS_2$, CuInS, $CuInS_2$, $CuGaO_2$, $AgGaO_2$, $AgAlO_2$, or any combination thereof.

Examples of the group IV-VI semiconductor compound may include a binary compound such as SnS, SnSe, SnTe, PbS, PbSe, or PbTe; a ternary compound such as SnSeS, SnSeTe, SnSTe, PbSeS, PbSeTe, PbSTe, SnPbS, SnPbSe, or SnPbTe; a quaternary compound such as SnPbSSe, SnPbSeTe, or SnPbSTe; or any combination thereof.

The group IV element or compound may be a single element compound such as Si or Ge; a binary compound such as SiC or SiGe; or any combination thereof.

Individual elements included in the multi-element compound, such as a binary compound, a ternary compound, and a quaternary compound, may be present in a particle thereof at a uniform or non-uniform concentration.

The quantum dot may have a single structure in which the concentration of each element included in the quantum dot is uniform or a core-shell double structure. In embodiments, materials included in the core may be different from materials included in the shell.

The shell of the quantum dot may serve as a protective layer for preventing chemical denaturation of the core to maintain semiconductor characteristics and/or as a charging layer for imparting electrophoretic characteristics to the quantum dot. The shell may be a monolayer or a multilayer. An interface between a core and a shell may have a concentration gradient where a concentration of elements in the shell decreases toward the core.

Examples of the shell of the quantum dot include metal or nonmetal oxide, a semiconductor compound, or a combination thereof. Examples of the metal oxide or the nonmetal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound such as $MgAl_2O_4$, $CoFe_2O_4$, $NiFe_2O_4$, or $CoMn_2O_4$; and any combination thereof. Example of the semiconductor compound may include a group III-VI semiconductor compound; a group II-VI semiconductor compound; a group III-V semiconductor compound; a group III-VI semiconductor compound; a group I-III-VI semiconductor compound; a group IV-VI semiconductor compound; or any combination thereof. In embodiments, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of a spectrum of an emission wavelength equal to or less than about 45 nm. For example, the quantum dot may have a FWHM of a spectrum of an emission wavelength equal to or less than about 40 nm. For example, the quantum dot may have a FWHM of a spectrum of an emission wavelength equal to or less than about 30 nm or less. When the FWHM of the quantum dot is within any of the above ranges, color purity or color reproducibility may be improved. Light emitted through the quantum dot may be emitted in all directions, and thus, an optical viewing angle may be improved.

The quantum dot may be a spherical, a pyramidal, a multi-arm, or a cubic particle, or it may be a nanoparticle, a nanotube, a nanowire, a nanofiber, or a nanoplate particle.

By adjusting the size of the quantum dot, the energy band gap may also be adjusted, thereby obtaining light of various wavelengths in the quantum dot emission layer. By using quantum dots of various sizes, a light-emitting device that may emit light of various wavelengths may be realized. In embodiments, the size of the quantum dot may be selected such that the quantum dot may emit red, green, and/or blue light. The size of the quantum dot may be selected such that the quantum dot may emit white light by combining various light of colors.

[Electron Transport Region in Interlayer 130]

The electron transport region may have i) a single-layered structure consisting of a single layer consisting of a single material, ii) a single-layered structure consisting of a single layer including different materials, or iii) a multi-layered structure having multiple layers including different materials.

The electron transport region may include a hole blocking layer, an electron transport layer, an electron injection layer, or a combination thereof.

In embodiments, the electron transport region may have a structure of electron transport layer/electron injection layer or a structure of hole blocking layer/electron transport layer/electron injection layer, wherein layers of each structure are sequentially stacked over the emission layer in the stated order.

The electron transport region (e.g., a hole blocking layer or an electron transport layer in the electron transport region) may include a metal-free compound including at least one π electron-deficient nitrogen-containing $C_1$-$C_{60}$ cyclic group.

In embodiments, the electron transport region may include a compound represented by Formula 601:

$$[Ar_{601}]_{xe11}-[(L_{601})_{xe1}-R_{601}]_{xe21}$$ [Formula 601]

wherein in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$ ($Q_{601}$), or —P(=O)($Q_{601}$)($Q_{602}$), $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may independently be a π electron-deficient nitrogen-containing $C_1$-$C_{60}$ cyclic group unsubstituted or substituted with at least one $R_{10a}$.

In embodiments, when xe11 in Formula 601 is 2 or greater, at least two $Ar_{601}$(s) may be bound via a single bond.

In embodiments, in Formula 601, $Ar_{601}$ may be a substituted or unsubstituted anthracene group.

In embodiments, the electron transport region may include a compound represented by Formula 601-1:

[Formula 601-1]

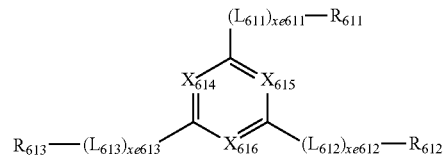

wherein in Formula 601-1, $X_{614}$ may be N or C($R_{614}$), $X_{615}$ may be N or C($R_{615}$), $X_{616}$ may be N or C($R_{616}$), at least one selected from $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

ET1

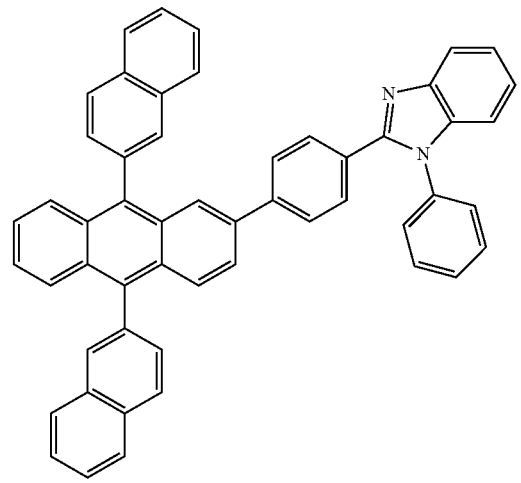

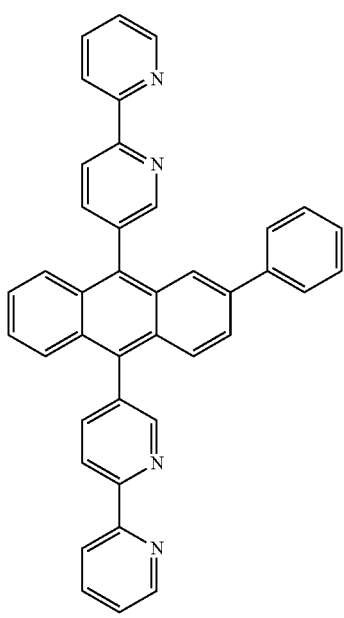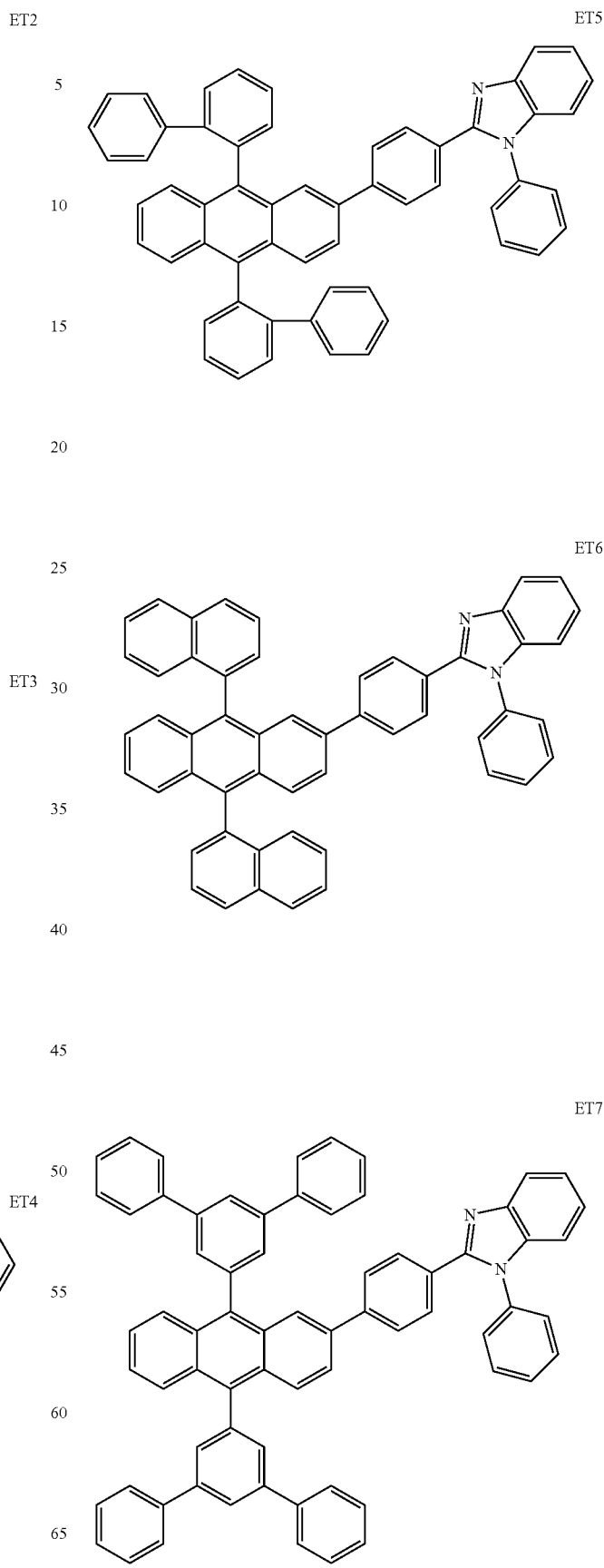

ET8
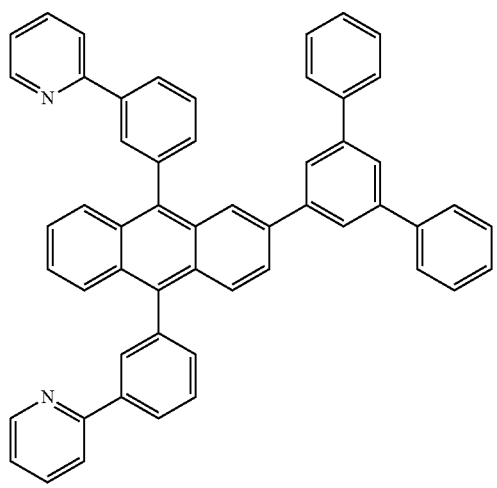
ET10
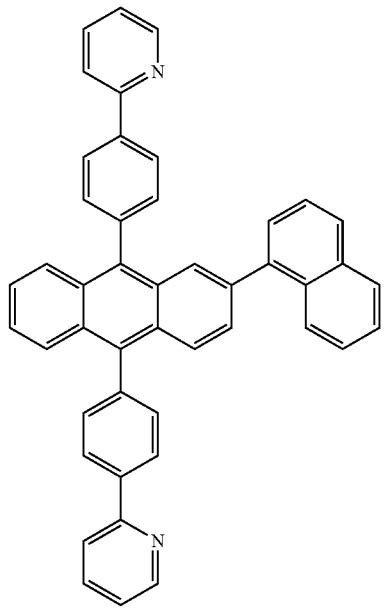
ET11
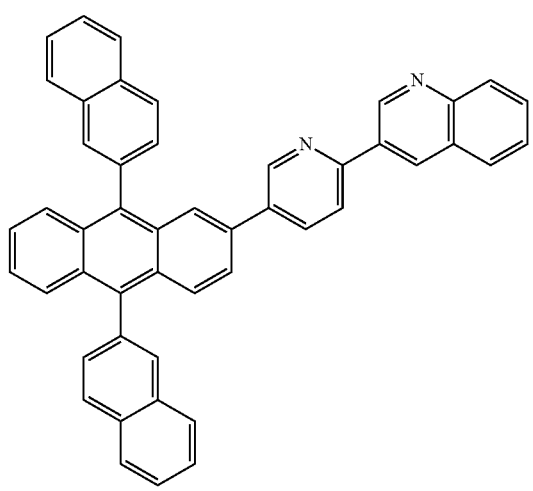
ET9
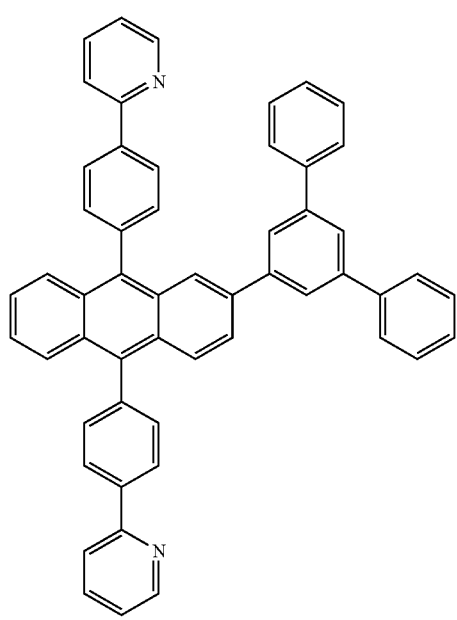
ET12
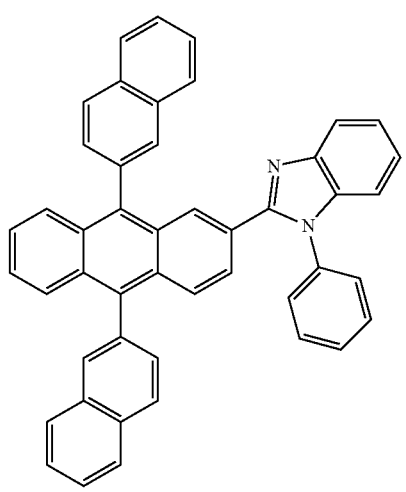

ET13
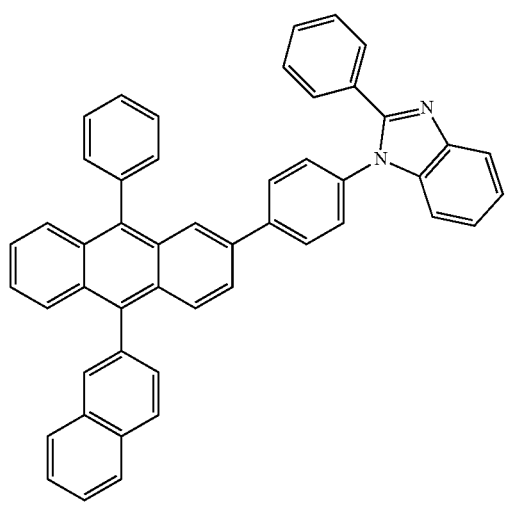
ET16
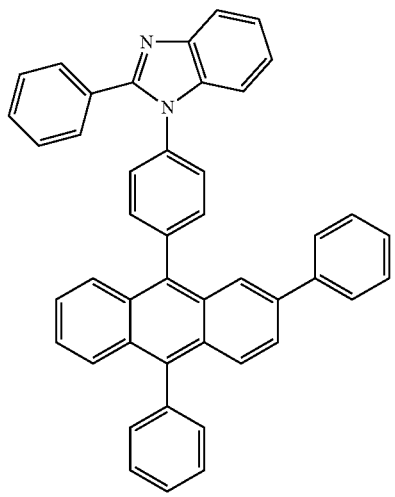
ET14
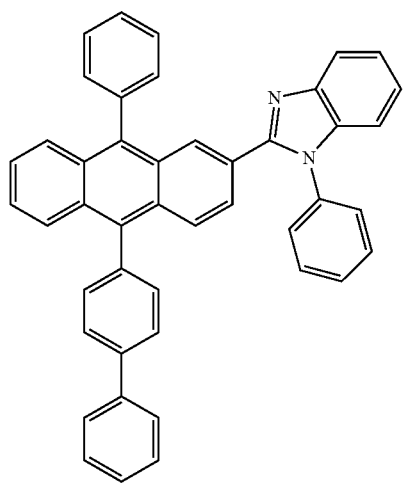
ET17
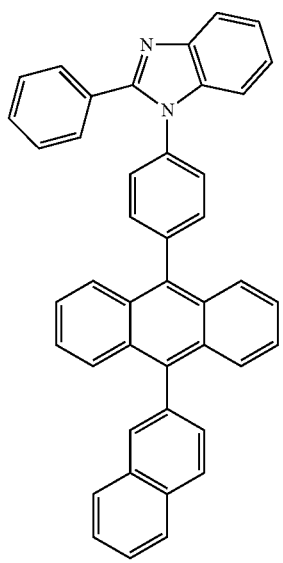
ET15
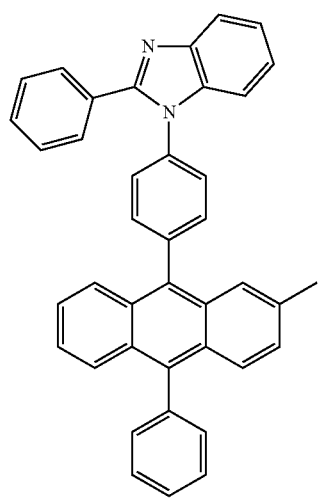
ET18
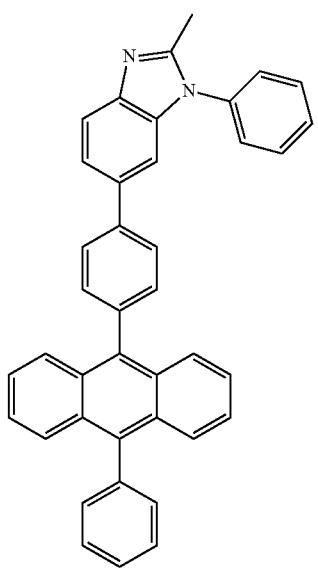

ET19
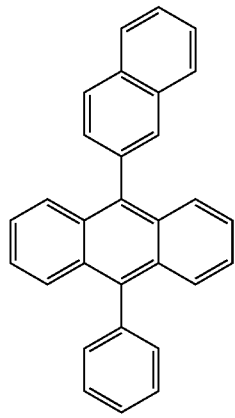
ET20
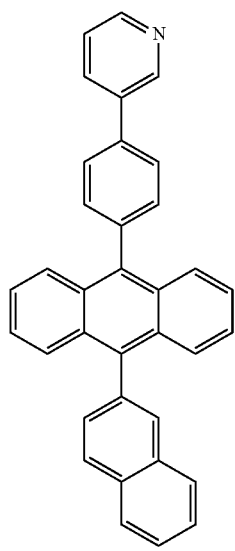
ET21
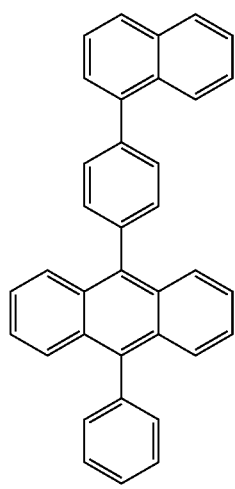
ET22
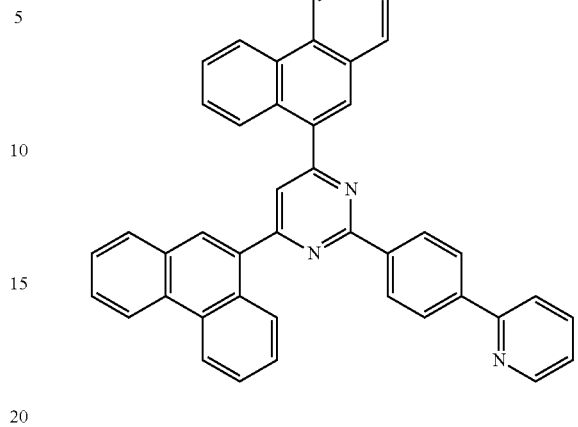
ET23
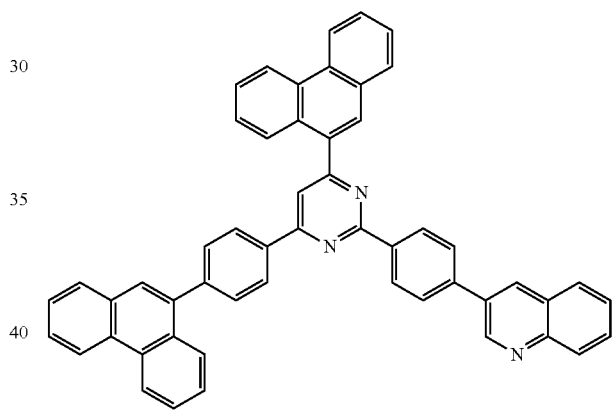
ET24
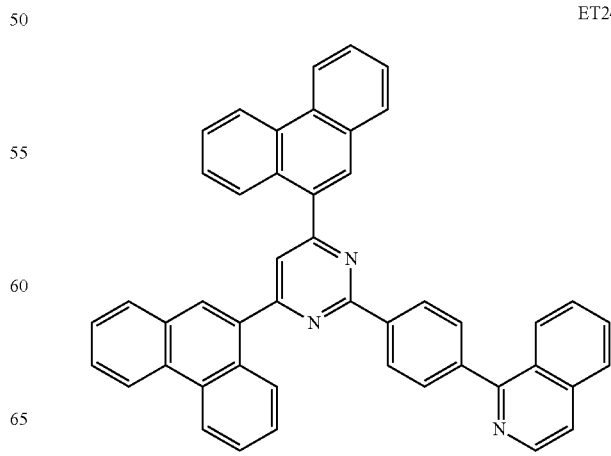

-continued
ET25
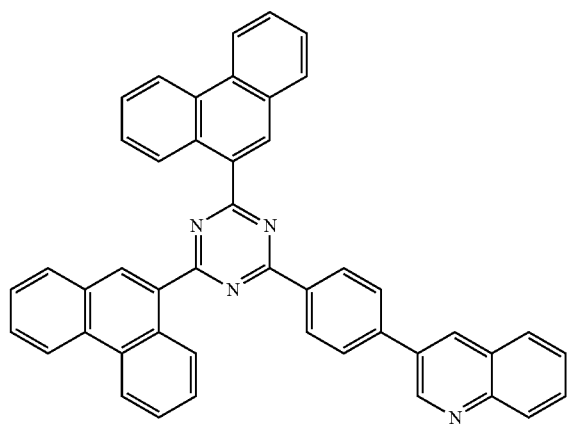
ET26
ET27
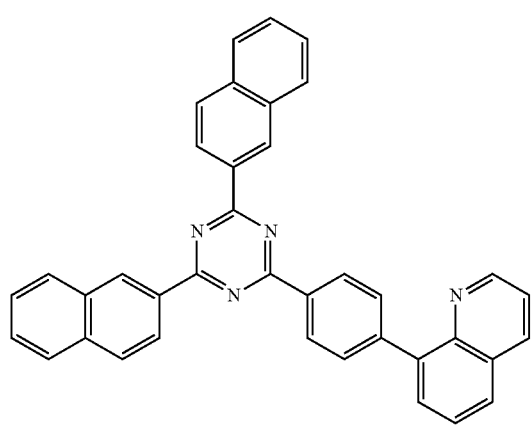
-continued
ET28
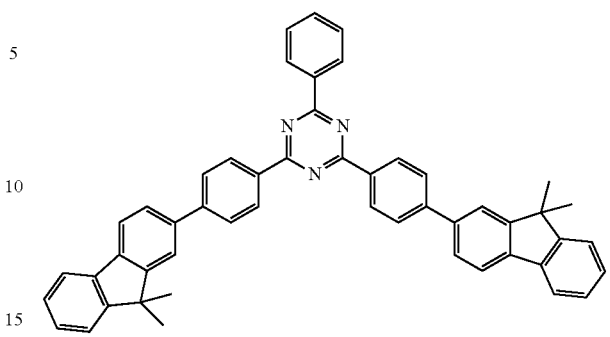
ET29
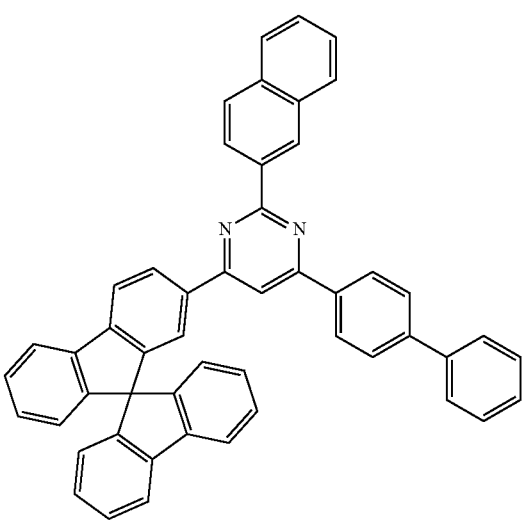
ET30

ET31
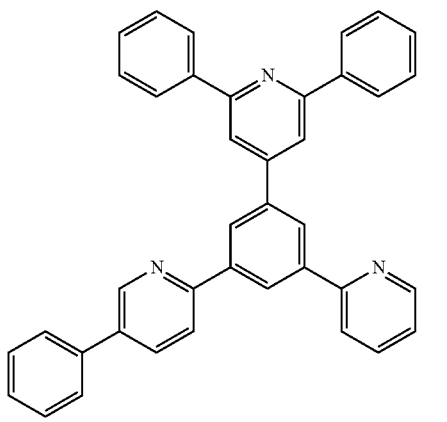
ET34
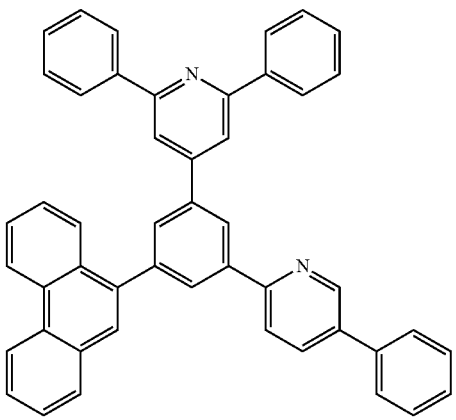
ET32
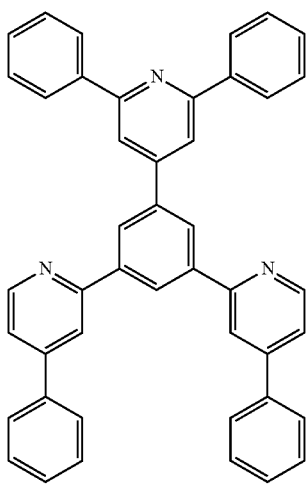
ET35
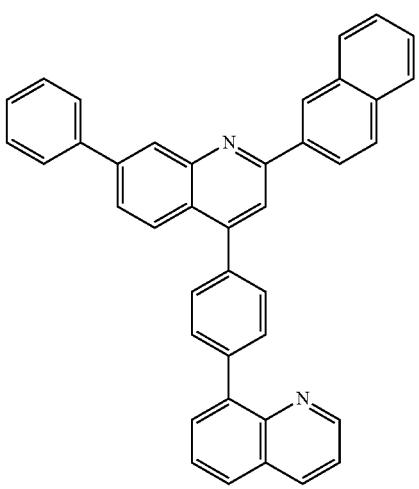
ET36
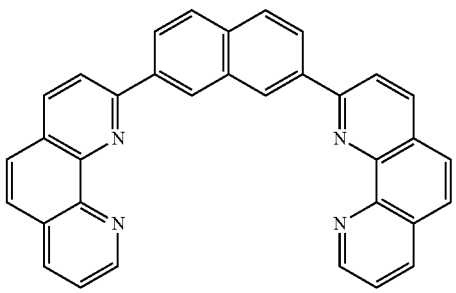
ET33
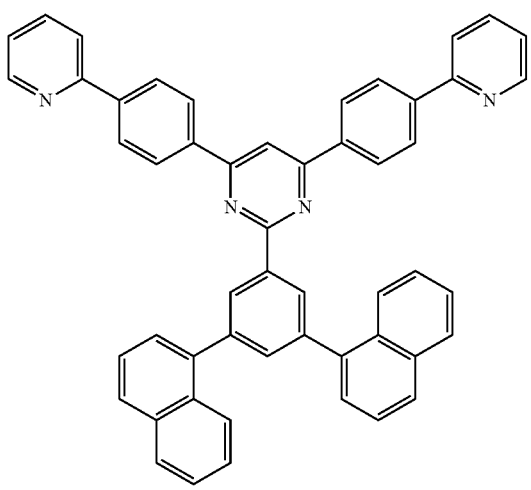
ET37
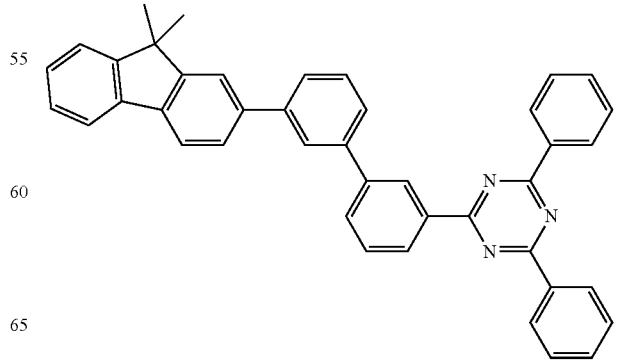

ET38
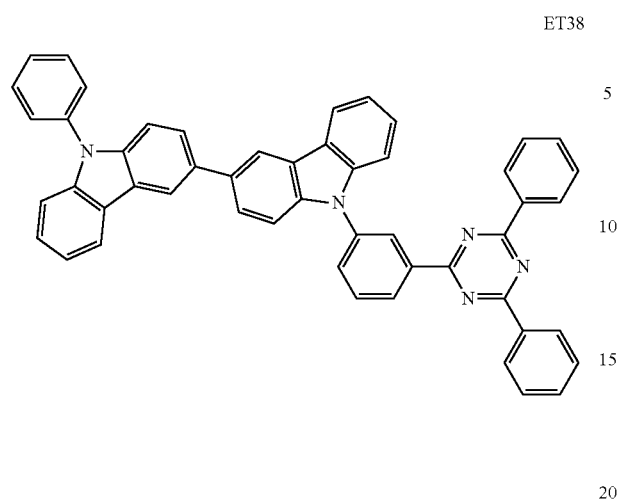
ET41
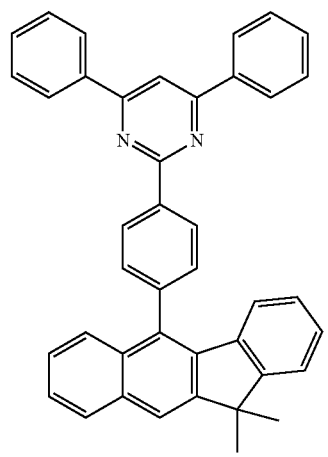
ET39
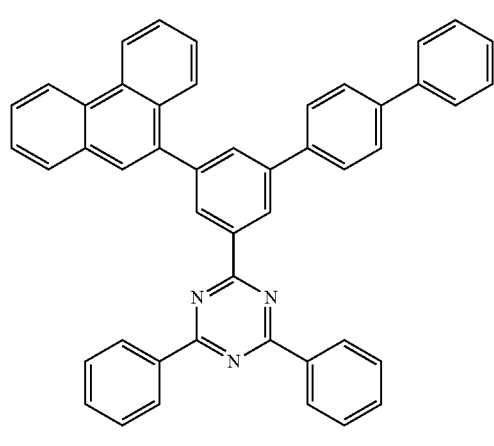
ET42
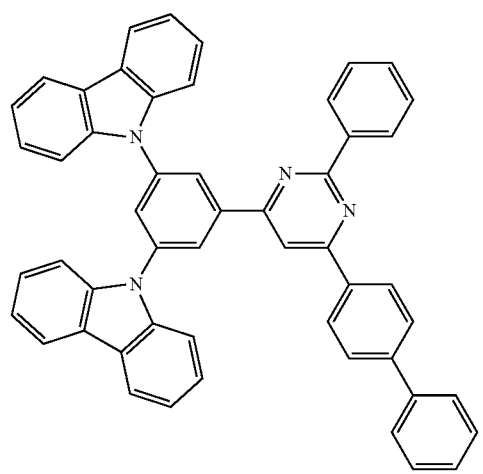
ET40
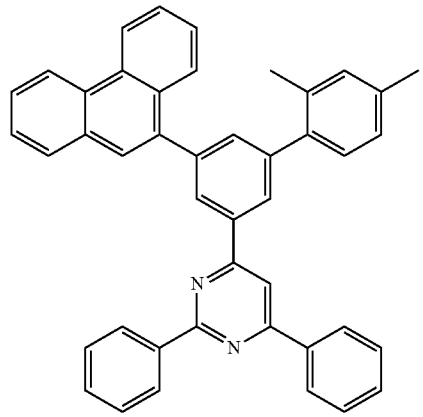
ET43
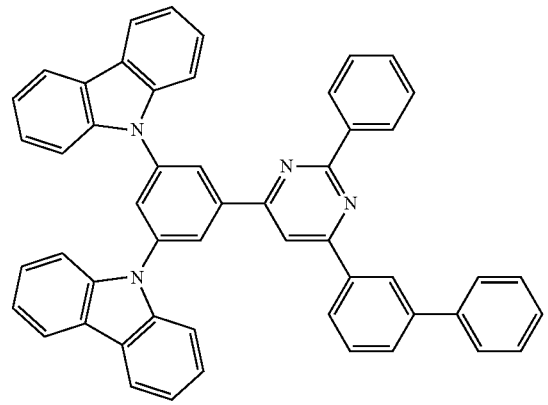

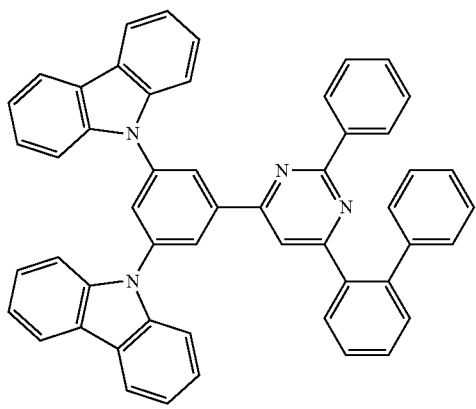

ET44

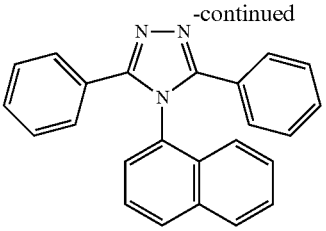

NTAZ

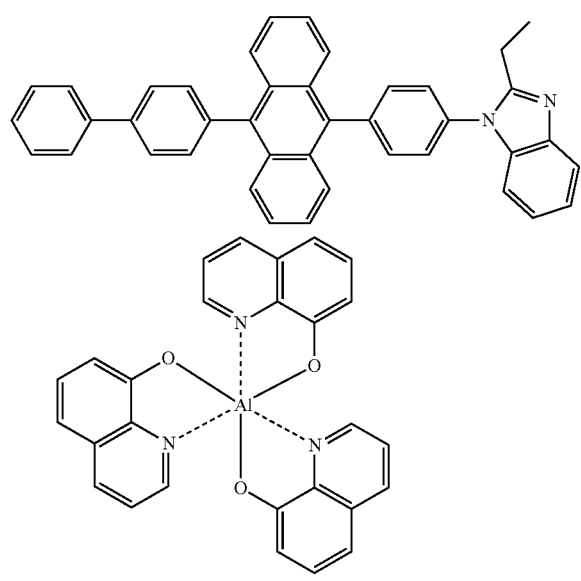

ET45

Alq₃

BAlq

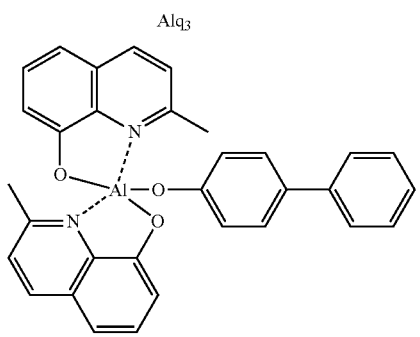

TAZ

A thickness of the electron transport region may be in a range of about 100 Å to about 5,000 Å. For example, the thickness of the electron transport region may be in a range of about 160 Å to about 4,000 Å. When the electron transport region includes a hole blocking layer, an electron transport layer, or any combination thereof, a thickness of the hole blocking layer and a thickness of the electron transport layer may each independently be in a range of about 20 Å to about 1,000 Å. For example, the thickness of the hole blocking layer and the thickness of the electron transport layer may each independently be in a range of about 30 Å to about 300 Å. In an embodiment, a thickness of the electron transport layer may be in a range of about 100 Å to about 1,000 Å. For example, the thickness of the electron transport layer may be in a range of about 150 Å to about 500 Å. When the thickness of the hole blocking layer and/or the thickness of the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

ET-D1

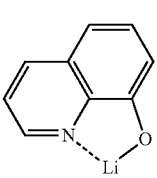

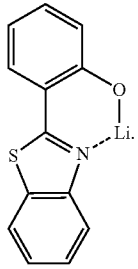

ET-D2

The electron transport region may include an electron injection layer that facilitates injection of electrons from the second electrode 150. The electron injection layer may be in direct contact with the second electrode 150.

The electron injection layer may have i) a single-layered structure consisting of a single layer consisting of a single material, ii) a single-layered structure consisting of a single layer including different materials, or iii) a multi-layered structure having multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal compounds, such as BaO, SrO, CaO, $Ba_xSr_{1-x}O$ (wherein x is a real number that satisfying 0<x<1), or $Ba_xCa_{1-x}O$ (wherein x is a real number that satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In embodiments, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth metal complex, and the rare earth metal complex may include: i) one of ions of the alkali metal, alkaline earth metal, and rare earth metal described above and ii) a ligand bound to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxydiphenyloxadiazole, hydroxydiphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (e.g., a compound represented by Formula 601).

In embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within any of these ranges, excellent electron injection characteristics may be obtained without a substantial increase in driving voltage.

[Second Electrode 150]

The second electrode 150 may be on the interlayer 130. In an embodiment, the second electrode 150 may be a cathode that is an electron injection electrode. In this embodiment, a material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure, or a multi-layered structure including two or more layers.

[Capping Layer]

A first capping layer may be located outside the first electrode 110, and/or a second capping layer may be located outside the second electrode 150. In embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

In the light-emitting device 10, light emitted from the emission layer in the interlayer 130 may pass through the first electrode 110 (which may be a semi-transmissive electrode or a transmissive electrode) and through the first capping layer to the outside. In the light-emitting device 10, light emitted from the emission layer in the interlayer 130 may pass through the second electrode 150 (which may be a semi-transmissive electrode or a transmissive electrode) and through the second capping layer to the outside.

The first capping layer and the second capping layer may improve the external luminescence efficiency based on the principle of constructive interference. Accordingly, the optical extraction efficiency of the light-emitting device 10 may be increased, thus improving luminescence efficiency of the light-emitting device 10.

The first capping layer and the second capping layer may each include a material having a refractive index equal to or greater than about 1.6 (at a wavelength of about 589 nm).

The first capping layer and the second capping layer may each independently be a capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In embodiments, at least one of the first capping layer and the second capping layer may each independently include an amine group-containing compound.

In embodiments, at least one of the first capping layer and the second capping layer may each independently include the compound represented by Formula 201, the compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

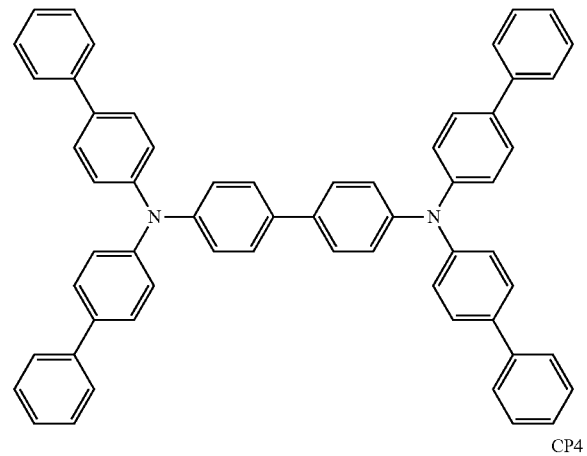
CP3

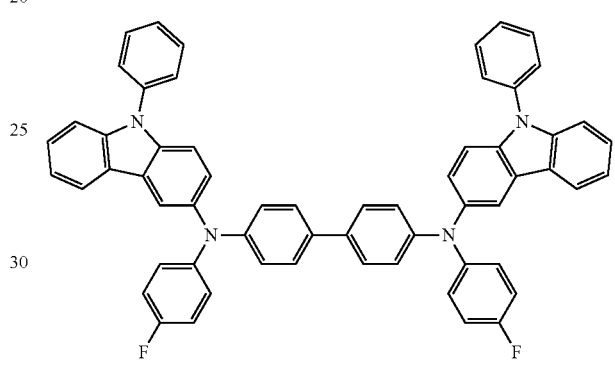
CP4

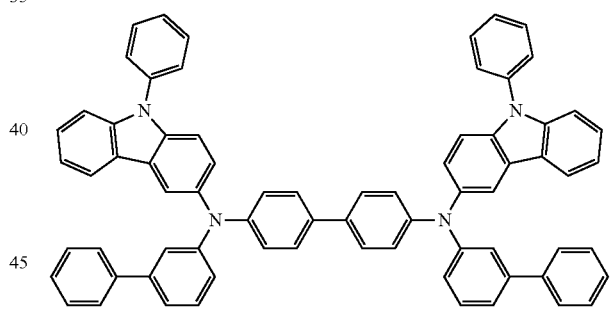
CP5

CP6

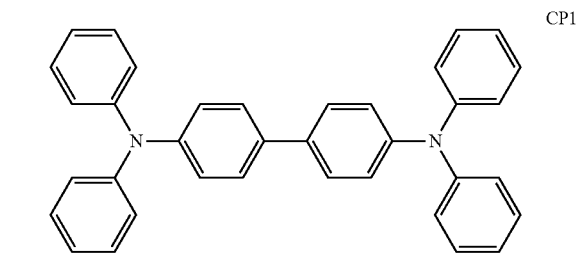
CP1

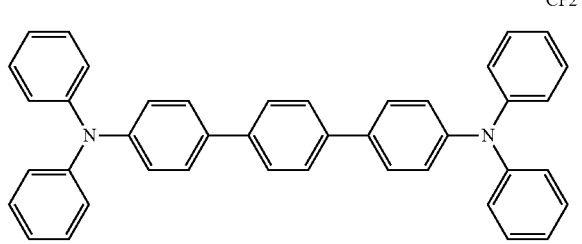
CP2

β-NPB

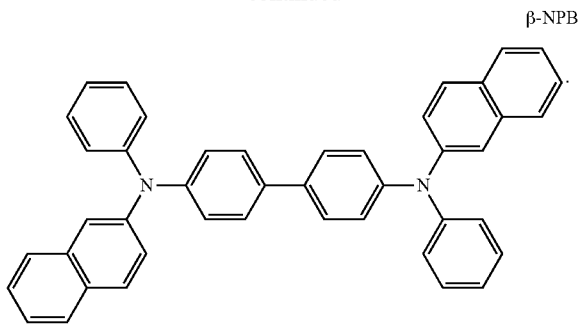

[Electronic Apparatus]

The light-emitting device may be included in various electronic apparatuses. In embodiments, an electronic apparatus including the light-emitting device may be an emission apparatus or an authentication apparatus.

The electronic apparatus (e.g., an emission apparatus) may further include, in addition to the light-emitting device, i) a color filter, ii) a color-conversion layer, or iii) a color filter and a color-conversion layer. The color filter and/or the color-conversion layer may be disposed on at least one traveling direction of light emitted from the light-emitting device. For example, light emitted from the light-emitting device may be blue light. The light-emitting device may be understood by referring to the descriptions provided herein. In embodiments, the color-conversion layer may include quantum dots. The quantum dot may be, for example, the quantum dot described herein.

The electronic apparatus may include a first substrate. The first substrate may include sub-pixels, the color filter may include color filter areas respectively corresponding to the sub-pixels, and the color-conversion layer may include color-conversion areas respectively corresponding to the sub-pixels.

A pixel defining film may be located between the sub-pixels to define each sub-pixel.

The color filter may further include color filter areas and light-blocking patterns between the color filter areas, and the color-conversion layer may further include color-conversion areas and light-blocking patterns between the color-conversion areas.

The color filter areas (or color-conversion areas) may include: a first area emitting first color light; a second area emitting second color light; and/or a third area emitting third color light, and the first color light, the second color light, and/or the third color light may have different maximum emission wavelengths. In embodiments, the first color light may be red light, the second color light may be green light, and the third color light may be blue light. In embodiments, the color filter areas (or the color-conversion areas) may each include quantum dots. In embodiments, the first area may include red quantum dots, the second area may include green quantum dots, and the third area may not include a quantum dot. The quantum dot may be understood by referring to the description of the quantum dot provided herein. The first area, the second area, and/or the third area may each further include an emitter.

In embodiments, the light-emitting device may emit first light, the first area may absorb the first light to emit 1-1 color light, the second area may absorb the first light to emit 2-1 color light, and the third area may absorb the first light to emit 3-1 color light. In this embodiment, the 1-1 color light, the 2-1 color light, and the 3-1 color light may each have a different maximum emission wavelength. In embodiments, the first light may be blue light, the 1-1 color light may be red light, the 2-1 color light may be green light, and the 3-1 light may be blue light.

The electronic apparatus may further include a thin-film transistor, in addition to the light-emitting device. The thin-film transistor may include a source electrode, a drain electrode, and an active layer, wherein one of the source electrode and the drain electrode may be electrically connected to one of the first electrode and the second electrode of the light-emitting device.

The thin-film transistor may further include a gate electrode, a gate insulating film, or the like.

The active layer may include a crystalline silicon, an amorphous silicon, an organic semiconductor, and an oxide semiconductor.

The electronic apparatus may further include an encapsulation unit for sealing the light-emitting device. The encapsulation unit may be located between the color filter and/or the color-conversion layer and the light-emitting device. The encapsulation unit may allow light to pass to the outside from the light-emitting device and prevent air and moisture to permeate into the light-emitting device at the same time. The encapsulation unit may be a sealing substrate including a transparent glass or a plastic substrate. The encapsulation unit may be a thin-film encapsulating layer including at least one of an organic layer and/or an inorganic layer. When the encapsulation unit is a thin film encapsulating layer, the electronic apparatus may be flexible.

Various functional layers, in addition to the color filter and/or the color-conversion layer, may be disposed on the encapsulation unit, depending on the use of an electronic apparatus. Examples of the functional layer may include a touch screen layer, a polarization layer, an authentication apparatus, or the like. The touch screen layer may be a resistive touch screen layer, a capacitive touch screen layer, or an infrared beam touch screen layer. The authentication apparatus may be, for example, a biometric authentication apparatus that identifies an individual according to biometric information (e.g., a fingertip, a pupil, or the like).

The authentication apparatus may further include a biometric information collecting unit, in addition to the light-emitting device described above.

The electronic apparatus may be applicable to various displays, an optical source, lighting, a personal computer (e.g., a mobile personal computer), a cellphone, a digital camera, an electronic note, an electronic dictionary, an electronic game console, a medical device (e.g., an electronic thermometer, a blood pressure meter, a glucometer, a pulse measuring device, a pulse wave measuring device, an electrocardiograph recorder, an ultrasonic diagnosis device, an endoscope display device), a fish finder, various measurement devices, gauges (e.g., gauges of an automobile, an airplane, a ship), a projector.

Figure 3:
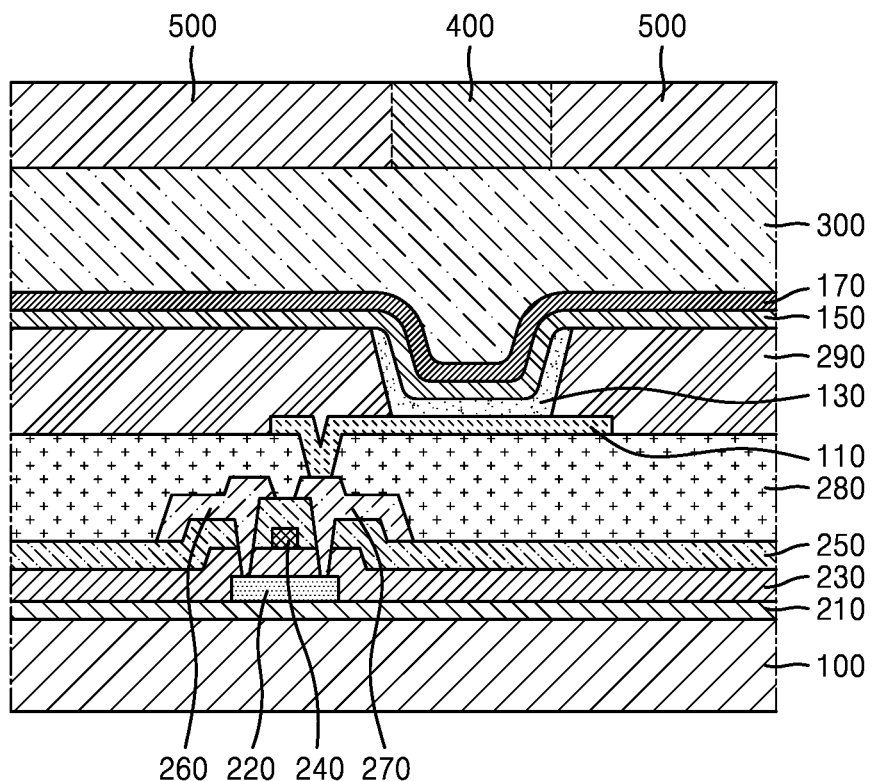
FIG. 3 is a schematic cross-sectional view of another light-emitting apparatus according to an embodiment.

[Descriptions of FIGS. 2 and 3]

FIG. 2 is a schematic cross-sectional view of a light-emitting apparatus according to an embodiment.

An emission apparatus in FIG. 2 may include a substrate 100, a thin-film transistor, a light-emitting device, and an encapsulation unit 300 sealing the light-emitting device.

The substrate 100 may be a flexible substrate, a glass substrate, or a metal substrate. A buffer layer 210 may be on the substrate 100. The buffer layer 210 may prevent penetration of impurities through the substrate 100 and may provide a flat surface on the substrate 100.

A thin-film transistor may be on the buffer layer 210. The thin-film transistor may include an active layer 220, a gate electrode 240, a source electrode 260, and a drain electrode 270.

The active layer 220 may include an inorganic semiconductor such as silicon or polysilicon, an organic semiconductor, or an oxide semiconductor and include a source area, a drain area, and a channel area.

A gate insulating film 230 for insulating the active layer 220 and the gate electrode 240 may be on the active layer 220, and the gate electrode 240 may be on the gate insulating film 230.

An interlayer insulating film 250 may be on the gate electrode 240. The interlayer insulating film 250 may be between the gate electrode 240 and the source electrode 260 and between the gate electrode 240 and the drain electrode 270 to provide insulation therebetween.

The source electrode 260 and the drain electrode 270 may be on the interlayer insulating film 250. The interlayer insulating film 250 and the gate insulating film 230 may be formed to expose the source area and the drain area of the active layer 220, and the source electrode 260 and the drain electrode 270 may be adjacent to the exposed source area and the exposed drain area of the active layer 220.

Such a thin-film transistor may be electrically connected to a light-emitting device to drive the light-emitting device and may be protected by a passivation layer 280. The passivation layer 280 may include an inorganic insulating film, an organic insulating film, or a combination thereof. A light-emitting device may be on the passivation layer 280. The light-emitting device may include a first electrode 110, an interlayer 130, and a second electrode 150.

The first electrode 110 may be on the passivation layer 280. The passivation layer 280 may not fully cover the drain electrode 270 and expose a specific area of the drain electrode 270, and the first electrode 110 may be disposed to connect to the exposed drain electrode 270.

A pixel-defining film 290 may be on the first electrode 110. The pixel-defining film 290 may expose a specific area of the first electrode 110, and the interlayer 130 may be formed in the exposed area. The pixel-defining film 290 may be a polyimide or polyacryl organic film. Although it is not shown in FIG. 2, some higher layers of the interlayer 130 may extend to the upper portion of the pixel-defining film 290 and may be disposed in the form of a common layer.

The second electrode 150 may be on the interlayer 130, and a capping layer 170 may be additionally formed on the second electrode 150. The capping layer 170 may be formed to cover the second electrode 150.

The encapsulation unit 300 may be on the capping layer 170. The encapsulation unit 300 may be on the light-emitting device to protect a light-emitting device from moisture or oxygen. The encapsulation unit 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxy methylene, polyarylate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof; or a combination of the inorganic film and the organic film.

FIG. 3 is a schematic cross-sectional view of another light-emitting apparatus according to an embodiment.

The emission apparatus shown in FIG. 3 may be substantially identical to the emission apparatus shown in FIG. 2, except that a light-shielding pattern 500 and a functional area 400 are additionally located on the encapsulation unit 300. The functional area 400 may be i) a color filter area, ii) a color-conversion area, or iii) a combination of a color filter area and a color-conversion area. In embodiments, the light-emitting device shown in FIG. 3 included in the emission apparatus may be a tandem light-emitting device.

[Manufacturing Method]

The layers constituting the hole transport region, the emission layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When the layers constituting the hole transport region, the emission layer, and the layers constituting the electron transport region are each formed by vacuum deposition, the vacuum deposition may be performed at a deposition temperature in a range of about 100° C. to about 500° C. at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

When the layers constituting the hole transport region, the emission layer, and the layers constituting the electron transport region are each formed by spin coating, the spin coating may be performed at a coating rate of about 2,000 revolutions per minute (rpm) to about 5,000 rpm and at a heat treatment temperature of about 80° C. to about 200° C., depending on the material to be included in each layer and the structure of each layer to be formed.

[Definitions of Substituents]

The term "$C_3$-$C_{60}$ carbocyclic group" as used herein refers to a cyclic group consisting of carbon atoms only and having 3 to 60 carbon atoms. The term "$C_1$-$C_{60}$ heterocyclic group" as used herein refers to a cyclic group having 1 to 60 carbon atoms in addition to a heteroatom other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "π electron-deficient nitrogen-containing $C_1$-$C_{60}$ cyclic group" as used herein refers to a heterocyclic group having 1 to 60 carbon atoms and *—N=*' as a ring-forming moiety.

In embodiments, the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be i) a T4 group, ii) a group in which at least twos T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a tetravalent group, or the like), depending on the structure of the formula to which the term is applied. For example, a "benzene group" may be a benzo group, a phenyl group, a phenylene group, or the like, and this may be understood by one of ordinary skill in the art, depending on the structure of the formula including the "benzene group".

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the monovalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The "$C_1$-$C_{60}$ alkyl group" as used herein refers to a linear or branched aliphatic hydrocarbon monovalent group having 1 to 60 carbon atoms. Examples of the $C_1$-$C_{60}$ alkyl group include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_1$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantanyl group, a norbornanyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having the same structure as the $C_1$-$C_{10}$ heterocycloalkyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group that has two or more rings condensed and only carbon atoms as ring forming atoms (e.g., 8 to 60 carbon atoms), wherein the molecular structure when considered as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and at least one heteroatom other than carbon atoms (e.g., 1 to 60 carbon atoms), as a ring-forming atom, wherein the molecular structure when considered as a whole is non-aromatic. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzooxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group).

The term "$R_{10a}$" as used herein may be:
deuterium (—D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include O, S, N, P, Si, B, Ge, Se, or any combination thereof.

"Ph" used herein represents a phenyl group, "Me" used herein represents a methyl group, "Et" used herein represents an ethyl group, "ter-Bu" or "But" used herein represents a tert-butyl group, and "OMe" used herein represents a methoxy group.

The term "biphenyl group" as used herein refers to a phenyl group substituted with at least one phenyl group. The "biphenyl group" belongs to "a substituted phenyl group" having a "$C_6$-$C_{60}$ aryl group" as a substituent.

The term "terphenyl group" as used herein refers to a phenyl group substituted with at least one phenyl group. The "terphenyl group" belongs to "a substituted phenyl group" having a "$C_6$-$C_{60}$ aryl group substituted with a $C_6$-$C_{60}$ aryl group" as a substituent.

The symbols * and *' as used herein, unless defined otherwise, refer to a binding site to an adjacent atom in a corresponding formula.

Hereinafter, a light-emitting device and a compound according to embodiments will be described in more detail with reference to Examples.

EXAMPLES

[Manufacture of Light-Emitting Device]

Comparative Example 1

A glass substrate of ITO 300 Å/Ag 50 Å/ITO 300 Å (anode was not plasma-treated) was cut to a size of 50 mm×50 mm×0.7 mm, ultrasonically cleaned by using isopropyl alcohol and pure water for 5 minutes each, and irradiated with UV light for 30 minutes. The glass substrate was exposed to ozone to clean and loaded into a vacuum deposition apparatus.

NPB doped with HAT-CN (2%) was vacuum-deposited on the glass substrate as a hole injection layer to a thickness in a range of 30 Å to 150 Å.

Subsequently, NPB was vacuum-deposited to a thickness of 1,200 Å to form a hole transport layer.

TCTA was vacuum-deposited on the hole transport layer to a thickness of 50 Å to form an electron blocking layer.

Compound 100 as a host and Compound 200 (fluorescent dopant) as a dopant were co-deposited on the electron blocking layer at a weight ratio of 100:1 to 3 to thereby form an emission layer having a thickness of 200 Å.

T2T was vacuum-deposited on the emission layer to a thickness of 50 Å to form a hole blocking layer.

TPM-TAZ and Liq were deposited on the hole blocking layer at a weight ratio of 5:5 to a thickness of 300 Å to form an electron transport layer.

Yb was vacuum-deposited on the electron transport layer to a thickness of 15 Å. AgMg (10% of Mg) was vacuum-deposited to a thickness of 100 Å to form a cathode. Subsequently, CPL was deposited thereon to a thickness of 700 Å to form a capping layer, thereby manufacturing a light-emitting device.

Comparative Example 2

A light-emitting device was manufactured in substantially the same manner as in Comparative Example 1, except that a hole injection layer was not formed on the substrate, and a hole transport layer was formed on the substrate.

Comparative Example 3

A light-emitting device was manufactured in substantially the same manner as in Comparative Example 1, except that NPB not doped with HAT-CN was deposited as a hole injection layer on the glass substrate, and SmF$_3$ was deposited on the hole injection layer to form a layer with a thickness of 60 Å and to form a hole transport layer.

Comparative Example 4

A light-emitting device was manufactured in substantially the same manner as in Comparative Example 3, except that the structure of the anode was ITO 300 Å/Ag 50 Å/ITO+ MoO$_2$ 300 Å (doped with MoO$_2$ at 30 wt %).

Example 1

A light-emitting device was manufactured in substantially the same manner as in Comparative Example 1, except that the structure of the anode was ITO 300 Å/Ag 50 Å/ITO+ W—O$_x$ 300 Å (x=3/doped with 30 wt %), and NPB doped with SmF$_3$ (3%) was deposited on the glass substrate to a thickness of 50 Å to form a hole injection layer.

Example 2

A light-emitting device was manufactured in substantially the same manner as in Example 1, except that the structure of the anode was ITO 300 Å/Ag 50 Å/ITO+W—Cu—O$_x$ 300 Å (at a ratio of W:Cu=2:1 to 3:1/doped at 30 wt %).

Example 3

A light-emitting device was manufactured in substantially the same manner as in Example 1, except that the structure of the anode was ITO 300 Å/Ag 50 Å/ITO+W—La—O$_x$ 300 Å (at a ratio of W:La=1:2/doped at 30 wt %).

Example 4

A light-emitting device was manufactured in substantially the same manner as in Example 1, except that the structure of the anode was ITO 300 Å/Ag 50 Å/ITO+ITO+W—Ni—O$_x$ 300 Å (at a ratio of W:Ni=1:1/doped at 30 wt %).

Example 5

A light-emitting device was manufactured in substantially the same manner as in Comparative Example 1, except that the structure of the anode was ITO 300 Å/Ag 50 Å/ITO+W—O$_x$ 300 Å (x=3/doped with 30 wt %), SmF$_3$ was deposited on the glass substrate to form a layer with a thickness of 50 Å, NPB doped with SmF$_3$ (3%) was deposited thereon to a thickness of 50 Å to form a hole injection layer, and a hole transport layer was formed.

Example 6

A light-emitting device was manufactured in substantially the same manner as in Comparative Example 1, except that the structure of the anode was ITO 300 Å/Ag 50 Å/ITO+W—Cu—O$_x$ 300 Å (W:Cu=2:1 to 3:1/doped at 30 wt %), NPB doped with SmF$_3$ (3%) was deposited thereon to a thickness of 50 Å to form a hole injection layer, SmF$_3$ was deposited thereon to form a layer with a thickness of 50 Å, and a hole transport layer was formed thereon.

Example 7

A light-emitting device was manufactured in substantially the same manner as in Comparative Example 1, except that the structure of the anode was ITO 300 Å/Ag 50 Å/W—La—O$_x$ 300 Å (W:La=1:2/doped at 30 wt %), SmF$_3$ was deposited on the glass substrate to form a layer with a thickness of 60 Å, NPB doped with SmF$_3$ (3%) was deposited thereon to a thickness of 50 Å to form a hole injection layer, SmF$_3$ was deposited thereon to form a layer with a thickness of 50 Å, and a hole transport layer was formed.

Example 8

A light-emitting device was manufactured in substantially the same manner as in Example 1, except that the structure of the anode was ITO 300 Å/Ag 50 Å/ITO+ITO+W—Ni—O$_x$ 300 Å (at a ratio of W:Ni=1:1/doped at 30 wt %).

When two metals in a metal oxide were doped on an anode (e.g., W and Cu), the molar ratio between the two metals may be in a range of about 50:1 to about 1:50. As physical properties including work function and permeability may change according to the ratio, a ratio suitable for the device structure was used. When two metals are doped in the metal oxide in the Examples, x may be a suitable number of oxygen atoms appropriate for the metal ratio of the two metals.

To evaluate characteristics of the light-emitting devices manufactured in Comparative Examples 1 to 4 and Examples 1 to 8, the driving voltage, efficiency, and lifespan of the light-emitting devices were measured at a current density of 10 mA/cm$^2$.

The driving voltage and the current density of the light-emitting devices were measured using a source meter (Keithley Instrument, 2400 series). The efficiencies of the light-emitting devices were measured using Hammamastu Absolute PL Measurement System C9920-2-12.

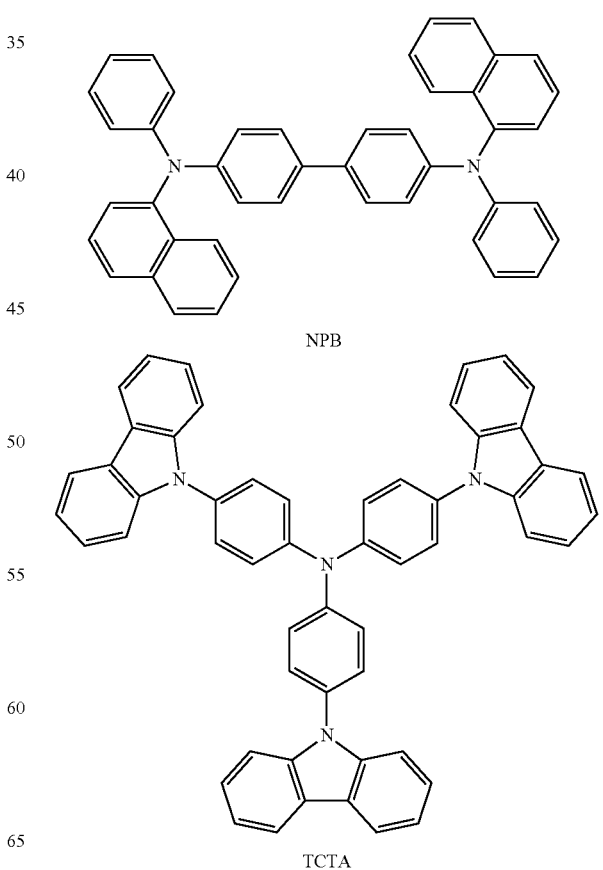

NPB

TCTA

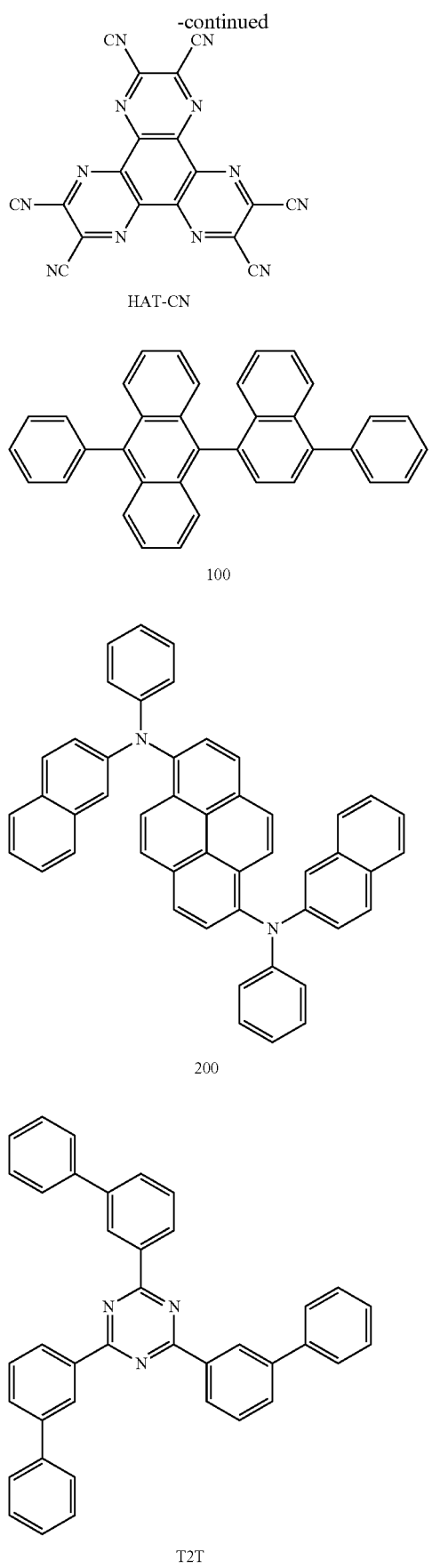
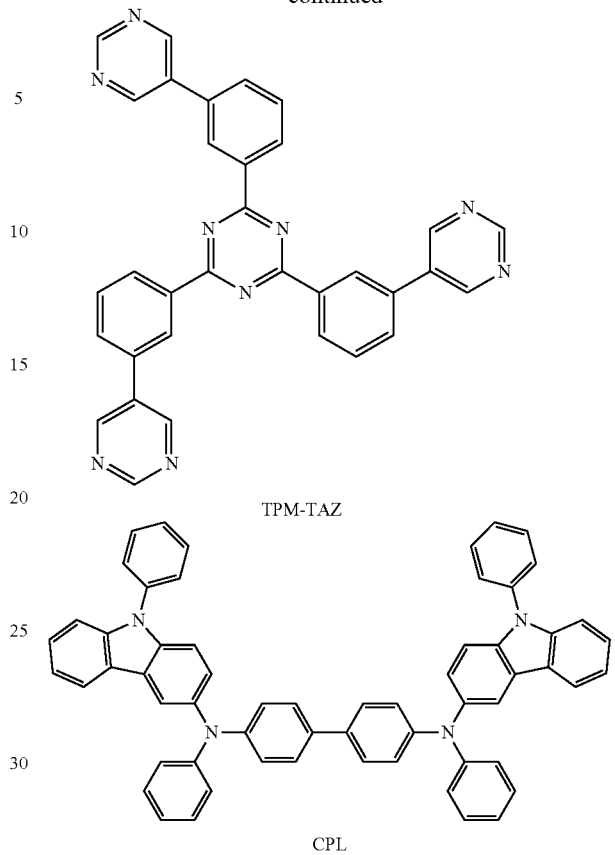

TABLE 1

| | Electrode structure (thickness omitted) | Work function (eV) | including SmF$_3$ | Driving voltage (V) (@10 mA) | Efficiency (Cd/A/y) | Lifespan (T97) |
|---|---|---|---|---|---|---|
| Comparative Example 1 | ITO/Ag/ITO | −4.80 | X | 4.5 | 100% | 100% |
| Comparative Example 2 | ITO/Ag/ITO | −4.80 | X | 5.5 | 101% | 54% |
| Comparative Example 3 | ITO/Ag/ITO | −4.80 | ○ | 5.3 | 105% | 79% |
| Comparative Example 4 | ITO/Ag/ITO + MoO$_2$ | −5.05 | ○ | 4.4 | 102% | 101% |
| Example 1 | ITO/Ag/ITO + W—O$_x$ | −5.32 | ○ | 4.0 | 112% | 114% |
| Example 2 | ITO/Ag/ITO + W—Cu—O$_x$ | −5.12 | ○ | 4.3 | 115% | 105% |
| Example 3 | ITO/Ag/ITO + W—La—O$_x$ | −5.18 | ○ | 4.2 | 110% | 112% |
| Example 4 | ITO/Ag/ITO + W—Ni—O$_x$ | −5.09 | ○ | 4.4 | 105% | 97% |
| Example 5 | ITO/Ag/ITO + W—O$_x$ | −5.32 | ○ | 3.7 | 129% | 123% |
| Example 6 | ITO/Ag/ITO + W—Cu—O$_x$ | −5.12 | ○ | 4.0 | 119% | 112% |
| Example 7 | ITO/Ag/ITO + W—La—O$_x$ | −5.18 | ○ | 4.0 | 115% | 120% |
| Example 8 | ITO/Ag/ITO + W—Ni—O$_x$ | −5.09 | ○ | 4.1 | 115% | 117% |

As shown in Table 1, the light-emitting devices of Examples 1 to 8 were found to exhibit a low driving voltage, excellent efficiency, and long lifespan, as compared with the light-emitting devices of Comparative Examples 1 to 4. By doping the anode with a material having a low work function and locating a layer consisting of SmF$_3$ between an anode and an emission layer, a hole injection barrier may be lowered due to a tunneling effect. Or, by doping NPB with SmF$_3$, the number of carrier holes of a hole injection layer may be increased to facilitate charge migration, thus increasing hole injection.

As apparent from the description, a light-emitting device according to embodiments may have a low driving voltage, excellent efficiency, and long lifespan, as compared with devices in the related art.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light-emitting device comprising:
a first electrode;
a second electrode facing the first electrode; and
an interlayer between the first electrode and the second electrode, the interlayer comprising an emission layer,
wherein the first electrode is doped with a metal oxide having a work function of less than about −5.05 electron volts (eV), and
a layer comprising a halide of a lanthanide is between the first electrode and the emission layer.

2. The light-emitting device of claim 1, wherein
the first electrode is an anode,
the second electrode is a cathode,
the interlayer comprises a hole transport region comprising a hole injection layer, a hole transport layer, an electron blocking layer, or a combination thereof, and
the hole transport region is disposed between the first electrode and the emission layer.

3. The light-emitting device of claim 1, wherein
the first electrode is an anode,
the second electrode is a cathode,
the interlayer comprises an electron transport region comprising a hole blocking layer, an electron transport layer, an electron injection layer, or a combination thereof, and
the electron transport region is disposed between the second electrode and the emission layer.

4. The light-emitting device of claim 1, wherein a metal of the metal oxide is tungsten (W), copper (Cu), lanthanum (La), titanium (Ti), nickel (Ni), chromium (Cr), tantalum (Ta), cobalt (Co), indium (In), germanium (Ge), tin (Sn), or a combination thereof.

5. The light-emitting device of claim 1, wherein the lanthanide is lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or a combination thereof.

6. The light-emitting device of claim 1, wherein a halogen in the halide of the lanthanide is fluorine (F), chlorine (Cl), bromine (Br), iodine (I), astatine (At), tennessine (Ts), or a combination thereof.

7. The light-emitting device of claim 1, wherein the first electrode comprises:
an oxide of indium tin, an oxide of indium zinc, an oxide of tin, an oxide of zinc, or a combination thereof; and/or
magnesium (Mg), silver (Ag), aluminum (Al), aluminum-lithium (Al—Li), calcium (Ca), magnesium-indium (Mg—In), magnesium-silver (Mg—Ag), or a combination thereof.

8. The light-emitting device of claim 1, wherein the first electrode comprises:
a layer comprising an oxide of indium tin, an oxide of indium zinc, an oxide of tin, an oxide of zinc, or a combination thereof;
a layer comprising magnesium (Mg), silver (Ag), aluminum (Al), aluminum-lithium (Al—Li), calcium (Ca), magnesium-indium (Mg—In), magnesium-silver (Mg—Ag), or a combination thereof; and
a layer comprising an oxide of indium tin, an oxide of indium zinc, an oxide of tin, an oxide of zinc, or a combination thereof, doped with the metal oxide.

9. The light-emitting device of claim 1, wherein between the first electrode and the emission layer, the interlayer comprises a layer in which a hole transporting compound is doped with the halide of the lanthanide.

10. The light-emitting device of claim 1, wherein between the first electrode and the emission layer, the interlayer comprises a layer consisting of the halide of the lanthanide.

11. The light-emitting device of claim 1, wherein between the first electrode and the emission layer, the interlayer comprises:
a layer in which a hole transporting compound is doped with the halide of the lanthanide; and
a layer consisting of the halide of the lanthanide.

12. The light-emitting device of claim 1, wherein
between the first electrode and the emission layer, the interlayer comprises:
a hole transport layer;
a layer in which a hole transporting compound is doped with the halide of the lanthanide; and
a layer consisting of the halide of the lanthanide, and
the hole transport layer contacts the layer in which a hole transporting compound is doped with the halide of the lanthanide.

13. The light-emitting device of claim 1, wherein
between the first electrode and the emission layer, the interlayer comprises:
a hole transport layer;
a layer in which a hole transporting compound is doped with the halide of the lanthanide; and
a layer consisting of the halide of the lanthanide, and
the hole transport layer contacts the layer consisting of the halide of the lanthanide.

14. An electronic apparatus comprising the light-emitting device of claim 1.

15. The light-emitting device of claim 8, wherein a doping concentration of the metal oxide in the layer doped with the metal oxide is in a range of about 0 percent (%) to about 80%.

16. The light-emitting device of claim 10, wherein the layer consisting of the halide of the lanthanide exhibits a tunneling effect.

17. The light-emitting device claim 10, wherein a thickness of the layer consisting of the halide of the lanthanide is in a range of about 3 Angstroms (Å) to about 70 Å.

18. The light-emitting device claim 10, wherein a thickness of the layer consisting of the halide of the lanthanide is in a range of about 5 Angstroms (Å) to about 25 Å.

19. The light-emitting device of claim 11, wherein a doping concentration of the halide of the lanthanide in the layer in which a hole transporting compound is doped with the halide of the lanthanide is in a range of about 0% to about 50%.

20. The light-emitting device of claim 12, wherein
a combination of the hole transport layer, the layer in which a hole transporting compound is doped with the halide of the lanthanide, and the layer consisting of the halide of the lanthanide corresponds to a hole transport region, and
the layer in which a hole transporting compound is doped with the halide of the lanthanide corresponds to a hole injection layer.

21. The electronic apparatus of claim 14, further comprising a thin-film transistor, wherein
the thin-film transistor comprises a source electrode and a drain electrode, and
the first electrode of the light-emitting device is electrically connected to at least one of the source electrode and the drain electrode of the thin-film transistor.

22. The electronic apparatus of claim 14, further comprising a color filter, a color-conversion layer, a touchscreen layer, a polarization layer, or a combination thereof.

23. The light-emitting device of claim 20, wherein
a thickness of the layer consisting of the halide of the lanthanide is in a range of about 3 Angstroms (Å) to about 70 Å, and
a thickness of the hole transport region is in a range of about 50 Angstroms (Å) to about 10,000 Å.

\* \* \* \* \*